US012813354B2

(12) United States Patent
Du

(10) Patent No.: US 12,813,354 B2
(45) Date of Patent: Nov. 24, 2026

(54) FAN-OUT PACKAGING METHOD AND PACKAGING STRUCTURE OF STACKED CHIPS THEREOF

(71) Applicant: TONGFU MICROELECTRONICS CO., LTD., Nantong (CN)

(72) Inventor: Maohua Du, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 366 days.

(21) Appl. No.: 18/731,910

(22) Filed: Jun. 3, 2024

(65) Prior Publication Data

US 2024/0321854 A1 Sep. 26, 2024

Related U.S. Application Data

(63) Continuation of application No. PCT/CN2022/137246, filed on Dec. 7, 2022.

(30) Foreign Application Priority Data

Dec. 8, 2021 (CN) ......................... 202111493788.0
Dec. 8, 2021 (CN) ......................... 202111493789.5
(Continued)

(51) Int. Cl.
*H10W 90/00* (2026.01)
*H10W 20/20* (2026.01)
(Continued)

(52) U.S. Cl.
CPC ........... *H10W 90/00* (2026.01); *H10W 20/20* (2026.01); *H10W 74/019* (2026.01);
(Continued)

(58) Field of Classification Search
None
See application file for complete search history.

(56) References Cited

U.S. PATENT DOCUMENTS

2019/0229061 A1 7/2019 Huang
2020/0219815 A1* 7/2020 Elsherbini ............. H10W 40/22
2021/0257275 A1 8/2021 Park et al.

FOREIGN PATENT DOCUMENTS

CN 110299294 A 10/2019
CN 112701088 A 4/2021
(Continued)

OTHER PUBLICATIONS

The World Intellectual Property Organization (WIPO) International Search Report for PCT/CN2022/137246 Feb. 9, 2023 4 Pages.

*Primary Examiner* — Kyoung Lee
(74) *Attorney, Agent, or Firm* — Anova Law Group, PLLC

(57) ABSTRACT

A fan-out packaging method and packaging structure are provided. The method includes: fixing a first chip in a groove of a dummy chip; bonding a plurality of second chips with the dummy chip and the first chip respectively; forming a first plastic encapsulation layer to wrap the plurality of second chips; forming a second plastic encapsulation layer to wrap the first chip, the dummy chip, and the first plastic encapsulation layer; and forming a redistribution wiring layer on surfaces of the dummy chip and the first chip away from the plurality of second chip.

20 Claims, 42 Drawing Sheets

(30) Foreign Application Priority Data

| | | | |
|---|---|---|---|
| Dec. 8, 2021 | (CN) | ......................... | 202111493792.7 |
| Dec. 8, 2021 | (CN) | ......................... | 202111493899.1 |
| Dec. 8, 2021 | (CN) | ......................... | 202111495868.X |
| Dec. 8, 2021 | (CN) | ......................... | 202111495955.5 |

(51) Int. Cl.

| | |
|---|---|
| ***H10W 74/01*** | (2026.01) |
| ***H10W 74/10*** | (2026.01) |
| ***H10W 74/47*** | (2026.01) |
| *H10W 72/00* | (2026.01) |
| *H10W 80/00* | (2026.01) |
| *H10W 90/20* | (2026.01) |

(52) U.S. Cl.

CPC ......... *H10W 74/121* (2026.01); *H10W 74/47* (2026.01); *H10W 72/823* (2026.01); *H10W 74/10* (2026.01); *H10W 80/312* (2026.01); *H10W 80/327* (2026.01); *H10W 80/334* (2026.01); *H10W 90/291* (2026.01); *H10W 90/297* (2026.01); *H10W 90/732* (2026.01); *H10W 90/792* (2026.01)

(56) References Cited

FOREIGN PATENT DOCUMENTS

| | | | |
|---|---|---|---|
| CN | 215069984 | U | 12/2021 |
| CN | 114171400 | A | 3/2022 |
| CN | 114171401 | A | 3/2022 |
| CN | 114171404 | A | 3/2022 |
| CN | 114171410 | A | 3/2022 |
| CN | 114171411 | A | 3/2022 |
| CN | 114188316 | A | 3/2022 |
| WO | 2021092779 | A1 | 5/2021 |

* cited by examiner

S100

200

600

FAN-OUT PACKAGING METHOD AND PACKAGING STRUCTURE OF STACKED CHIPS THEREOF

CROSS-REFERENCE TO RELATED APPLICATION

This application is a continuation of International Application No. PCT/CN2022/137246, filed on Dec. 7, 2022, which claims the priority of Chinese Patent Application No. 202111495955.5, filed on Dec. 8, 2021, Chinese Patent Application No. 202111493899.1, filed on Dec. 8, 2021, Chinese Patent Application No. 202111493792.7, filed on Dec. 8, 2021, Chinese Patent Application No. 202111493789.5, filed on Dec. 8, 2021, Chinese Patent Application No. 202111493788.0, filed on Dec. 8, 2021, and Chinese Patent Application No. 202111495868.X, the contents of which are incorporated herein by reference in their entirety.

TECHNICAL FIELD

The present disclosure generally relates to the field of semiconductor packaging technology and, more particularly, relates to a fan-out packaging method and a packaging structure of stacked chips.

BACKGROUND

A size of an electronic product is getting smaller and smaller, and their functions are getting stronger. Subsequently, semiconductor packages are required to be thinner and thinner, and interconnection density becomes higher. Traditional packaging cannot meet future demands. FIG. 1 shows a typical existing multilayer chip packaging structure. A chip 1 and a chip 2 are vertically stacked on a substrate 6 through patch films 3 and 4, and the chips 1 and 2 are connected to the substrate 6 through gold wires 5. The chips 1 and 2, and the gold wire 5 are protected by plastic encapsulant 7. The entire package is connected to the outside world through solder balls 8. In existing packaging structures, because of limitation of a height of molding of a gold wire and limitation of a protection distance from the plastic encapsulant to the gold wire, a height from the plastic encapsulant to a surface of the chip 2 is strictly limited and cannot be continuously reduced. At the same time, production of an ultra-thin substrate is extremely difficult because of limitations of substrate materials and substrate strength, which limit the application of existing packaging in ultra-thin multi-layer packaging. Moreover, for a traditional wire bonding connection or a reverse soldering connection, a pad spacing is above 30 μm, and it is extremely difficult to continue shrinking.

Therefore, it is necessary to provide a fan-out packaging method and packaging structure of stacked chips that could effectively solve the above problems.

SUMMARY

One aspect of the present disclosure provides a fan-out packaging method. The method includes: fixing a first chip in a groove of a dummy chip; bonding a plurality of second chips with the dummy chip and the first chip respectively; forming a first plastic encapsulation layer to wrap the plurality of second chips; forming a second plastic encapsulation layer to wrap the first chip, the dummy chip, and the first plastic encapsulation layer; and forming a redistribution wiring layer on surfaces of the dummy chip and the first chip away from the plurality of second chip.

Another aspect of the present disclosure provides a fan-out packaging structure. The structure includes a dummy chip, a first chip, a plurality of second chips, a bonding structure, a first plastic encapsulation layer, a second plastic encapsulation layer, and a redistribution wiring layer. The dummy chip includes a groove and the first chip is disposed in the groove. The first chip and the dummy chip are both provided with a plurality of conductive through holes. The plurality of second chips is stacked on the first chip and the dummy chip, and is bonded and connected to the dummy chip and the first chip respectively through the bonding structure. The first plastic encapsulation layer wraps the plurality of second chips. The second plastic encapsulation layer wraps the first chip, the dummy chip, and the first plastic encapsulation layer; and the redistribution wiring layer is disposed on surfaces of the dummy chip and the first chip away from the plurality of second chips, wherein the redistribution wiring layer is electrically connected to the first chip through the plurality of conductive through holes.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

It should be noted that "surface" or "upper" in this specification are used to describe the relative positional relationship in space, and are not limited to whether they are in direct contact.

The present disclosure provides a fan-out stacked chip packaging method.

Figure 1:
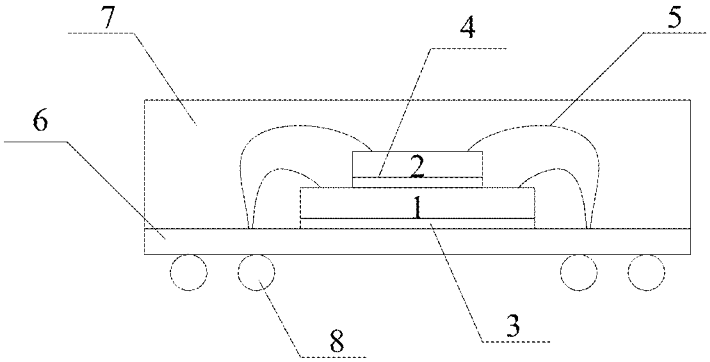
FIG. 1 illustrates a multilayer chip packaging method.
Figure 2:
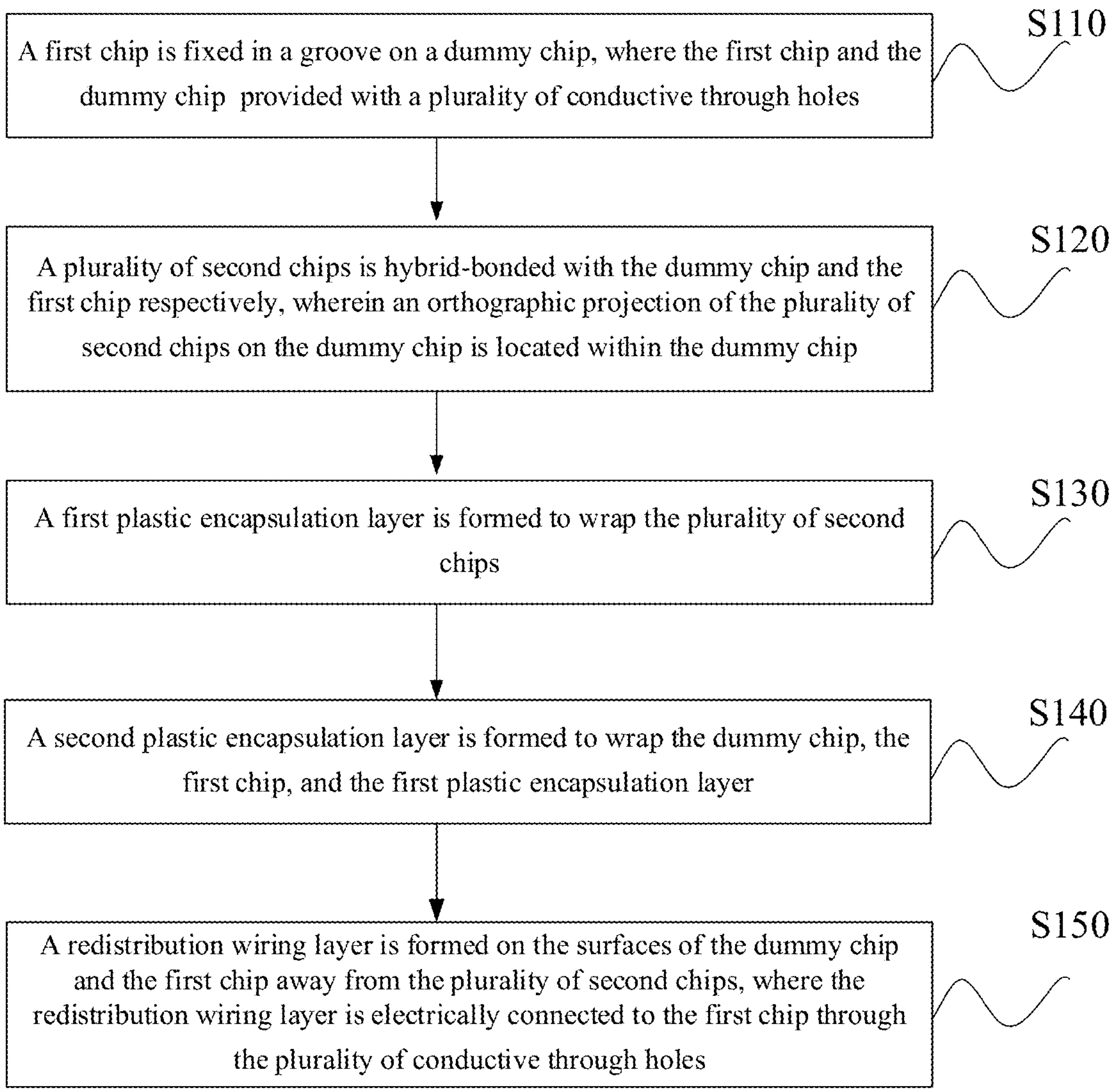
FIG. 2 illustrates an exemplary fan-out stacked chip packaging method according to various disclosed embodiments of the present disclosure.

As shown in FIG. 2, one embodiment of the present disclosure provides a fan-out stacked chip packaging method S100. The packaging method of S100 may include S110 to S140.

In S110, a first chip may be fixed in a groove on a dummy chip. The first chip and the dummy chip may be provided with a plurality of conductive through holes.

Figure 3:
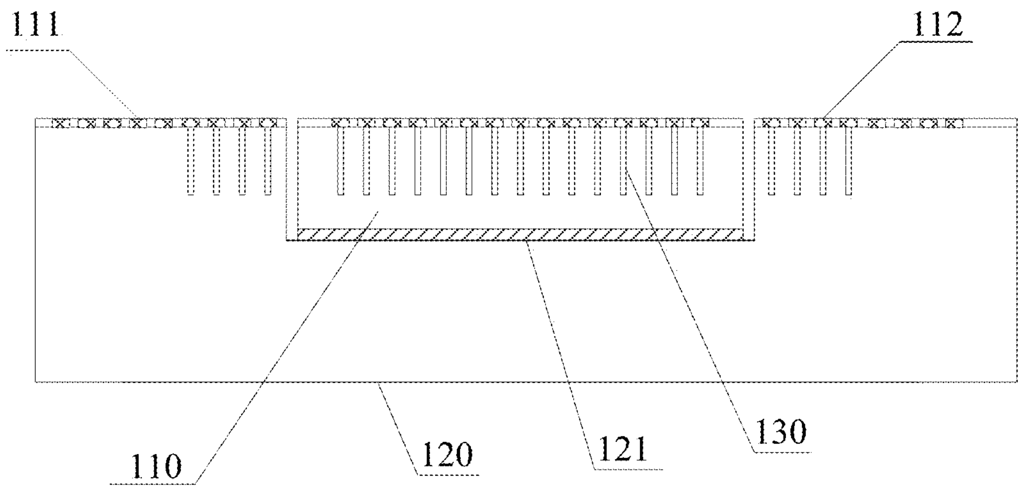
FIG. 3 to FIG. 12 illustrate structures corresponding to certain stages of a fan-out stacked chip packaging method according to various disclosed embodiments of the present disclosure.

Specifically, as shown in FIG. 3, a back side of the first chip 110 may be fixed in the groove on the dummy chip 120 by patch adhesive 121, and a surface of the first chip 110 may be flush with a surface of the dummy chip 120. Making the surface of the first chip 110 flush with the surface of the dummy chip 120 may make them better hybrid-bonded with a plurality of second chips 140. The dummy chip 120 may be used to extend a chip function area of the first chip 110. The plurality of conductive through holes 130 may be disposed on a front surface of the first chip 110 and a front surface of the dummy chip 120, and the plurality of conductive through holes 130 may be distributed at equal intervals. The plurality of conductive through holes 130 may be through-silicon vias. The through-silicon vias may be used to realize vertical electrical interconnection of through-silicon vias. The package height may be reduced.

In S120, a plurality of second chips may be hybrid-bonded with the dummy chip and the first chip respectively. An orthographic projection of the plurality of second chips on the dummy chip may be located within the dummy chip.

Figure 4:
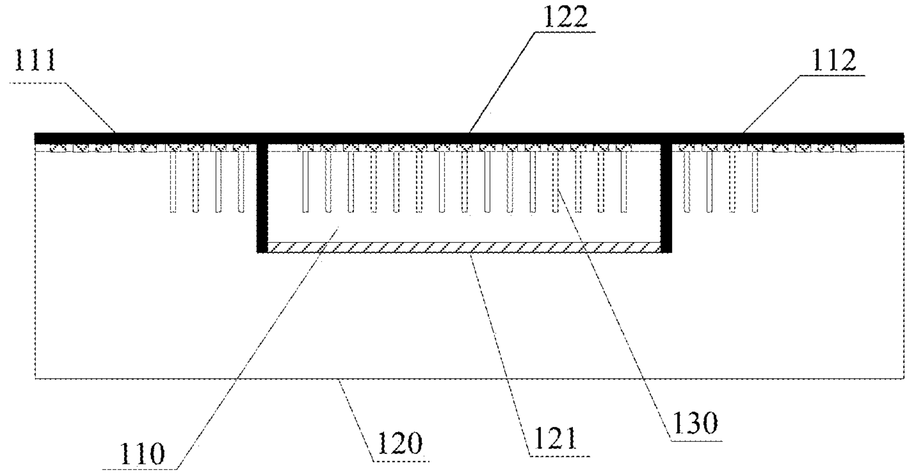
Figure 5:
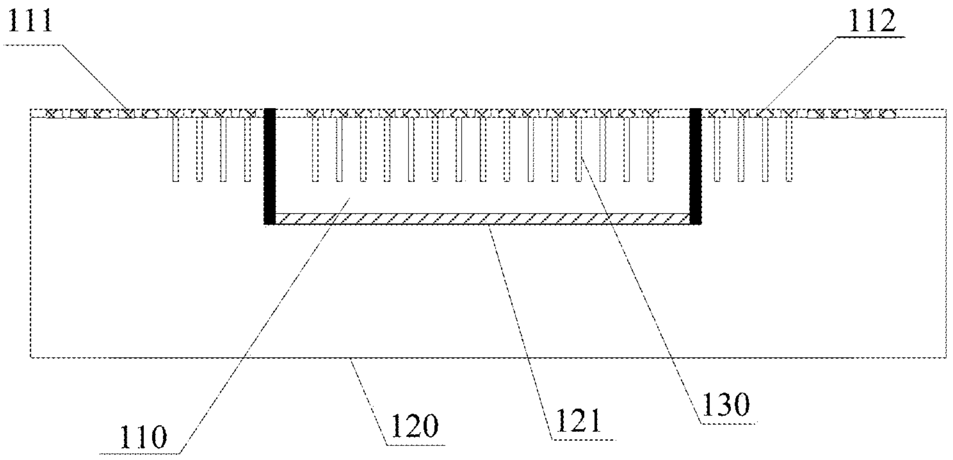
Figure 6:
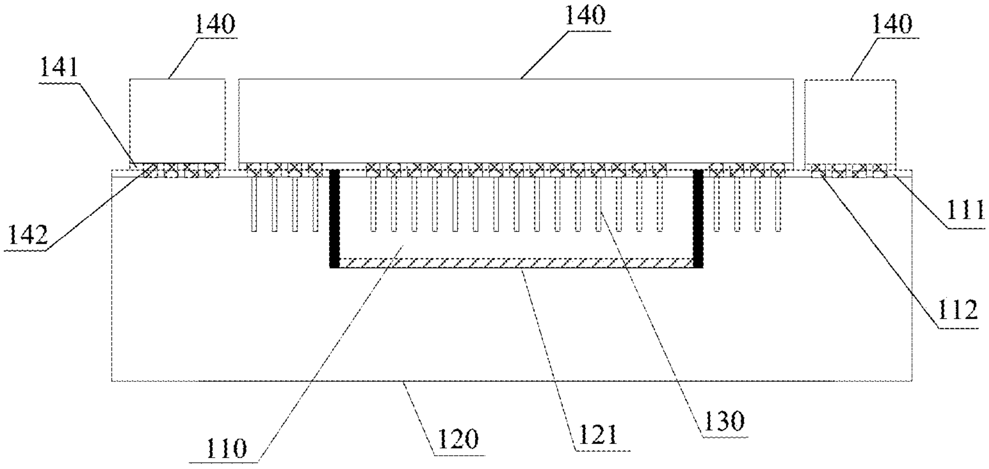

Specifically, as shown in FIG. 3, FIG. 4, and FIG. 5, a surface of the first chip 110 and a surface of the dummy chip 120 facing the plurality of second chips 140 may be provided with a first passivation layer 111 and first metal pads 112. Each first metal pad 112 on the first chip 110 may correspond to one of the plurality of conductive through holes 130 of the first chip 110, and each first metal pad 112 on the dummy chip 120 may correspond to one of the plurality of conductive through holes 130 of the dummy chip 120. As shown in FIG. 6, surfaces of the plurality of second chips 140 facing the first chip 110 may be provided with a second passivation layer 141 and second metal pads 142.

A number of the plurality of second chips 140 may be two, three, four, or more. Types of the plurality of second chips 140 may be same or different. The present disclosure has no limit on the number and types of the plurality of second chips 140, which may be selected according to actual needs.

In one embodiment, the plurality of conductive through holes 130 may be disposed at positions of the dummy chip 120 corresponding to some of the plurality of second chips 140 in a center area, and may be not disposed at positions of the dummy chip 120 corresponding to the plurality of second chips 140 in the dummy chip 120 in an edge area. The plurality of second chips 140 located in the edge region may be electrically connected to the plurality of second chips 140 located in the central region through the first metal pads 112 on the surface of the dummy chip 120, and then signals of the plurality of second chips 140 and the first chip 110 may be led out through the plurality of conductive through holes 130 on the dummy chip 120 and the first chip 110. In some other embodiments, the plurality of conductive through holes 130 may be disposed at positions of the dummy chip 120 corresponding to all of the plurality of second chips 140, and the plurality of second chips 140 may be electrically connected through the first metal pads 112 on the surface of the dummy chip 120, and then signals of the plurality of second chips 140 and the first chip 110 may be led out through the plurality of conductive through holes 130 on the dummy chip 120 and the first chip 110. That is, the plurality of conductive through holes 130 may be disposed at positions of the dummy chip 120 corresponding to at least some of the plurality of second chips 140.

In one embodiment, as shown in FIG. 6, the plurality of second chips 140 may include three laterally connected second chips 140, that is, a second chip 140 located in the central region and the two second chips 140 respectively located in the edge region. The plurality of second chips may be laterally connected to further reduce the package height. A size of the second chip 140 located in the central area may be larger than the sizes of the first chip 110 and the two second chips 140 in the edge area. The plurality of conductive through holes 130 may be disposed in an area of the dummy chip 120 corresponding to the second chip 140 in the central area, and may be not disposed in an area of the dummy chip 120 corresponding to the two second chips 140 in the edge area.

In one embodiment, before hybrid-bonding the plurality of second chips with the first chip and the dummy chip, the method may further include: forming an adhesive on the surfaces of the dummy chip and the first chip, where a portion of the adhesive may be filled into a gap between the dummy chip and the first chip; and then removing the adhesive on the surfaces of the dummy chip and the first chip to expose the first passivation layer and the first metal pads of the dummy chip and the first chip.

Specifically, as shown in FIG. 4, the adhesive 122 may be formed on the surfaces of the dummy chip 120 and the first chip 110, and a portion of the adhesive 122 may be filled into the gap between the dummy chip 120 and the first chip 110, such that the first chip 110 may be completely fixed in the groove of the dummy chip 120.

Specifically, the surface of the adhesive 122 may be ground and polished to remove the adhesive 122 on the surfaces of the dummy chip 120 and the first chip 110, as shown in FIG. 5, to expose the first passivation layer 111 and the first metal pads 112 of the dummy chip 120 and the first chip 110. In some other embodiments, other methods may also be used to remove the adhesive 121, which is not specifically limited in the present disclosure.

The plurality of second chips may be hybrid-bonded with the dummy chip and the first chip respectively by following processes.

First, as shown in FIG. 6, the first passivation layer 111 of the first chip 110 and the dummy chip 120 may be bonded with the second passivation layer 141 of the plurality of second chips 140. In one embodiment, the first passivation layer 111 and the second passivation layer 141 may be made of a material including a silicon dioxide layer, a silicon nitride layer, or other materials that play a passivation role, which is not limited in the present disclosure. Specifically, the first passivation layer 111 and the second passivation layer 141 may be aligned first. Then, the first passivation layer 111 may be connected to the second passivation layer 141 through high-temperature pressure bonding.

Subsequently, the first metal pads 112 of the first chip 110 and the dummy chip 120 and the second metal pads 142 of the plurality of second chips 140 may be bonded. In one embodiment, the first metal pads 112 and the second metal pads 142 may be made of a material including metal copper (that is, copper pads), or other metal materials, which are not specifically limited in this embodiment. Specifically, the first metal pads 112 may be aligned with the second metal pads 142, and the connection may be realized through high-temperature compression and thermal expansion of copper.

The plurality of second chips may be respectively bonded with the first chip and the dummy chip at the wafer level, which may realize bonding with a pitch of less than 1 μm and realize high-density interconnection.

As shown in FIG. 6, the orthographic projection of the plurality of second chips 140 on the dummy chip 120 may be located within the dummy chip 120. That is, the total size of the plurality of second chips 140 may be smaller than the size of the dummy chip 120.

In S130, a first plastic encapsulation layer may be formed to wrap the plurality of second chips.

Figure 7:
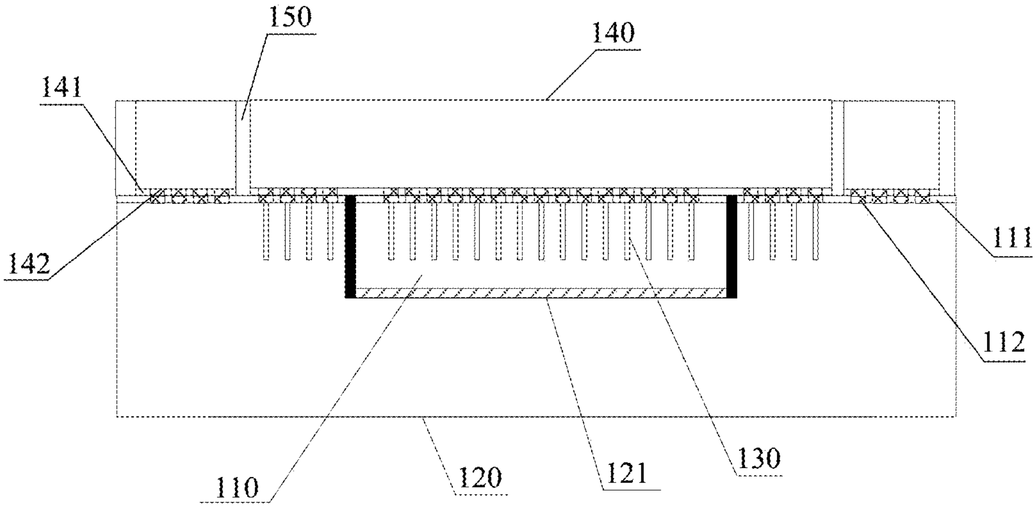

Specifically, as shown in FIG. 7, the sizes of the plurality of second chips 140 may be smaller than the size of the dummy chip 120, and the first plastic encapsulation layer 150 may be formed on the plurality of second chips 140 correspondingly. The first plastic encapsulation layer 150 may protect the plurality of second chips 140, and the size of the first plastic encapsulation layer 150 wrapping the plurality of second chips 140 may be consistent with the size of the dummy chip 120. That is to say, the first plastic encapsulation layer 150 may extend the plurality of second chips. The first plastic encapsulation layer 150 may be formed by a method including film vacuum lamination or traditional plastic encapsulation process, which is not specifically limited in this embodiment.

In S140, a second plastic encapsulation layer may be formed to wrap the first chip, the dummy chip, and the first plastic encapsulation layer.

First, the surfaces of the bonded first chip and the dummy chip away from the plurality of second chips may be thinned to expose the plurality of conductive through holes of the first chip and the dummy chip.

Figure 8:
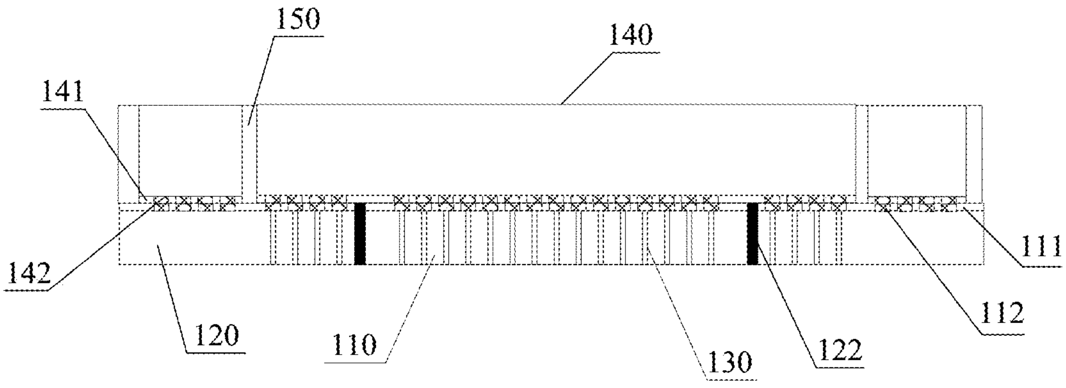

Specifically, as shown in FIG. 8, the backsides of the bonded first chip 110 and the dummy chip 120 may be thinned and then etched to expose the plurality of conductive through holes 130 of the first chip 110 and the dummy chip 120, that is, the through-silicon vias. A residual thickness of the first chip 110 and the dummy chip 120 after thinning may be less than 40 μm. By thinning the backsides of the first chip 110 and the dummy chip 120, the plurality of conductive through holes 130 may be exposed for electrical connection, further reducing the package height. In one embodiment, the thickness of the first plastic encapsulation layer 150 may meet the requirements and may be not thinned. In some other embodiments, the thickness of the first plastic encapsulation layer 150 and the thickness of the plurality of second chips 140 may be large, and it may be necessary to thin the first plastic encapsulation layer 150.

Subsequently, the surfaces of the thinned first chip and the dummy chip facing away from the plurality of second chips may be fixed on a temporary carrier, and then the second plastic encapsulation layer may be formed.

Specifically, the above packaging process may be used to package a plurality of first chips 110, a plurality of dummy chips 120 and a plurality of second chips 140 at the same time. After thinning, a plurality of chip assemblies may be cut to form a plurality of independent chip assemblies shown in FIG. 8 and then the following packaging process may be performed on each of the plurality of independent chip assemblies.

Figure 9:
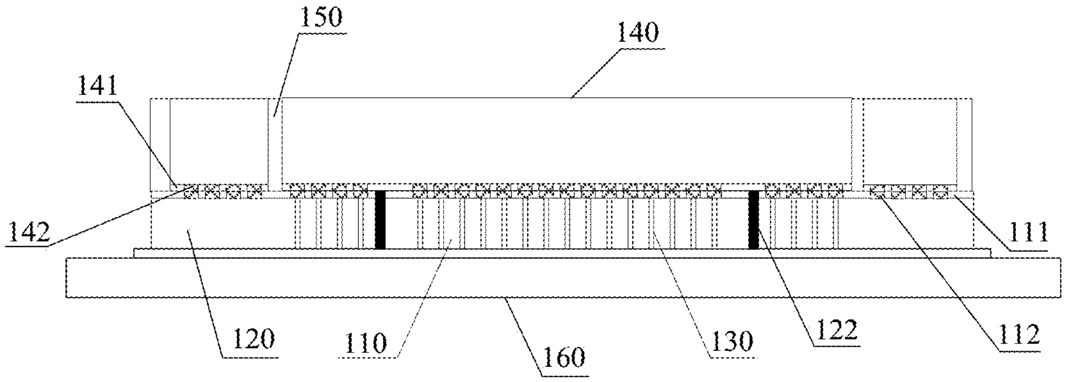
Figure 10:
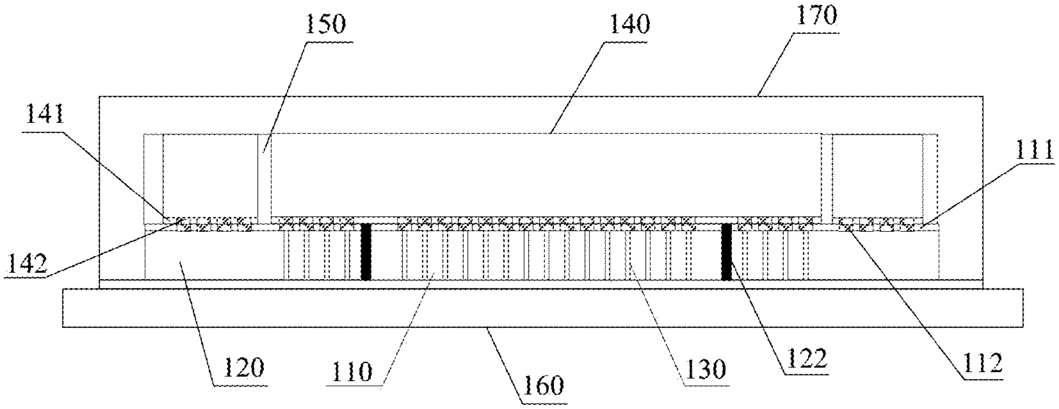

As shown in FIG. 9, the surfaces of the thinned first chip 110 and dummy chip 120 away from the plurality of second chips 140 may be fixed on the temporary carrier 160. That is, the backsides of the first chip 110 and the dummy chip 120 may be used as a contact surface. According to the final packaging size, they may be attached to the temporary carrier 160 with temporary bonding glue one by one, and then packaged to form the second plastic encapsulation layer 170 as shown in FIG. 10. The second plastic encapsulation layer 170 may wrap the first chip 110, the dummy chip 120, and the plurality of second chips 150. The second plastic encapsulation layer may be formed by a plastic encapsulation method including film vacuum lamination or traditional plastic sealing process, which is not specifically limited in the present disclosure.

In S150, a redistribution wiring layer may be formed on the surfaces of the dummy chip and the first chip away from the plurality of second chips, and the redistribution wiring layer may be electrically connected to the first chip through the plurality of conductive through holes.

In one embodiment, the redistribution wiring layer may be formed on the surfaces of the dummy chip and the first chip away from the plurality of second chips by: separating the first chip and the dummy chip from the temporary carrier; forming a dielectric layer on surfaces of the second plastic encapsulation layer, the dummy chip and the first chip away from the plurality of second chips; and patterning the dielectric layer and forming the redistribution wiring layer on the patterned dielectric layer.

Figure 11:
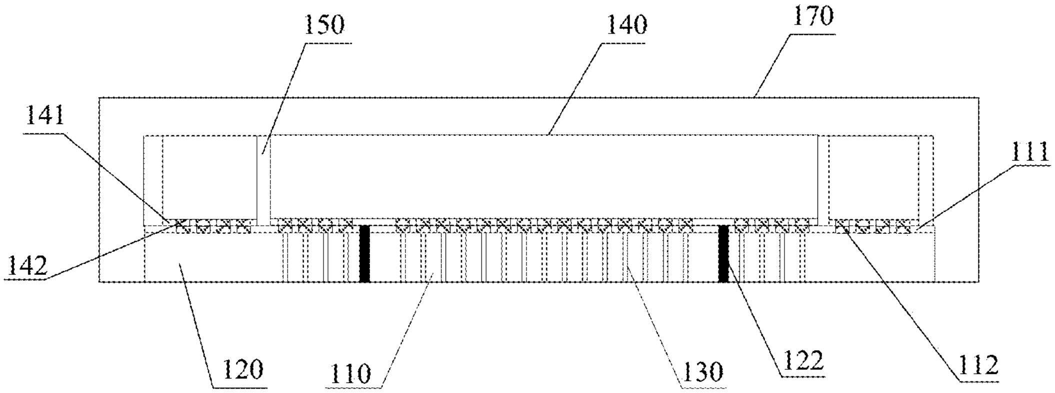

Specifically, as shown in FIG. 11, the first chip 110 and the dummy chip 120 may be separated from the temporary carrier 160. That is, the temporary carrier 160 may be removed. The first chip 110 and the dummy chip 120 may be separated from the temporary carrier 160 by a separation method including thermal separation, laser separation, ultraviolet light separation, mechanical separation or other methods. These methods are currently commonly used temporary bonding separation methods. The separation method is not specifically limited in the present disclosure, and may be selected according to actual needs.

Figure 12:
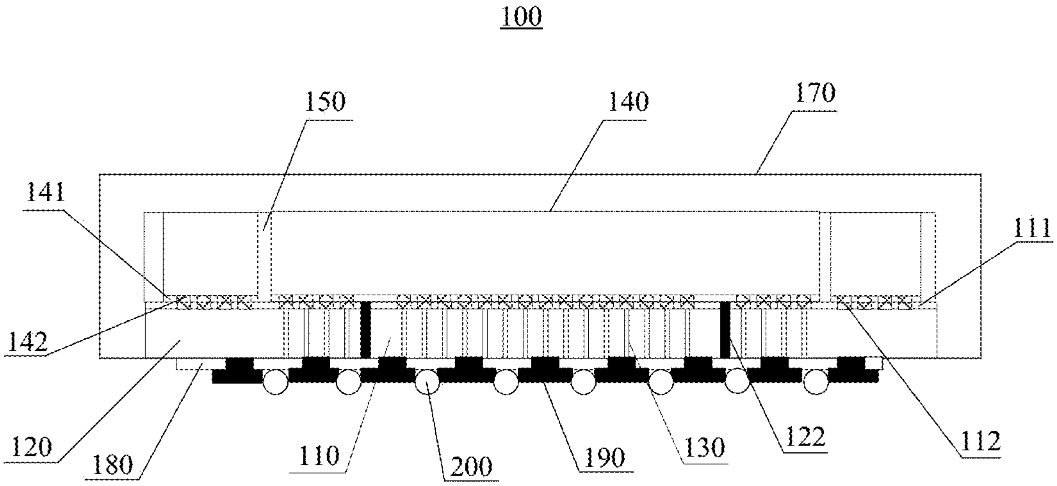

As shown in FIG. 12, the dielectric layer 180 may be coated on the surfaces of the second plastic encapsulation layer 170, the dummy chip 120 and the first chip 110 away from the plurality of second chips 140. That is, the dielectric layer 180 may be formed on the backside of the plastic encapsulation layer 170, the thinned first chip 110 and the dummy chip 120. The dielectric layer 180 may be made of a material including polyimide (PI), polybenzoxazole (PBO), etc., and may be formed by a coating method including wafer spin coating, which are not specifically limited in the present disclosure.

As shown in FIG. 12, the dielectric layer 180 may be patterned by a photolithography process, and the redistribution wiring layer 190 may be formed on the patterned dielectric layer 180. The redistribution wiring layer 190 may be electrically connected to the first chip 110 through the plurality of conductive through holes 130. The redistribution wiring layer 190 may be formed by a method including electroplating, sputtering, thermal evaporation, plasma enhanced chemical vapor deposition, low pressure chemical vapor deposition, atmospheric pressure chemical vapor deposition, or electron cyclotron resonance chemical vapor deposition, etc., which is not specifically limited in the present disclosure. The redistribution wiring layer 190 may be made of a material including metal titanium or metal copper, which is not limited in the present disclosure.

Subsequently, the redistribution wiring layer may be patterned, and solder balls may be formed on the patterned redistribution wiring layer.

Specifically, as shown in FIG. 12, the redistribution wiring layer 190 may be patterned by a photolithography process, and ball planting may be performed on the patterned redistribution wiring layer 190 to form a plurality of solder balls 200. Electrically connection to the outside world may be realized through the plurality of solder balls 200.

In the fan-out stacked chip packaging method provided by the present disclosure, the dummy chip and the first plastic encapsulation layer may be used to expand the first chip and the plurality of second chips through the wafer expanding technology, to realize bridge connection of the signals of the plurality of chips. The plurality of second chips may be hybrid-bonded to the dummy chip and the first chip respectively, through wafer expansion technology, and then the wafer-level hybrid bonding may be performed to achieve high-density interconnection while improving production efficiency. The dummy chip may be used to realize the lateral connection of the plurality of second chips, further reducing the packaging height. Also, conductive through hole technology and fan-out rewiring technology may be used to replace existing substrate interconnection, to reduce package size. Further, since the first chip and the plurality of second chips may be directly bonded through wafer bonding, the thickness after bonding may be the same as that of the chip body, which minimizes the package height and achieves ultra-thinning multilayer high-density stacked packaging.

The present disclosure also provides a fan-out stacked chip packaging structure. As shown in FIG. 12, in one embodiment, the fan-out stacked chip packaging structure 100 may include a dummy chip 120, a first chip 110, a plurality of second chips 140, a hybrid bonding structure (not shown in the figure), a first plastic encapsulation layer 160, a plastic encapsulation layer 170, and a redistribution wiring layer 180.

The dummy chip 120 may be provided with a groove, and the first chip 110 may be disposed in the groove. The first chip 110 and the dummy chip 120 may be both provided with a plurality of conductive through holes 130, and the plurality of conductive through holes 130 may be through-silicon vias. The through-silicon vias may be used to realize the vertical electrical interconnection, which reduces the package height.

The plurality of second chips 140 may be stacked on the first chip 110 and the dummy chip 120. The plurality of second chips 140 may be connected to the dummy chip 120 and the first chip 110 by hybrid bonding respectively. An orthographic projection of the plurality of second chips on the dummy chip 120 may be located within the dummy chip 120. That is, the total size of the plurality of second chips 140 may be smaller than the size of the dummy chip 120. The dummy chip 120 may be used to expand the chip function area of the first chip, to improve the production efficiency.

The first plastic encapsulation layer 160 may wrap the plurality of second chips 140, to protect the plurality of second chips 140. Correspondingly, the size of the first plastic encapsulation layer 150 wrapping the plurality of second chips 140 may be consistent with the size of the dummy chip 120, that is to say, the first plastic encapsulation layer 150 may expand the plurality of second chips.

The second plastic encapsulation layer 170 may wrap the first chip 110, the dummy chip 120 and the first plastic encapsulation layer 160 to protect the first chip 110, the dummy chip 120 and the first plastic encapsulation layer 160.

The redistribution wiring layer 180 may be disposed on the surfaces of the dummy chip 120 and the first chip 110 away from the plurality of second chips 140, and may be electrically connected to the first chip 110 through the plurality of conductive through holes 130. The redistribution wiring layer 180 may be formed by a method including electroplating, sputtering, thermal evaporation, plasma enhanced chemical vapor deposition, low pressure chemical vapor deposition, atmospheric pressure chemical vapor deposition, or electron cyclotron resonance chemical vapor deposition, etc., which is not specifically limited in the present disclosure. The redistribution wiring layer 180 may be made of a material including metal titanium or metal copper, which is not limited in the present disclosure. The packaging structure 100 may use the plurality of through holes 130 and the redistribution wiring layer 180 to lead out the signals of the first chip 110 and the plurality of second chips 140.

In one embodiment shown in FIG. 12, the hybrid bonding structure may include a first passivation layer 111 and first metal pads 112 disposed on the surfaces of the first chip 110 and the dummy chip 120 facing the plurality of second chips 140, and a second passivation layer 151 and second metal pads 152 on surfaces of the plurality of second chips 140 facing the first chip 110. The first passivation layer 111 and the second passivation layer 151 may be bonded and connected, and the first metal pads 112 and the second metal pads 152 may be bonded. The interconnection density of hybrid bonding may be high, and bonding with a spacing of less than 1 μm may be realized, which may improve production efficiency while achieving high-density interconnection.

In one embodiment shown in FIG. 12, the packaging structure 100 may further include a dielectric layer 190 and solder balls 200. The dielectric layer 190 may be disposed on the surfaces of the second plastic encapsulation layer 170, the dummy chip 120 and the first chip 110 away from the plurality of second chips 140. The redistribution wiring layer 180 may be disposed on the dielectric layer 190 and the solder balls 200 may be disposed on the redistribution wiring layer 180. The solder balls 200 may be electrically connected to the outside.

A number of the plurality of second chips 140 may be two, three, four, or more. Types of the plurality of second chips 140 may be same or different. The present disclosure has no limit on the number and types of the plurality of second chips 140, which may be selected according to actual needs.

In one embodiment, the plurality of conductive through holes 130 may be disposed at positions of the dummy chip 120 corresponding to some of the plurality of second chips 140 in a center area, and may be not disposed at positions of the dummy chip 120 corresponding to the plurality of second chips 140 in the dummy chip 120 in an edge area. The plurality of second chips 140 located in the edge region may be electrically connected to the plurality of second chips 140 located in the central region through the first metal pads 112 on the surface of the dummy chip 120, and then signals of the plurality of second chips 140 and the first chip

110 may be led out through the plurality of conductive through holes 130 on the dummy chip 120 and the first chip 110. In some other embodiments, the plurality of conductive through holes 130 may be disposed at positions of the dummy chip 120 corresponding to all of the plurality of second chips 140, and the plurality of second chips 140 may be electrically connected through the first metal pads 112 on the surface of the dummy chip 120, and then signals of the plurality of second chips 140 and the first chip 110 may be led out through the plurality of conductive through holes 130 on the dummy chip 120 and the first chip 110.

In one embodiment, as shown in FIG. 12, the plurality of second chips 140 may include three laterally connected second chips 140, that is, a second chip 140 located in the central region and the two second chips 140 respectively located in the edge region. The plurality of second chips may be laterally connected to further reduce the package height. A size of the second chip 140 located in the central area may be larger than the sizes of the first chip 110 and the two second chips 140 in the edge area. The plurality of conductive through holes 130 may be disposed in an area of the dummy chip 120 corresponding to the second chip 140 in the central area, and may be not disposed in an area of the dummy chip 120 corresponding to the two second chips 140 in the edge area.

In the fan-out stacked chip packaging structure provided by the present disclosure, the dummy chip and the first plastic encapsulation layer may be used to expand the first chip and the plurality of second chips through the wafer expanding technology, to realize bridge connection of the signals of the plurality of chips. The plurality of second chips may be hybrid-bonded to the dummy chip and the first chip respectively, through wafer expansion technology, and then the wafer-level hybrid bonding may be performed to achieve high-density interconnection while improving production efficiency. The dummy chip may be used to realize the lateral connection of the plurality of second chips, further reducing the packaging height. Also, conductive through hole technology and fan-out rewiring technology may be used to replace existing substrate interconnection, to reduce package size. Further, since the first chip and the plurality of second chips may be directly bonded through wafer bonding, the thickness after bonding may be the same as that of the chip body, which minimizes the package height and achieves ultra-thinning multilayer high-density stacked packaging.

Figure 13:
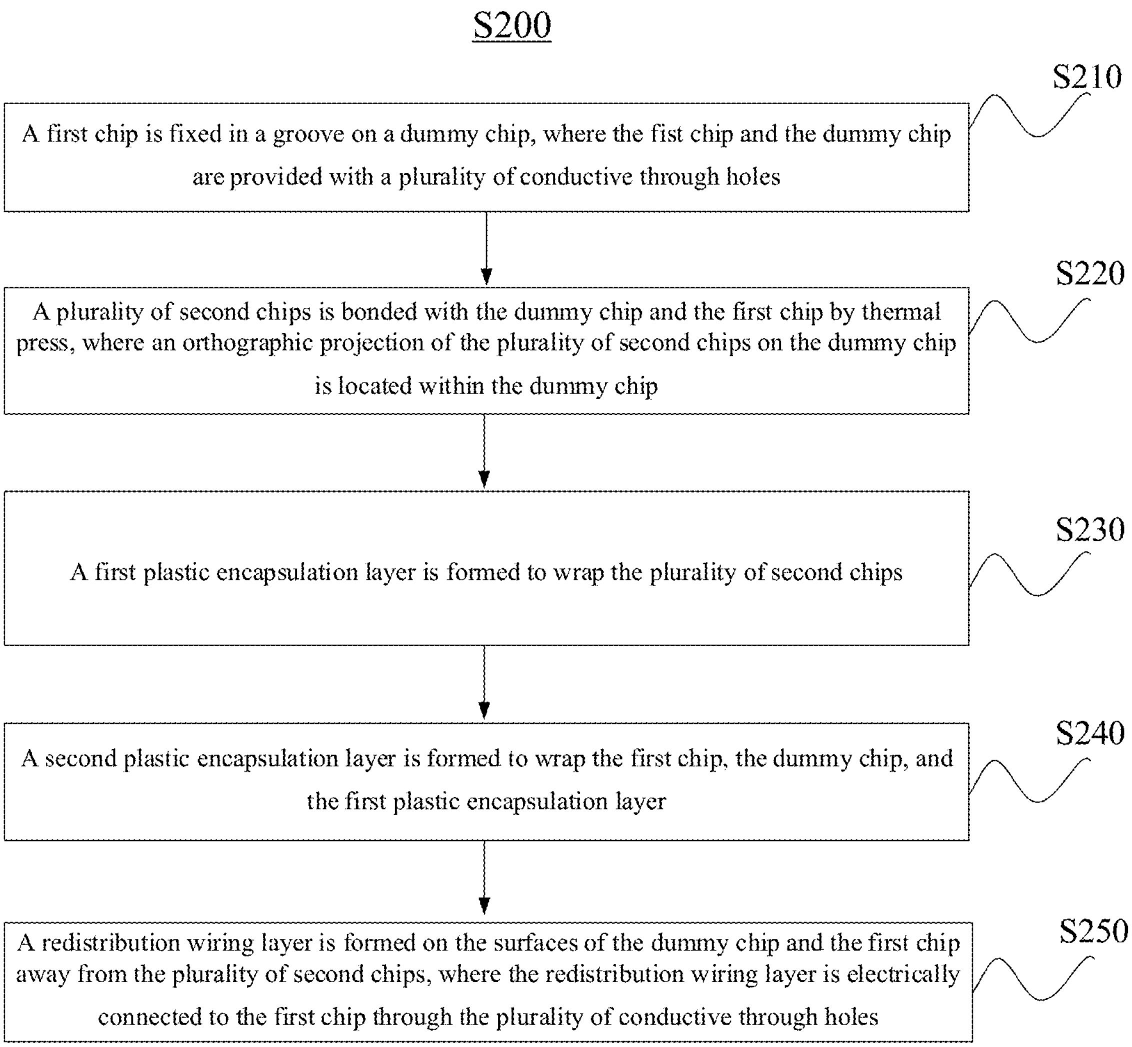
FIG. 13 illustrates an exemplary fan-out stacked chip packaging method according to various disclosed embodiments of the present disclosure.

Another embodiment of the present disclosure provides another fan-out stacked chip packaging method S200. As shown in FIG. 13, the method S200 may include S210 to S250.

In S210, a first chip may be fixed in a groove on a dummy chip. The first chip and the dummy chip may both be provided with a plurality of conductive through holes.

Figure 14:
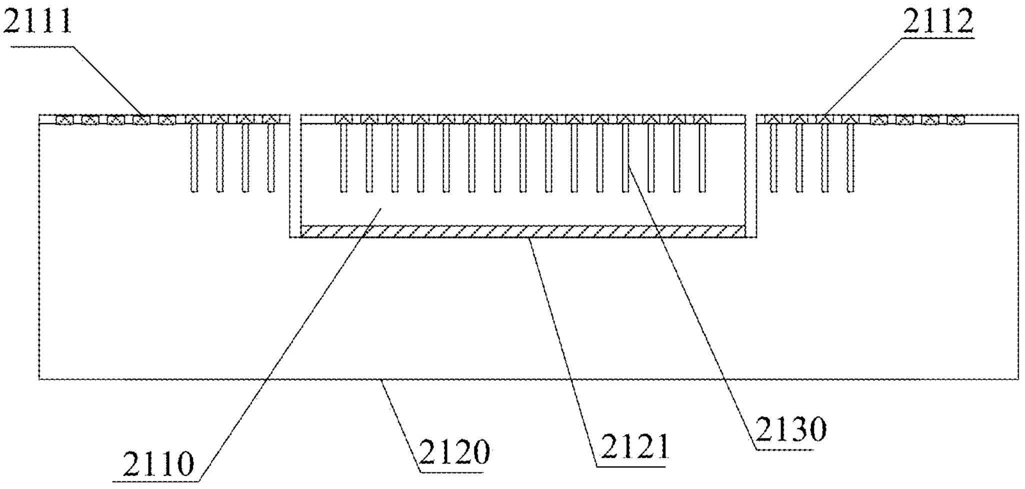
FIG. 14 to FIG. 23 illustrate structures corresponding to certain stages of a fan-out stacked chip packaging method according to various disclosed embodiments of the present disclosure.

Specifically, as shown in FIG. 14, a back side of the first chip 2110 may be fixed in the groove on the dummy chip 2120 by adhesive 2121. The surface of the first chip 2110 may protrude out from the surface of the dummy chip 2120. That is, a front surface of the first chip 2110 may be flush with the surface of the dummy chip 2120, such that they may be better bonded with a plurality of second chips 2140 through thermal press. The dummy chip 2120 may be used to expand a chip function area of the first chip 2110. The front surfaces of the first chip 2110 and the dummy chip 2120 may be provided with the plurality of conductive through holes 2130, and the plurality of conductive through holes 2130 may be distributed at equal intervals. The plurality of conductive through holes may be through-silicon vias. Through-silicon via technology may be used to realize the vertical electrical interconnection of through-silicon vias, which may reduce the package height.

In S220, the plurality of second chips may be bonded with the dummy chip and the first chip respectively by thermal press. Orthographic projections of the plurality of second chips to the dummy chip may be located within the dummy chip.

Figure 15:
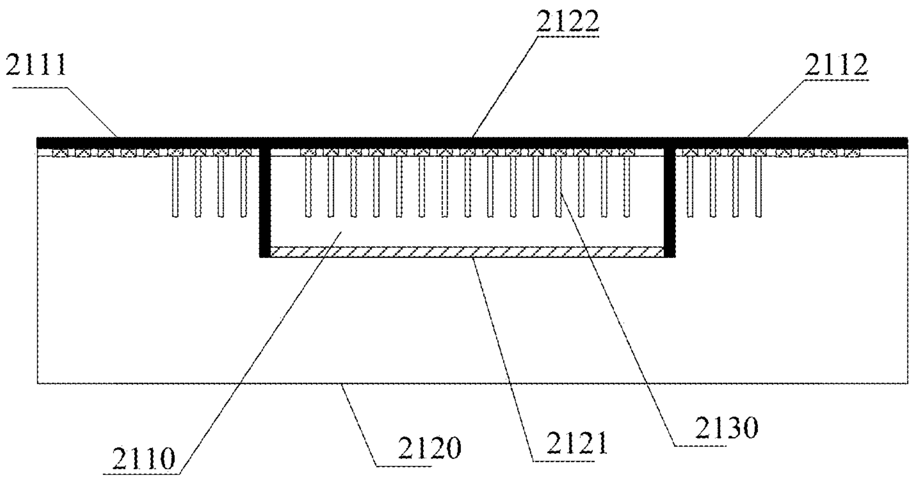
Figure 16:
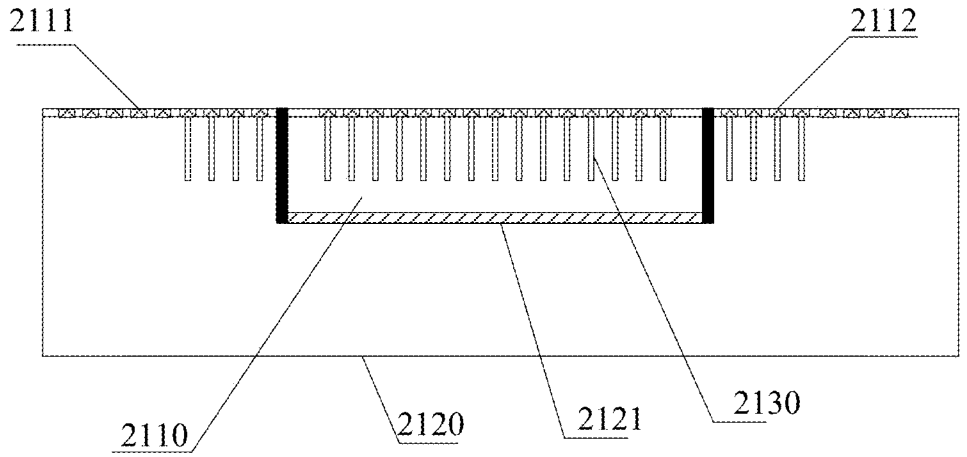
Figure 17:
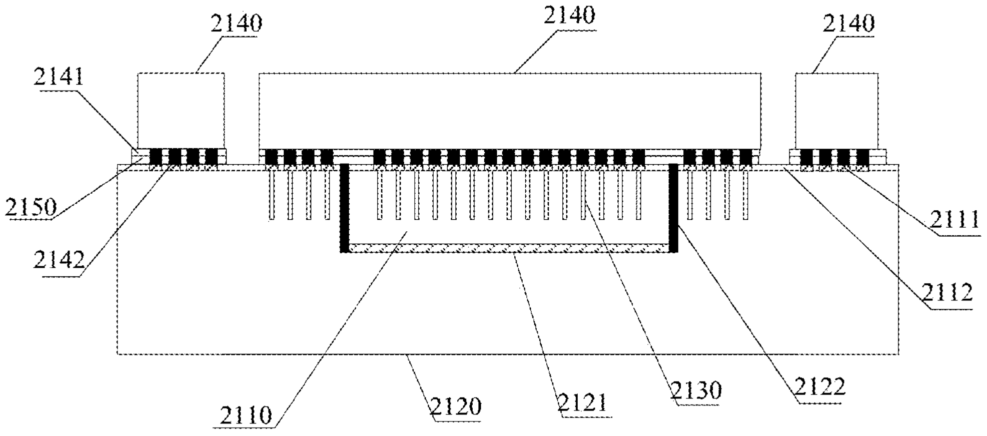

As shown in FIG. 14, FIG. 15, and FIG. 16, a first passivation layer 2111 and first metal pads 2112 may be disposed on a surface of the first chip 2110 and a surface of the dummy chip 2120 facing the plurality of second chips 2140. Each first metal pad 2112 on the first chip 2110 may correspond to one of the plurality of conductive through holes 130 of the first chip 110, and each first metal pad 112 on the dummy chip 120 may correspond to one of the plurality of conductive through holes 130 of the dummy chip 120. As shown in FIG. 17, surfaces of the plurality of second chips 2140 facing the first chip 2110 may be provided with a second passivation layer 2141 and a plurality of conductive bumps 2142.

A number of the plurality of second chips 2140 may be two, three, four, or more. Types of the plurality of second chips 140 may be same or different. The present disclosure has no limit on the number and types of the plurality of second chips 2140, which may be selected according to actual needs.

In one embodiment, the plurality of conductive through holes 2130 may be disposed at positions of the dummy chip 2120 corresponding to some of the plurality of second chips 2140 in a center area, and may be not disposed at positions of the dummy chip 2120 corresponding to the plurality of second chips 2140 in the dummy chip 2120 in an edge area. The plurality of second chips 2140 located in the edge region may be electrically connected to the plurality of second chips 2140 located in the central region through the first metal pads 2112 on the surface of the dummy chip 2120, and then signals of the plurality of second chips 2140 and the first chip 2110 may be led out through the plurality of conductive through holes 2130 on the dummy chip 2120 and the first chip 2110. In some other embodiments, the plurality of conductive through holes 130 may be disposed at positions of the dummy chip 2120 corresponding to all of the plurality of second chips 2140, and the plurality of second chips 2140 may be electrically connected through the first metal pads 2112 on the surface of the dummy chip 2120, and then signals of the plurality of second chips 2140 and the first chip 2110 may be led out through the plurality of conductive through holes 2130 on the dummy chip 2120 and the first chip 2110. That is, the plurality of conductive through holes 2130 may be disposed at positions of the dummy chip 2120 corresponding to at least some of the plurality of second chips 2140.

Figure 18:
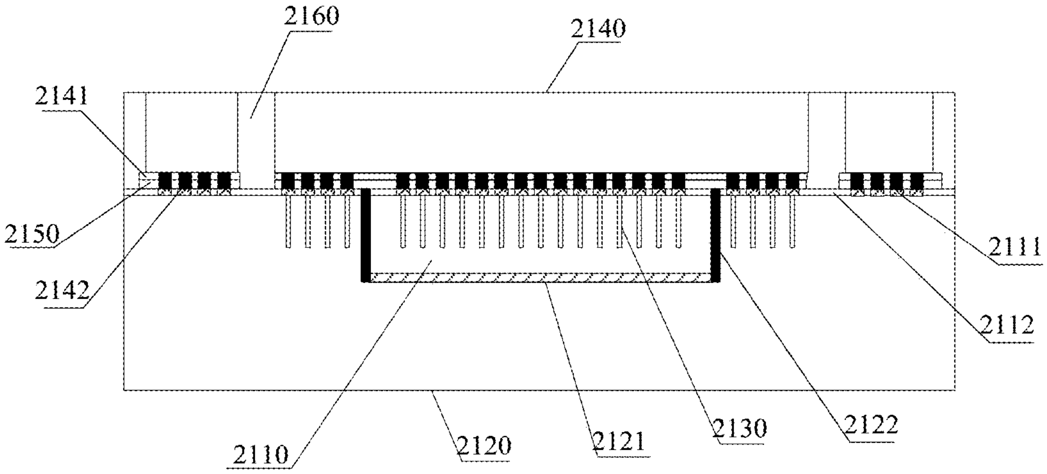

In one embodiment, as shown in FIG. 18, the plurality of second chips 2140 may include three laterally connected second chips 2140, that is, a second chip 2140 located in the central region and the two second chips 2140 respectively located in the edge region. The plurality of second chips may be laterally connected to further reduce the package height. A size of the second chip 2140 located in the central area may be larger than the sizes of the first chip 2110 and the two second chips 2140 in the edge area. The plurality of conductive through holes 130 may be disposed in an area of the dummy chip 2120 corresponding to the second chip 2140 in the central area, and may be not disposed in an area of the dummy chip 2120 corresponding to the two second chips 2140 in the edge area.

In one embodiment, before bonding the plurality of second chips with the first chip and the dummy chip by thermal press, the method may further include: forming an adhesive on the surfaces of the dummy chip and the first chip, where a portion of the adhesive may be filled into a gap between the dummy chip and the first chip; and then removing the adhesive on the surfaces of the dummy chip and the first chip to expose the first passivation layer and the first metal pads of the dummy chip and the first chip.

Specifically, as shown in FIG. 15, the adhesive 2122 may be formed on the surfaces of the dummy chip 2120 and the first chip 2110, and a portion of the adhesive 2122 may be filled into the gap between the dummy chip 2120 and the first chip 2110, such that the first chip 2110 may be completely fixed in the groove of the dummy chip 2120.

Specifically, the surface of the adhesive 2122 may be ground and polished to remove the adhesive 2122 on the surfaces of the dummy chip 2120 and the first chip 2110, as shown in FIG. 15, to expose the first passivation layer 2111 and the first metal pads 2112 of the dummy chip 2120 and the first chip 2110. In some other embodiments, other methods may also be used to remove the adhesive 2121, which is not specifically limited in the present disclosure.

In one embodiment, before bonding the plurality of second chips with the dummy chip and the first chip by thermal press, the method may further include: forming a non-conductive adhesive layer to wrap the plurality of conductive bumps.

Specifically, as shown in FIG. 17, before bonding the plurality of second chips 2140 with the dummy chip 2120 and the first chip 2110 by thermal press, that is, after removing the adhesive 2122 on the surfaces of the dummy chip 2120 and the first chip 2110 to expose the first passivation layer 2111 and the first metal pads 2112 on the surfaces of the dummy chip 2120 and the first chip 2110, the non-conductive adhesive layer 2150 may be formed to wrap and protect the plurality of conductive bumps 2142.

There are currently two ways of using non-conductive adhesive. In one method, the non-conductive adhesive may be made into a thin film structure to form the non-conductive adhesive layer 2150, which may be pre-coated on surfaces of the plurality of second chips 2140 facing the first chip 2110 and wrap the plurality of conductive bumps 2142. Then the first metal pads 2112 of the first chip 2110 and the dummy chip 2120 and the plurality of conductive bumps 2142 of the plurality of second chips 2140 may be soldered and connected. In another method, the non-conductive adhesive may be coated on a surface of the first chip 2110 facing the plurality of second chips 2140, to form the non-conductive adhesive layer 2150, and then the plurality of second chips 2140 may be soldered and connected to the first chip 2110 through the non-conductive adhesive layer 2150.

Since the non-conductive adhesive is applied before the plurality of conductive bumps 2142 are soldered, all the non-conductive adhesive on a soldering interface may need to be discharged from the soldering interface during soldering, which has extremely high requirements on the properties of the non-conductive adhesive material. The non-conductive adhesive layer formed by the non-conductive adhesive may be able to ensure the soldering effect between the first metal pads 2112 and the plurality of conductive bumps 2142.

In one embodiment, the plurality of second chips may be bonded with the dummy chip and the first chip respectively through thermal press, by bonding the metal pads and the plurality of conductive bumps through thermal press.

Specifically, as shown in FIG. 17, the plurality of conductive bumps 2142 and the first metal pads 2112 may be soldered together through action of heat and pressure, to realize bonding and connection. In one embodiment, the plurality of conductive bumps 2142 may be made of a material including copper tin conductive bumps, and the metal pads 2112 may be made of a material including metal copper, which are not limited in the present disclosure.

The plurality of second chips may be bonded with the first chip and the dummy chip respectively by wafer-level thermal press, to further reduce the packaging height and achieve high-density interconnection.

As shown in FIG. 17, the orthographic projections of the plurality of second chips 2140 on the dummy chip 2120 may be located within the dummy chip 2120. That is, the total size of the plurality of second chips 2140 may smaller than the size of the dummy chip 2120.

In S230, a first plastic encapsulation layer may be formed to wrap the plurality of second chips.

Specifically, as shown in FIG. 18, since the size of the plurality of second chips 2140 is smaller than the size of the dummy chip, the first plastic encapsulation layer 2160 may be formed on the plurality of second chips 2140, to protect the plurality of second chips 2140. Therefore, the size of the first plastic encapsulation layer 2160 wrapping the plurality of second chips 2140 may be consistent with the size of the dummy chip 2120. That is, the first plastic encapsulation layer 2160 may expand the plurality of second chips 2140. The first plastic encapsulation layer 2160 may be formed by a plastic encapsulation method including film vacuum lamination or traditional plastic sealing process, which is not specifically limited in this embodiment.

In S240, a second plastic encapsulation layer may be formed to wrap the first chip, the dummy chip, and the first plastic encapsulation layer.

First, surfaces of the first chip and the dummy chip away from the plurality of second chips may be thinned, to expose the plurality of conductive through holes of the first chip and the dummy chip.

Figure 19:
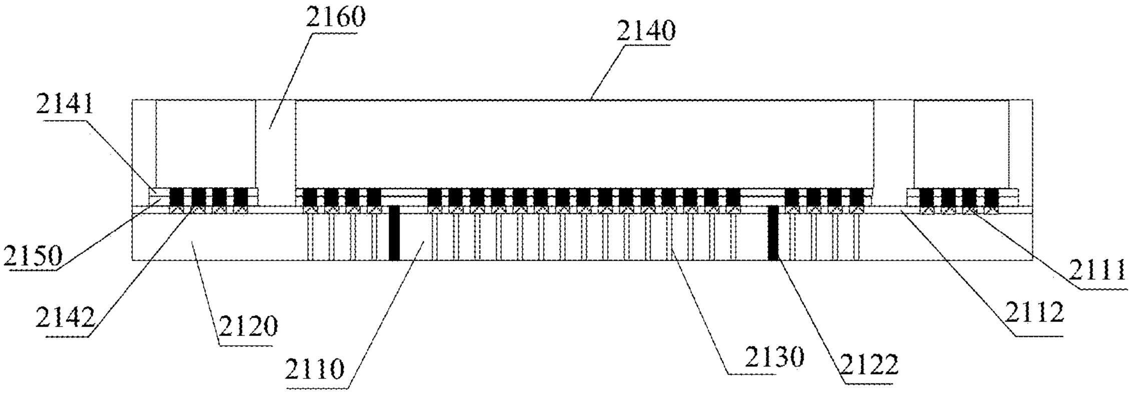

Specifically, as shown in FIG. 19, the surfaces of t of the first chip 2110 and the dummy chip 2120 away from the plurality of second chips 2140 may be thinned by grinding or polishing, to expose the plurality of conductive through holes 2130, that is, the through-silicon vias. A residual thickness of the first chip 2110 and the dummy chip 2120 after thinning may be less than 40 μm. By thinning the backsides of the first chip 2110 and the dummy chip 2120, the plurality of conductive through holes 2130 may be exposed for electrical connection, further reducing the package height. In one embodiment, the thickness of the first plastic encapsulation layer 2160 may meet the requirements and may be not thinned. In some other embodiments, the thickness of the first plastic encapsulation layer 2160 and the thickness of the plurality of second chips 2140 may be large, and it may be necessary to thin the first plastic encapsulation layer 2160.

Subsequently, the surfaces of the thinned first chip and the dummy chip facing away from the plurality of second chips may be fixed on a temporary carrier, and then the second plastic encapsulation layer may be formed.

Specifically, the above packaging process may be used to package a plurality of first chips 2110, a plurality of dummy chips 2120 and a plurality of second chips 2140 at the same time. After thinning, a plurality of chip assemblies may be cut to form a plurality of independent chip assemblies shown in FIG. 19 and then the following packaging process may be performed on each of the plurality of independent chip assemblies.

Figure 20:
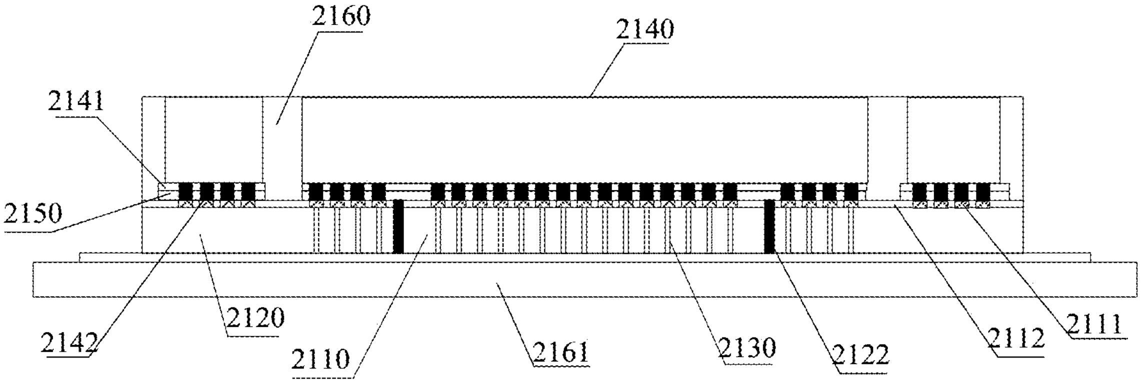
Figure 21:
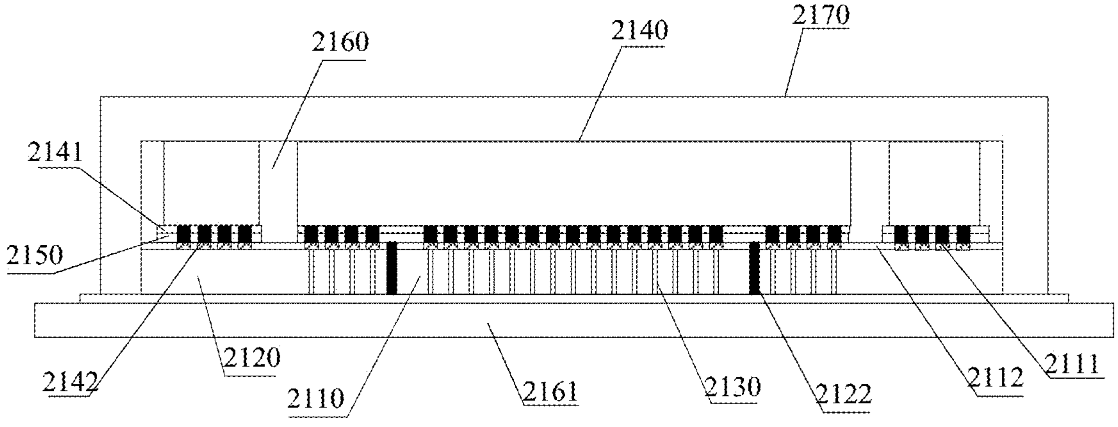

As shown in FIG. 20, the surfaces of the thinned first chip 2110 and dummy chip 2120 away from the plurality of second chips 2140 may be fixed on the temporary carrier 2161. That is, the backsides of the first chip 2110 and the dummy chip 2120 may be used as a contact surface. According to the final packaging size, they may be attached to the temporary carrier 2161 with temporary bonding glue one by one, and then packaged to form the second plastic encapsulation layer 2170 as shown in FIG. 21. The second plastic encapsulation layer 2170 may wrap the first chip 2110, the dummy chip 2120, and the first plastic encapsulation layer 2160. The second plastic encapsulation layer may be formed by a plastic encapsulation method including film vacuum lamination or traditional plastic sealing process, which is not specifically limited in the present disclosure.

In S250, a redistribution wiring layer may be formed on the surfaces of the dummy chip and the first chip away from the plurality of second chips, and the redistribution wiring layer may be electrically connected to the first chip through the plurality of conductive through holes.

In one embodiment, the redistribution wiring layer may be formed on the surfaces of the dummy chip and the first chip away from the plurality of second chips by: separating the first chip and the dummy chip from the temporary carrier; forming a dielectric layer on surfaces of the second plastic encapsulation layer, the dummy chip and the first chip away from the plurality of second chips; and patterning the dielectric layer and forming the redistribution wiring layer on the patterned dielectric layer.

Figure 22:
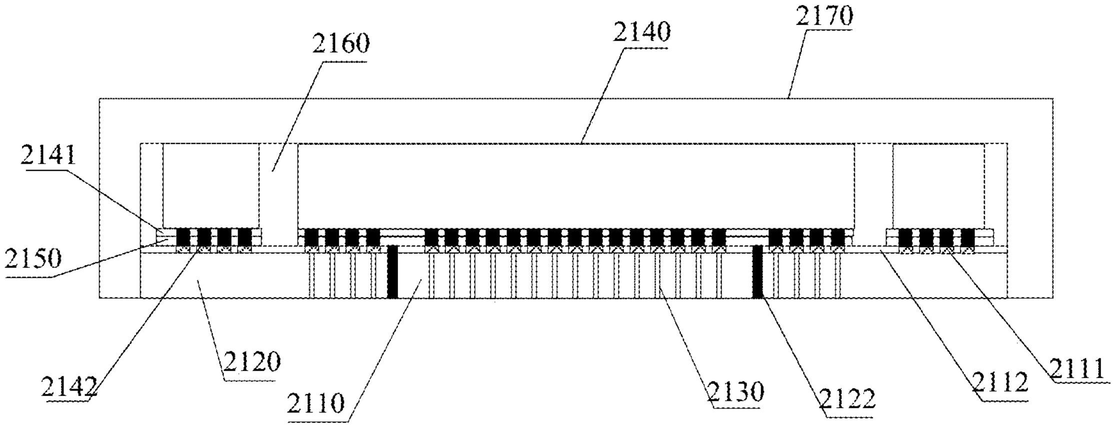

Specifically, as shown in FIG. 22, the first chip 1110 and the dummy chip 1120 may be separated from the temporary carrier 2161. That is, the temporary carrier 2161 may be removed. The first chip 2110 and the dummy chip 2120 may be separated from the temporary carrier 2161 by a separation method including thermal separation, laser separation, ultraviolet light separation, mechanical separation or other methods. These methods are currently commonly used temporary bonding separation methods. The separation method is not specifically limited in the present disclosure, and may be selected according to actual needs.

Figure 23:
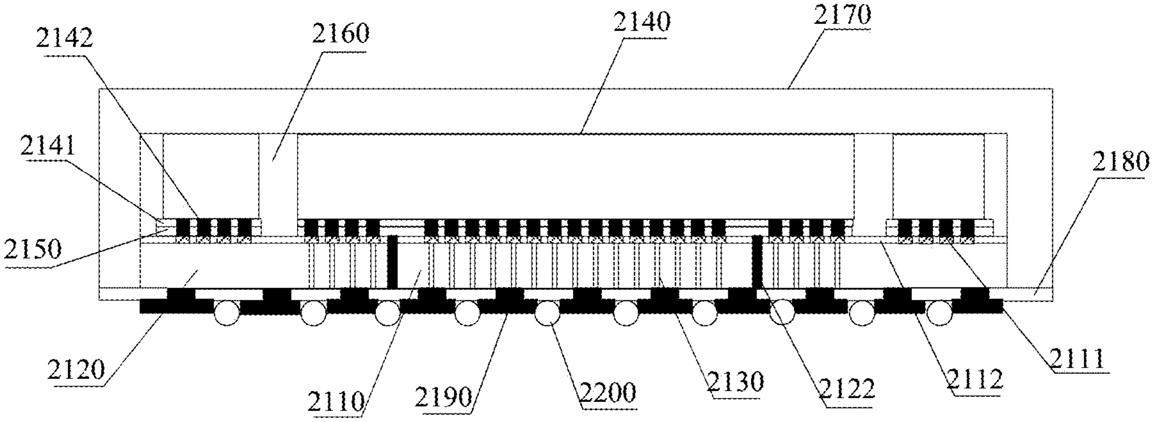

As shown in FIG. 23, the dielectric layer 2180 may be coated on the surfaces of the second plastic encapsulation layer 2170, the dummy chip 2120 and the first chip 2110 away from the plurality of second chips 140. That is, the dielectric layer 2180 may be formed on the backside of the plastic encapsulation layer 2170, the thinned first chip 2110 and the dummy chip 2120. The dielectric layer 2180 may be made of a material including polyimide (PI), polybenzoxazole (PBO), etc., and may be formed by a coating method including wafer spin coating, which is not specifically limited in the present disclosure.

As shown in FIG. 23, the dielectric layer 2180 may be patterned by a photolithography process, and the redistribution wiring layer 2190 may be formed on the patterned dielectric layer 180. The redistribution wiring layer 2190 may be electrically connected to the first chip 2110 through the plurality of conductive through holes 2130. The redistribution wiring layer 2190 may be formed by a method including electroplating, sputtering, thermal evaporation, plasma enhanced chemical vapor deposition, low pressure chemical vapor deposition, atmospheric pressure chemical vapor deposition, or electron cyclotron resonance chemical vapor deposition, etc., which is not specifically limited in the present disclosure. The redistribution wiring layer 190 may be made of a material including metal titanium or metal copper, which is not limited in the present disclosure.

Subsequently, the redistribution wiring layer may be patterned, and solder balls may be formed on the patterned redistribution wiring layer.

Specifically, as shown in FIG. 23, the redistribution wiring layer 190 may be patterned by a photolithography process, and ball planting may be performed on the patterned redistribution wiring layer 2190 to form a plurality of solder balls 2200. Electrically connection to the outside world may be realized through the plurality of solder balls 2200.

In the fan-out stacked chip packaging method provided by the present disclosure, the dummy chip and the first plastic encapsulation layer may be used to expand the first chip and the plurality of second chips through the wafer expanding technology respectively, to realize bridge connection of the signals of the plurality of chips. The plurality of second chips may be bonded to the dummy chip and the first chip respectively by thermal press, to achieve high-density interconnection while improving production efficiency. The dummy chip may be used to realize the lateral connection of the plurality of second chips, further reducing the packaging height. Also, conductive through hole technology and fan-out rewiring technology may be used to replace existing substrate interconnection, to reduce package size. Further, since the first chip and the plurality of second chips may be directly bonded through wafer bonding, the thickness after bonding may be the same as that of the chip body, which minimizes the package height and achieves ultra-thinning multilayer high-density stacked packaging.

The present disclosure also provides another fan-out stacked chip packaging structure. As shown in FIG. 23, in one embodiment, the fan-out stacked chip packaging structure 200 may include a dummy chip 2120, a first chip 2110, a plurality of second chips 2140, a thermal press bonding structure (not shown in the figure), a first plastic encapsulation layer 2160, a plastic encapsulation layer 2170, and a redistribution wiring layer 2180.

The dummy chip 2120 may be provided with a groove, and the first chip 2110 may be disposed in the groove. The first chip 2110 and the dummy chip 2120 may be both provided with a plurality of conductive through holes 130, and the plurality of conductive through holes 2130 may be through-silicon vias. The through-silicon vias may be used to realize the vertical electrical interconnection, which reduces the package height.

The plurality of second chips 2140 may be stacked on the first chip 2110 and the dummy chip 2120. The plurality of second chips 2140 may be connected to the dummy chip 2120 and the first chip 2110 by thermal press bonding respectively. An orthographic projection of the plurality of second chips on the dummy chip 2120 may be located within the dummy chip 2120. That is, the total size of the plurality of second chips 2140 may be smaller than the size of the dummy chip 2120. The dummy chip 2120 may be used to expand the chip function area of the first chip, to improve the production efficiency.

The first plastic encapsulation layer 2160 may wrap the plurality of second chips 2140, to protect the plurality of second chips 2140. Correspondingly, the size of the first plastic encapsulation layer 2160 wrapping the plurality of second chips 2140 may be consistent with the size of the dummy chip 2120, that is to say, the first plastic encapsulation layer 2160 may expand the plurality of second chips.

The second plastic encapsulation layer 2170 may wrap the first chip 2110, the dummy chip 2120 and the first plastic encapsulation layer 2160 to protect the first chip 2110, the dummy chip 2120 and the first plastic encapsulation layer 2160.

The redistribution wiring layer 2190 may be disposed on the surfaces of the dummy chip 2120 and the first chip 2110 away from the plurality of second chips 2140, and may be electrically connected to the first chip 2110 through the plurality of conductive through holes 2130.

In one embodiment shown in FIG. 23, a first passivation layer 2111 and first metal pads 2112 disposed on the surfaces of the first chip 2110 and the dummy chip 2120 facing the plurality of second chips 2140, and a second passivation layer 2141 and conductive bumps 2142 on surfaces of the plurality of second chips 2140 facing the first chip 2110. The first passivation layer 2111 and the second passivation layer 2141 may be bonded and connected by thermal press, and the first metal pads 2112 and the conductive bumps 2152 may be bonded and connected by thermal press. That is, the conductive bumps 2142 and the first metal pads 2112 may be soldered and connected through actions of heat and pressure, to achieve bonding and connection.

In one embodiment shown in FIG. 23, the packaging structure 200 may further include a non-conductive adhesive layer 2150 wrapping the conductive bumps 2142, to protect the conductive bumps 2142.

In one embodiment shown in FIG. 23, the packaging structure 2100 may further include a dielectric layer 2180 and solder balls 2200. The dielectric layer 2180 may be disposed on the surfaces of the second plastic encapsulation layer 2170, the dummy chip 2120 and the first chip 2110 away from the plurality of second chips 2140. The redistribution wiring layer 2190 may be disposed on the dielectric layer 2180 and the solder balls 2200 may be disposed on the redistribution wiring layer 2190. The solder balls 2200 may be electrically connected to the outside.

A number of the plurality of second chips 2140 may be two, three, four, or more. Types of the plurality of second chips 2140 may be same or different. The present disclosure has no limit on the number and types of the plurality of second chips 2140, which may be selected according to actual needs.

In one embodiment, the plurality of conductive through holes 2130 may be disposed at positions of the dummy chip 2120 corresponding to some of the plurality of second chips 2140 in a center area, and may be not disposed at positions of the dummy chip 2120 corresponding to the plurality of second chips 2140 in the dummy chip 2120 in an edge area. The plurality of second chips 2140 located in the edge region may be electrically connected to the plurality of second chips 2140 located in the central region through the first metal pads 2112 on the surface of the dummy chip 2120, and then signals of the plurality of second chips 2140 and the first chip 2110 may be led out through the plurality of conductive through holes 2130 on the dummy chip 2120 and the first chip 2110. In some other embodiments, the plurality of conductive through holes 130 may be disposed at positions of the dummy chip 2120 corresponding to all of the plurality of second chips 2140, and the plurality of second chips 2140 may be electrically connected through the first metal pads 2112 on the surface of the dummy chip 2120, and then signals of the plurality of second chips 2140 and the first chip 2110 may be led out through the plurality of conductive through holes 2130 on the dummy chip 2120 and the first chip 2110.

In one embodiment, as shown in FIG. 23, the plurality of second chips 2140 may include three laterally connected second chips 2140, that is, a second chip 2140 located in the central region and the two second chips 2140 respectively located in the edge region. The plurality of second chips may be laterally connected to further reduce the package height. A size of the second chip 2140 located in the central area may be larger than the sizes of the first chip 2110 and the two second chips 140 in the edge area. The plurality of conductive through holes 130 may be disposed in an area of the dummy chip 2120 corresponding to the second chip 2140 in the central area, and may be not disposed in an area of the dummy chip 2120 corresponding to the two second chips 2140 in the edge area.

In the fan-out stacked chip packaging structure provided by the present disclosure, the dummy chip and the first plastic encapsulation layer may be used to expand the first chip and the plurality of second chips through the wafer expanding technology, to realize bridge connection of the signals of the plurality of chips. The plurality of second chips may be bonded to the dummy chip and the first chip respectively through thermal press, to achieve high-density interconnection while improving production efficiency. The dummy chip may be used to realize the lateral connection of the plurality of second chips, further reducing the packaging height. Also, conductive through hole technology and fan-out rewiring technology may be used to replace existing substrate interconnection, to reduce package size. Further, since the first chip and the plurality of second chips may be directly bonded through wafer bonding, the thickness after bonding may be the same as that of the chip body, which minimizes the package height and achieves ultra-thinning multilayer high-density stacked packaging.

The present disclosure also provides another fan-out stacked chip packaging method S300.

Figure 24:
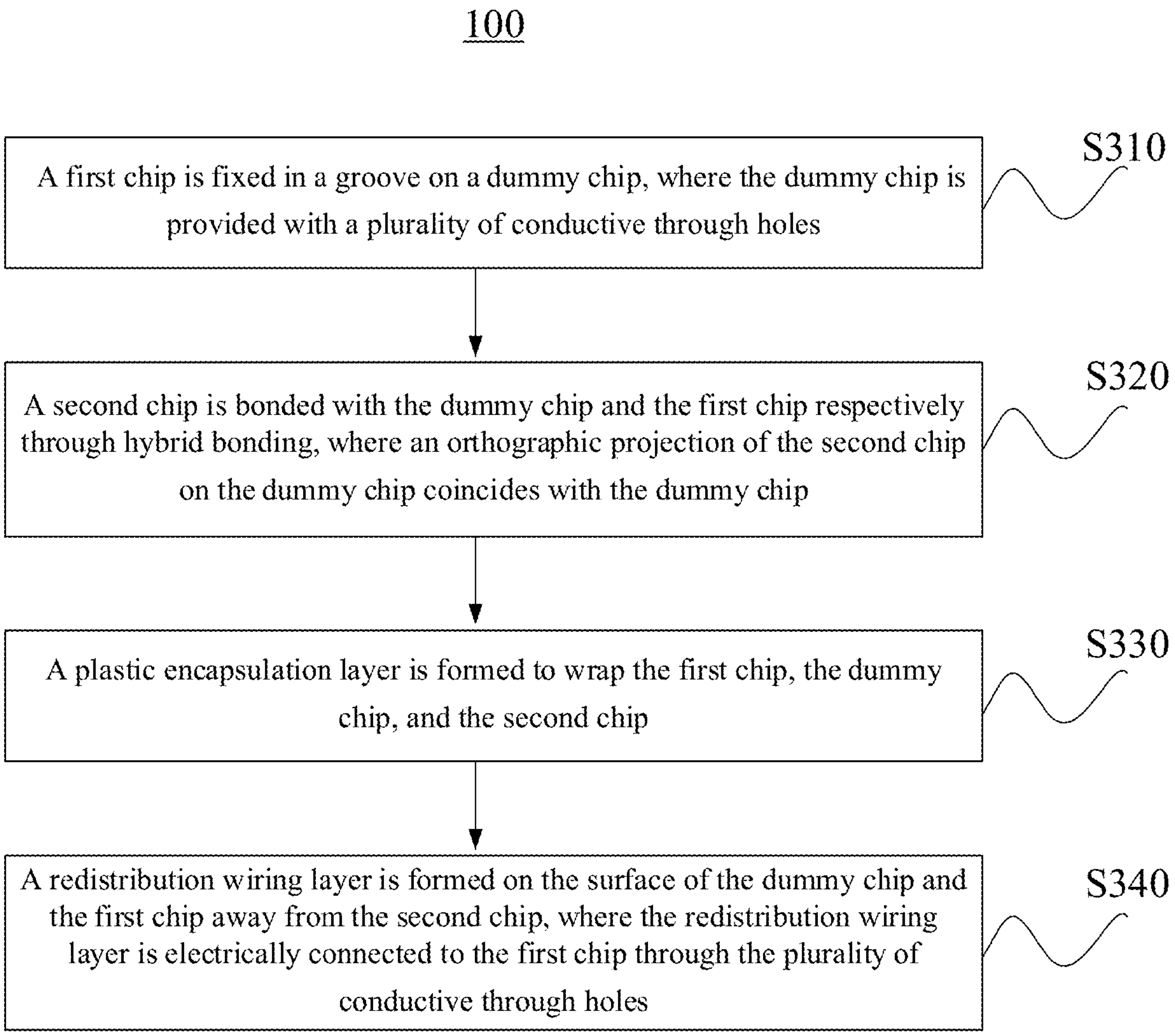
FIG. 24 illustrates another exemplary fan-out stacked chip packaging method according to various disclosed embodiments of the present disclosure.

As shown in FIG. 24, the fan-out stacked chip packaging method S300 may include S310 to S340.

In S310, a first chip may be fixed in a groove on a dummy chip. The dummy chip may be provided with a plurality of conductive through holes.

Figure 25:
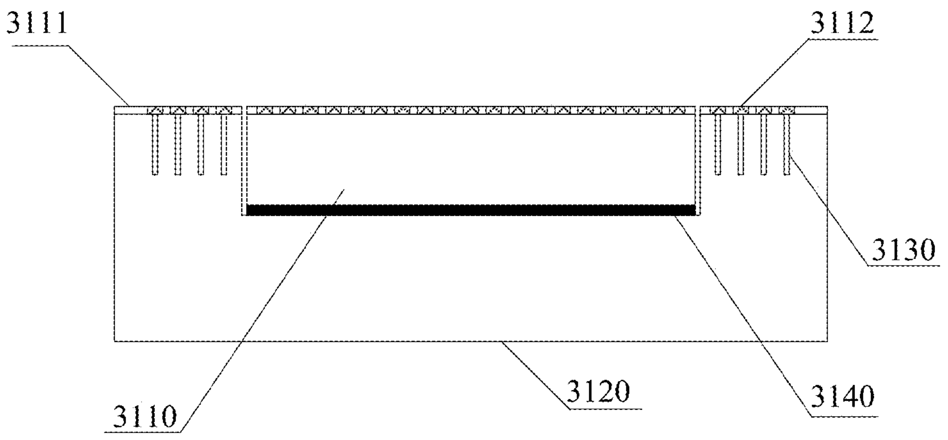
FIG. 25 to FIG. 33 illustrate structures corresponding to certain stages of a fan-out stacked chip packaging method according to various disclosed embodiments of the present disclosure.

Specifically, as shown in FIG. 25, a back side of the first chip 3110 may be fixed in the groove on the dummy chip 3120 by patch adhesive 3121, and a surface of the first chip 3110 may be flush with a surface of the dummy chip 3120. By making the surface of the first chip 3110 flush with the surface of the dummy chip 3120, they may be able to be better bonded with a second chip 3150 by hybrid bonding. The plurality of conductive through holes 3130 may be disposed on a front surface of the dummy chip 3120, and the plurality of conductive through holes 3130 may be distributed at equal intervals. The plurality of conductive through holes 3130 may be through-silicon vias. The through-silicon vias may be used to realize vertical electrical interconnection of through-silicon vias. The package height may be reduced. Signals of the first chip 3110 and the second chip 3150 may be connected to the outside through the plurality of conductive through holes 3130 on the dummy chip 3120.

In S320, the second chip may be bonded with the dummy chip and the first chip respectively through hybrid bonding. An orthographic projection of the second chip on the dummy chip may coincide with the dummy chip.

Figure 26:
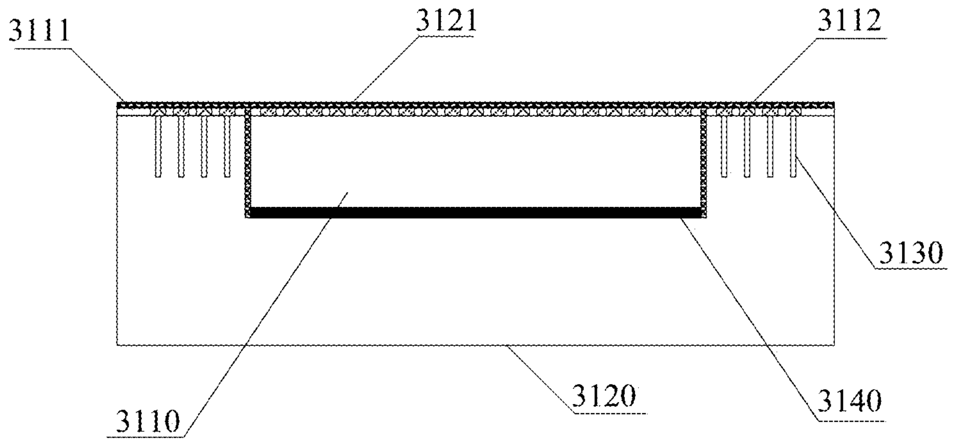
Figure 27:
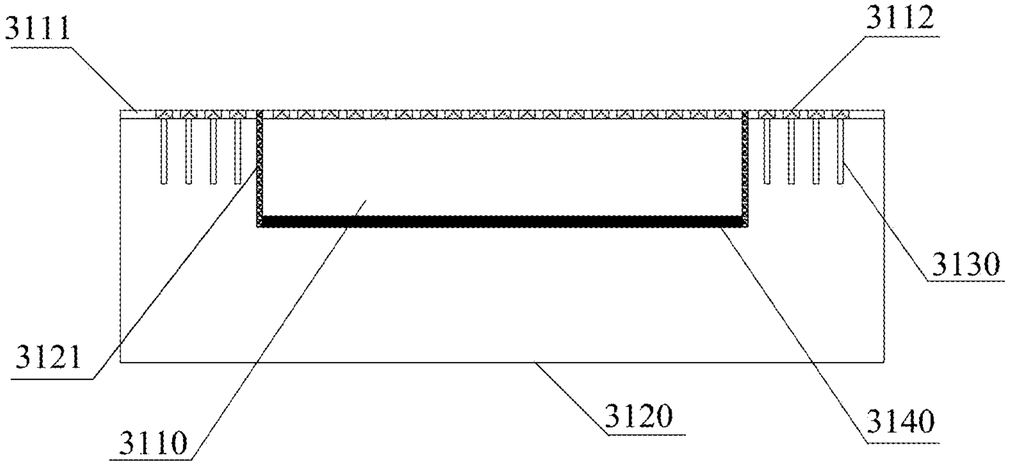

Specifically, as shown in FIG. 25, FIG. 26 and FIG. 27, a surface of the first chip 3110 and a surface of the dummy chip 3120 facing the second chip 3150 may be provided with a first passivation layer 3111 and first metal pads 3112. Each first metal pad 3112 on the dummy chip 3120 may correspond to one of the plurality of conductive through holes 3130 of the dummy chip 3120. As shown in FIG. 27, a surface of the second chip 3140 facing the first chip 110 may be provided with a second passivation layer 3151 and second metal pads 3152.

The second chip may be hybrid-bonded with the dummy chip and the first chip respectively by following processes.

First, the first passivation layer 3111 of the first chip 3110 and the dummy chip 3120 may be bonded with the second passivation layer 3151 of the second chip 3150. In one embodiment, the first passivation layer 3111 and the second passivation layer 3151 may be made of a material including a silicon dioxide layer, a silicon nitride layer, or other materials that play a passivation role, which is not limited in the present disclosure. Specifically, the first passivation layer 3111 and the second passivation layer 3151 may be aligned first. Then, the first passivation layer 3111 may be connected to the second passivation layer 3151 through high-temperature pressure bonding.

Subsequently, the first metal pads 3112 of the first chip 3110 and the dummy chip 3120 and the second metal pads 3152 of the second chip 3150 may be bonded. In one embodiment, the first metal pads 3112 and the second metal pads 3152 may be made of a material including metal copper (that is, copper pads), or other metal materials, which are not specifically limited in this embodiment. Specifically, the first metal pads 3112 may be aligned with the second metal pads 3152, and the connection may be realized through high-temperature compression and thermal expansion of copper.

Figure 28:
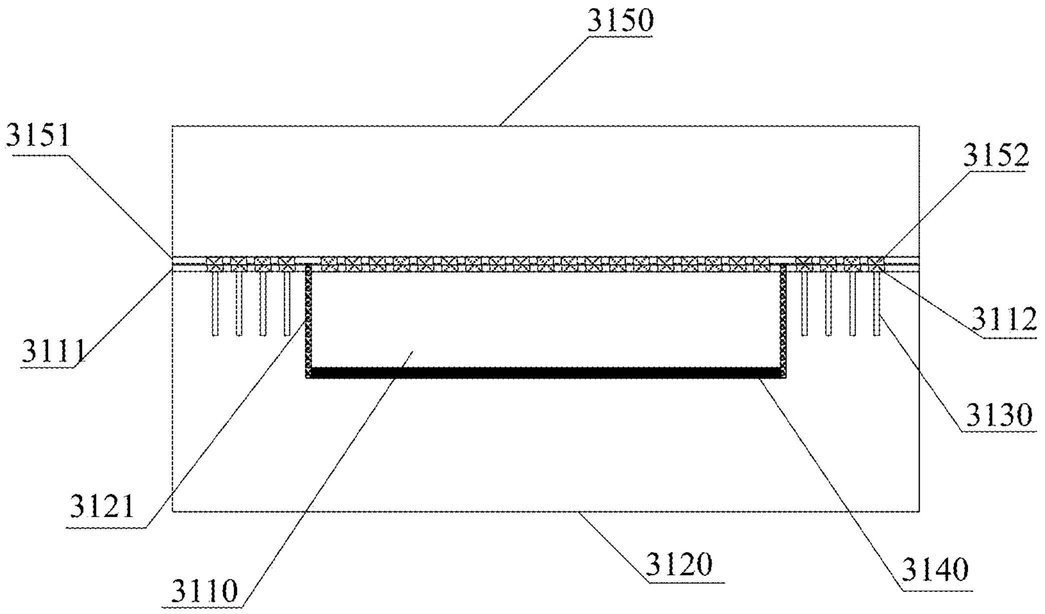

As shown in FIG. 28, the orthographic projection of the second chip 3150 on the dummy chip 3120 may coincide with the dummy chip 3120. That is, the size of the second chip 3150 may be consistent with the size of the dummy chip 3120. The first chip 3110 and the second chip 3150 of two different sizes may be adjusted to the same size by using a dummy chip to expand the functional area of the first chip 3110. The first chip and the second chip of two different sizes may be adjusted to the same size through wafer expansion technology, and then wafer-level hybrid bonding may be performed to achieve high-density interconnection while improving production efficiency.

In one embodiment, before hybrid-bonding the second chip with the dummy chip and the first chip respectively, the method may further include: first, forming an adhesive on the surfaces of the dummy chip and the first chip, where a portion of the adhesive may be filled into a gap between the dummy chip and the first chip; and then removing the adhesive on the surface of the dummy chip and the first chip to expose the first passivation layer and the first metal pads of the dummy chip and the first chip.

Specifically, as shown in FIG. 26, the adhesive 3121 may be formed on the surfaces of the dummy chip 3120 and the first chip 3110, and a portion of the adhesive 3121 may be filled into the gap between the dummy chip 3120 and the first chip 3110. The first chip 3110 may be completely fixed in the groove of the dummy chip 3120.

Specifically, the surface of the adhesive 3121 may be ground and polished to remove the adhesive 3121 on the surfaces of the dummy chip 3120 and the first chip 3110, as shown in FIG. 27, to expose the first passivation layer 3111 and the first metal pads 3112 of the dummy chip 3120 and the first chip 3110. In some other embodiments, other methods may also be used to remove the adhesive 3121, which is not specifically limited in the present disclosure.

The interconnection density of hybrid bonding is high and bonding with a spacing of less than 1 μm may be realized, which may improve production efficiency while achieving high-density interconnection.

In S330, a plastic encapsulation layer may be formed to wrap the first chip, the dummy chip, and the second chip.

First, the bonded first chip and the dummy chip may be thinned to expose the plurality of conductive through holes of the dummy chip.

Figure 29:
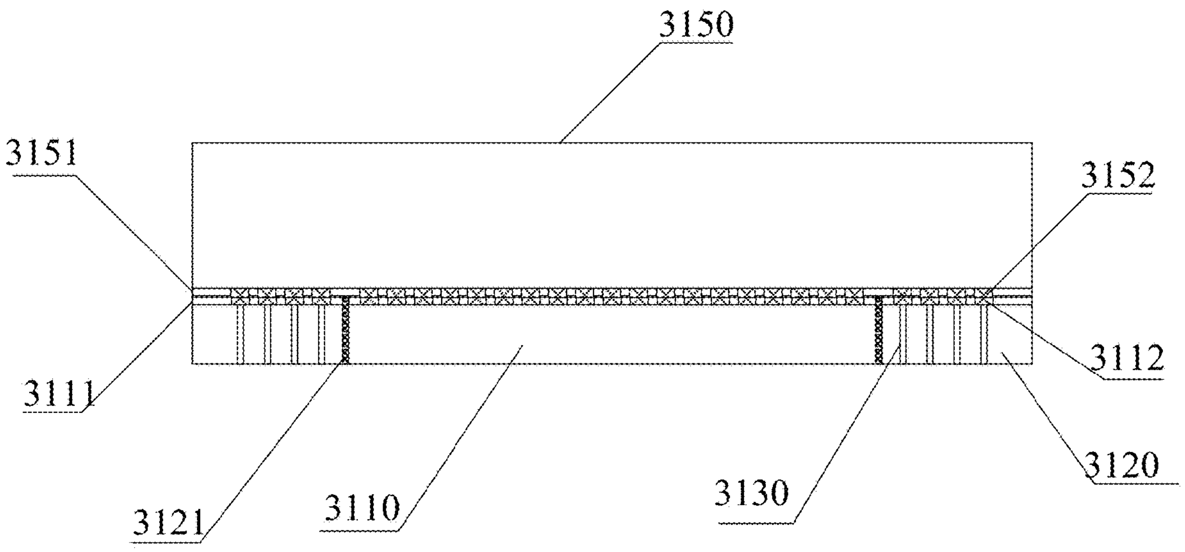

Specifically, as shown in FIG. 29, the backsides of the bonded first chip 3110 and the dummy chip 3120 may be thinned to expose the plurality of conductive through holes 3130 of the dummy chip 3120, that is, the through-silicon vias. A residual thickness of the first chip 3110 and the dummy chip 3120 after thinning may be less than 40 μm. By thinning the backsides of the first chip 3110 and the dummy chip 3120, the plurality of conductive through holes 3130 may be exposed for electrical connection, further reducing the package height.

Subsequently, the surface of the thinned first chip and the dummy chip facing away from the second chip may be fixed on a temporary carrier, and then the plastic encapsulation layer may be formed.

Figure 30:
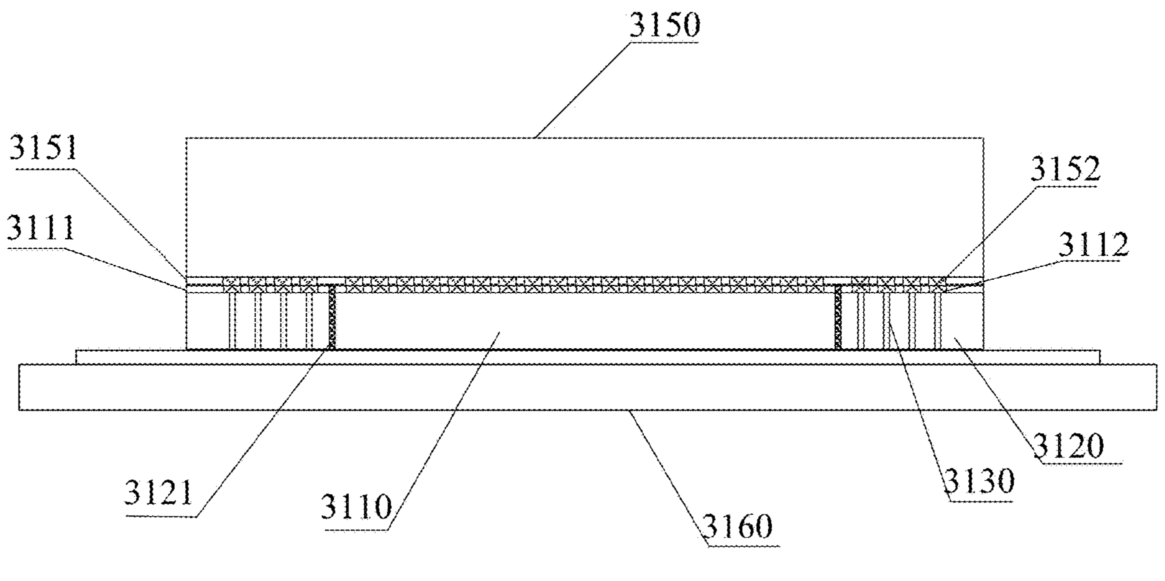
Figure 31:
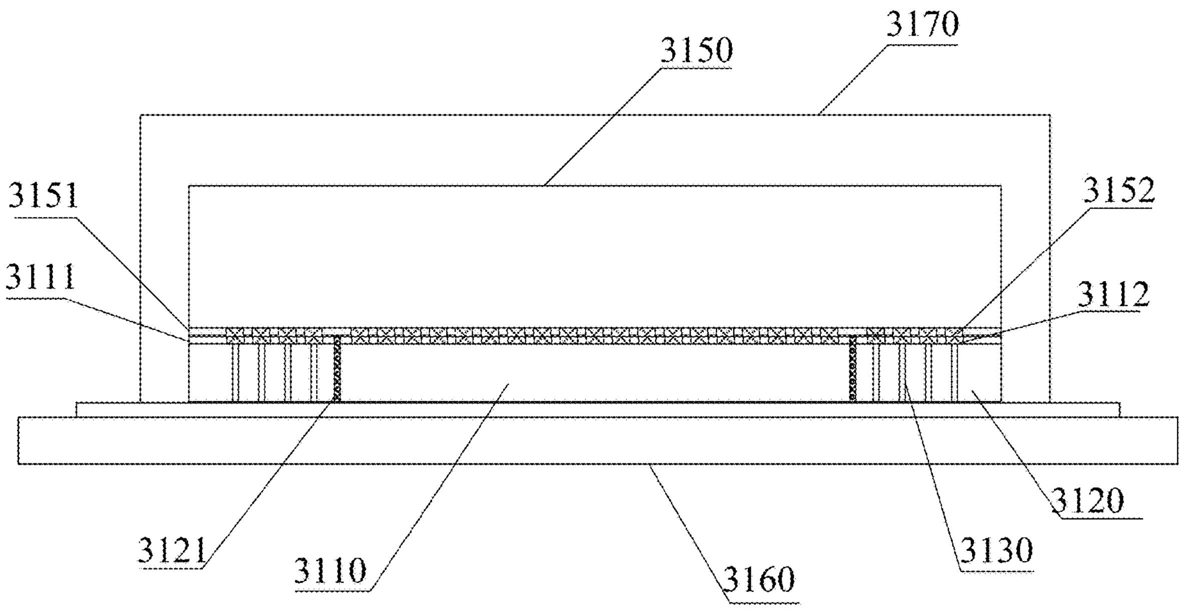

Specifically, the above packaging process may be used to package a plurality of first chips 3110, a plurality of dummy chips 3120 and a plurality of second chips 3150 at the same time. After thinning, a plurality of chip assemblies may be cut to form a plurality of independent chip assemblies shown in FIG. 29 and then the following packaging process may be performed on each of the plurality of independent chip assemblies. As shown in FIG. 30, the surface of the thinned first chip 3110 and dummy chip 3120 away from the second chip 3150 may be fixed on the temporary carrier 3160. That is, the backsides of the first chip 3110 and the dummy chip 3120 may be used as a contact surface. According to the final packaging size, they may be attached to the temporary carrier 3160 with temporary bonding glue one by one, and then packaged to form the plastic encapsulation layer 3170 as shown in FIG. 31. The plastic encapsulation layer 3170 may wrap the first chip 3110, the dummy chip 3120, and second chip 3150. The plastic encapsulation layer may be formed by a plastic encapsulation method including film vacuum lamination or traditional plastic sealing process, which is not specifically limited in the present disclosure.

In S340, a redistribution wiring layer may be formed on the surface of the dummy chip and the first chip away from the second chip, and the redistribution wiring layer may be electrically connected to the first chip through the plurality of conductive through holes.

In one embodiment, the redistribution wiring layer may be formed on the surface of the dummy chip and the first chip away from the second chip by: separating the first chip and the dummy chip from the temporary carrier; forming a dielectric layer on surfaces of the plastic encapsulation layer, the dummy chip and the first chip away from the second chip; and patterning the dielectric layer and forming the redistribution wiring layer on the patterned dielectric layer.

Figure 32:
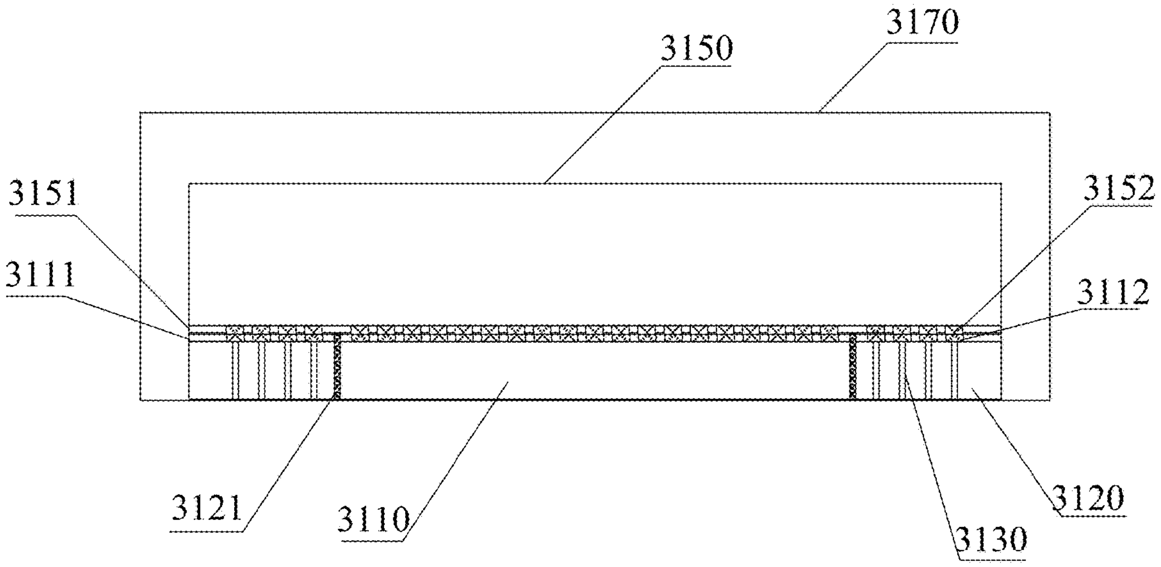

Specifically, as shown in FIG. 32, the first chip 3110 and the dummy chip 3120 may be separated from the temporary carrier 3160. That is, the temporary carrier 3160 may be removed. The first chip 3110 and the dummy chip 3120 may be separated from the temporary carrier 3160 by a separation method including thermal separation, laser separation, ultraviolet light separation, mechanical separation or other methods. These methods are currently commonly used temporary bonding separation methods. The separation method is not specifically limited in the present disclosure, and may be selected according to actual needs.

Figure 33:
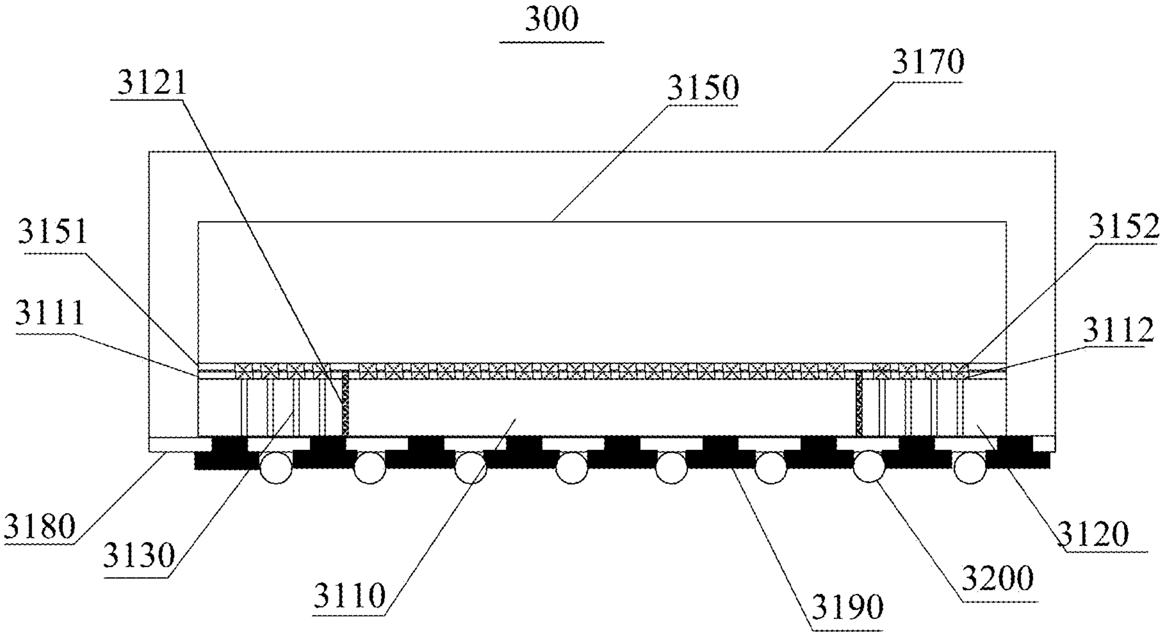

As shown in FIG. 33, the dielectric layer 3180 may be coated on the surfaces of the plastic encapsulation layer 3170, the dummy chip 3120 and the first chip 3110 away from the second chip 3150. That is, the dielectric layer 3180 may be formed on the backside of the plastic encapsulation layer 3170, the thinned first chip 3110 and the dummy chip 3120. The dielectric layer 3180 may be made of a material including polyimide (PI), polybenzoxazole (PBO), etc., and may be formed by a coating method including wafer spin coating, which are not specifically limited in the present disclosure.

As shown in FIG. 33, the dielectric layer 3180 may be patterned by a photolithography process, and the redistribution wiring layer 3190 may be formed on the patterned dielectric layer 3180. The redistribution wiring layer 3190 may be electrically connected to the first chip 3110 through the plurality of conductive through holes 3130. The redistribution wiring layer 3190 may be formed by a method including electroplating, sputtering, thermal evaporation, plasma enhanced chemical vapor deposition, low pressure chemical vapor deposition, atmospheric pressure chemical vapor deposition, or electron cyclotron resonance chemical vapor deposition, etc., which is not specifically limited in the present disclosure. The redistribution wiring layer 3190 may be made of a material including metal titanium or metal copper, which is not limited in the present disclosure.

Subsequently, the redistribution wiring layer may be patterned, and solder balls may be formed on the patterned redistribution wiring layer.

Specifically, as shown in FIG. 33, the redistribution wiring layer 3190 may be patterned by a photolithography process, and ball planting may be performed on the patterned redistribution wiring layer 3190 to form a plurality of solder balls 3200. Electrically connection to the outside world may be realized through the plurality of solder balls 3200.

In the fan-out stacked chip packaging method provided by the present disclosure, the first chip may be fixed in the groove on the dummy chip, and the dummy chip may be provided with the plurality of conductive through holes. The second chip may be hybrid-bonded to the dummy chip and the first chip respectively, through wafer expansion technology, and then the wafer-level hybrid bonding may be performed to achieve high-density interconnection while improving production efficiency. Also, conductive through hole technology and fan-out rewiring technology may be used to replace existing substrate interconnection, to reduce package size. Further, since the first chip and the second chip may be directly bonded through wafer bonding, the thickness after bonding may be the same as that of the chip body, which minimizes the package height and achieves ultra-thinning multilayer high-density stacked packaging.

Another embodiment of the present disclosure also provides another fan-out stacked chip packaging structure 300. As shown in FIG. 33, in one embodiment, the fan-out stacked chip packaging structure 300 may include a dummy chip 3120, a first chip 3110, a second chip 3150, a hybrid bonding structure (not shown in the figure), a plastic encapsulation layer 3170, and a redistribution wiring layer 3180. The dummy chip 3120 may be provided with a groove, and the first chip 3110 may be disposed in the groove. The dummy chip 3120 may be provided with a plurality of conductive through holes 3130, and the plurality of conductive through holes 3130 may be through-silicon vias. The through-silicon vias may be used to realize the vertical electrical interconnection, which reduces the package height.

The second chip 3150 may be stacked on the first chip 3110 and the dummy chip 3120. The second chip 3150 may be connected to the dummy chip 3120 and the first chip 3110 by hybrid bonding respectively. An orthographic projection of the second chip on the dummy chip 3120 may coincide with the dummy chip 3120. That is, the size of the second chip 3150 may be the same as that of the dummy chip 3120. The first chip 3110 and the second chip 3150 of two different sizes may be adjusted to the same size by the dummy chip 3120, thereby expanding the function area of the first chip 3110.

The plastic encapsulation layer 3170 may wrap the first chip 3110, the dummy chip 3120 and the second chip 3150 to protect the first chip 3110, the dummy chip 3120 and the second chip 3150.

The redistribution wiring layer 3190 may be disposed on the surfaces of the dummy chip 3120 and the first chip 3110 away from the second chip 3150, and may be electrically connected to the first chip 3110 through the plurality of conductive through holes 130. The redistribution wiring layer 3190 may be formed by a method including electroplating, sputtering, thermal evaporation, plasma enhanced chemical vapor deposition, low pressure chemical vapor deposition, atmospheric pressure chemical vapor deposition, or electron cyclotron resonance chemical vapor deposition, etc., which is not specifically limited in the present disclosure. The redistribution wiring layer 3190 may be made of a material including metal titanium or metal copper, which is not limited in the present disclosure. The packaging structure 300 may use the plurality of through holes 3130 and the redistribution wiring layer 3190 to lead out the signals of the first chip 3110 and the second chip 3150.

In one embodiment shown in FIG. 33, the hybrid bonding structure may include a first passivation layer 3111 and first metal pads 3112 disposed on the surfaces of the first chip 3110 and the dummy chip 3120 facing the second chip 150, and a second passivation layer 3151 and second metal pads 3152 on a surface of the second chip 3150 facing the first chip 3110. The first passivation layer 3111 and the second passivation layer 3151 may be bonded and connected, and the first metal pads 3112 and the second metal pads 3152 may be bonded. The interconnection density of hybrid bonding may be high, and bonding with a spacing of less than 1 μm may be realized, which may improve production efficiency while achieving high-density interconnection In one embodiment shown in FIG. 33, the surface of the first chip 3110 may be flush with the surface of the dummy chip 3120.

In one embodiment shown in FIG. 33, the packaging structure 300 may further include a dielectric layer 3180 and solder balls 3200. The dielectric layer 3180 may be disposed on the surfaces of the plastic encapsulation layer 3170, the dummy chip 3120 and the first chip 3110 away from the second chip 3150. The redistribution wiring layer 3190 may be disposed on the dielectric layer 3180 and the solder balls 3200 may be disposed on the redistribution wiring layer 3190. The solder balls 3200 may be electrically connected to the outside.

In the fan-out stacked chip packaging structure provided by the present disclosure, the first chip and the second chip of two different sizes may be adjusted to the same size by fixing the first chip in the groove of the dummy chip, and the second chip may be stacked and disposed on the first chip and the dummy chip. The second chip may be respectively connected to the dummy chip and the first chip through a hybrid bonding structure, realizing high-density interconnection while improving production efficiency. The packaging height may be reduced to the greatest extent, realizing ultra-thin packaging.

Figure 34:
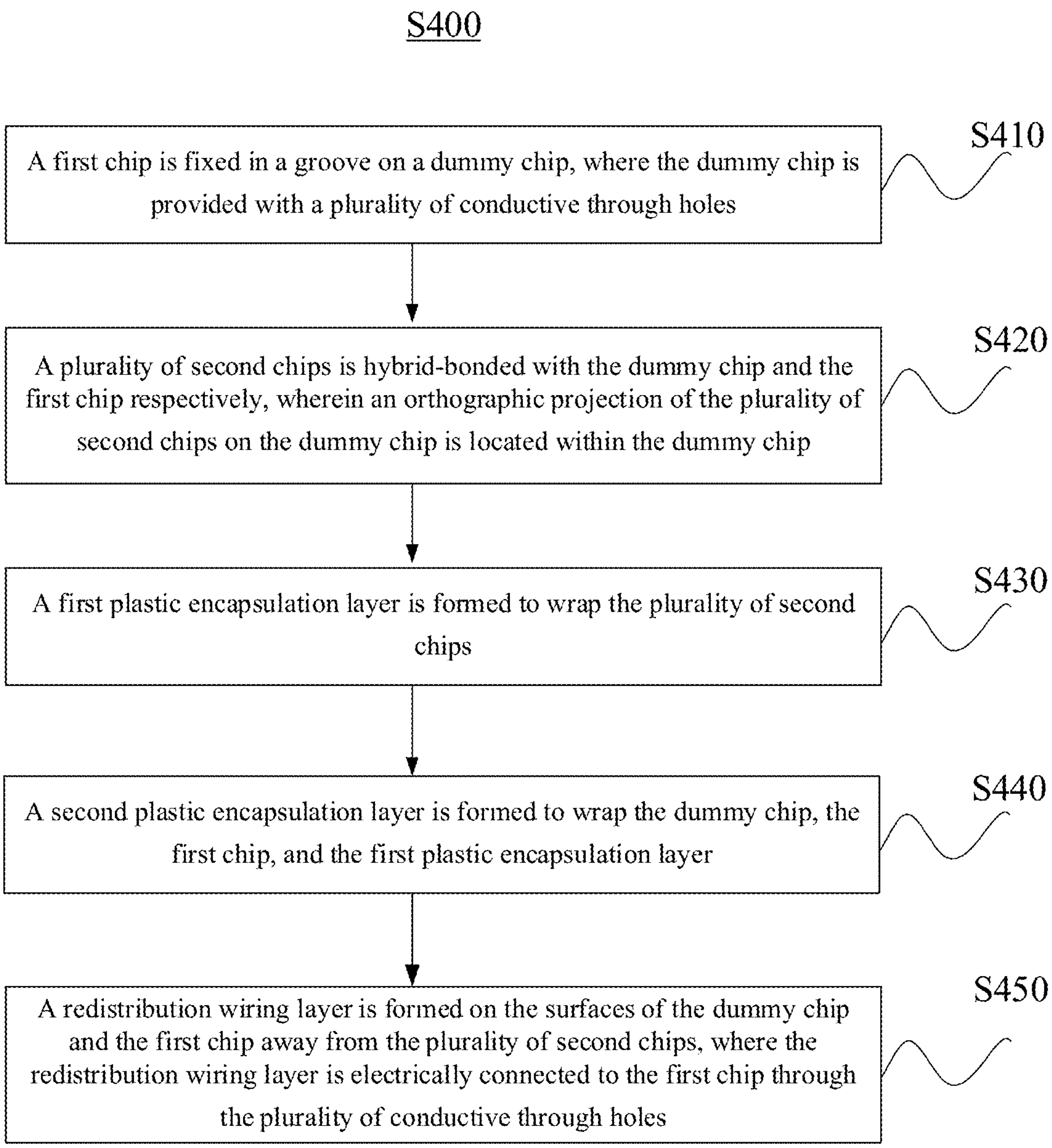
FIG. 34 illustrates an exemplary fan-out stacked chip packaging method according to various disclosed embodiments of the present disclosure.

Another embodiment of the present disclosure provides another fan-out stacked chip packaging method S400. As shown in FIG. 34, the method S400 may include S410 to S460.

In S410, a first chip may be fixed in a groove on a dummy chip. The dummy chip may be provided with a plurality of conductive through holes.

Figure 35:
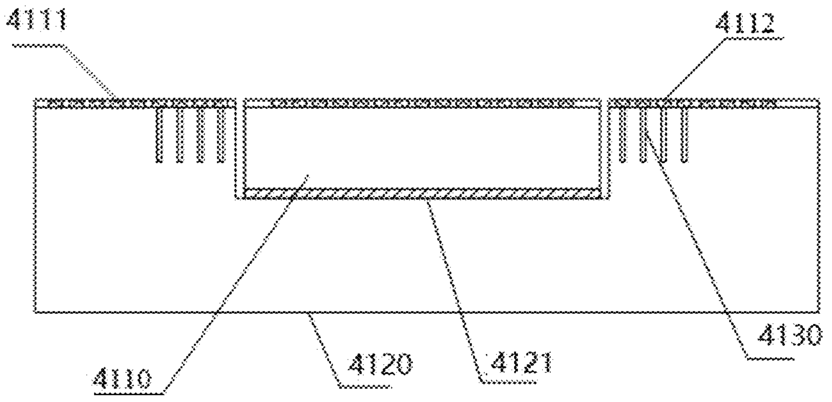
FIG. 35 to FIG. 44 illustrate structures corresponding to certain stages of a fan-out stacked chip packaging method according to various disclosed embodiments of the present disclosure.

Specifically, as shown in FIG. 35, a back side of the first chip 4110 may be fixed in the groove on the dummy chip 4120 by adhesive 4121. The surface of the first chip 4110 may flush with the surface of the dummy chip 4120, that is, a front surface of the first chip 4110 may flush with the surface of the dummy chip 4120. By making the surface of the first chip 4110 flush with the surface of the dummy chip 4120, they may be able to be better hybrid-bonded with a plurality of second chips 4140. The dummy chip 4120 may expand a chip functional area of the first chip 4110. The front surface of the dummy chip 4120 may be provided with the plurality of conductive through holes 4130, and the plurality of conductive through holes 4130 may be distributed at equal intervals. The plurality of conductive through holes may be through-silicon vias. Through-silicon via technology may be used to realize the vertical electrical interconnection of through-silicon vias, which may reduce the package height.

In S420, the plurality of second chips may be hybrid-bonded with the first chip and the dummy chip respectively. An orthographic projection of the plurality of second chips on the dummy chip may be located inside the dummy chip.

Figure 36:
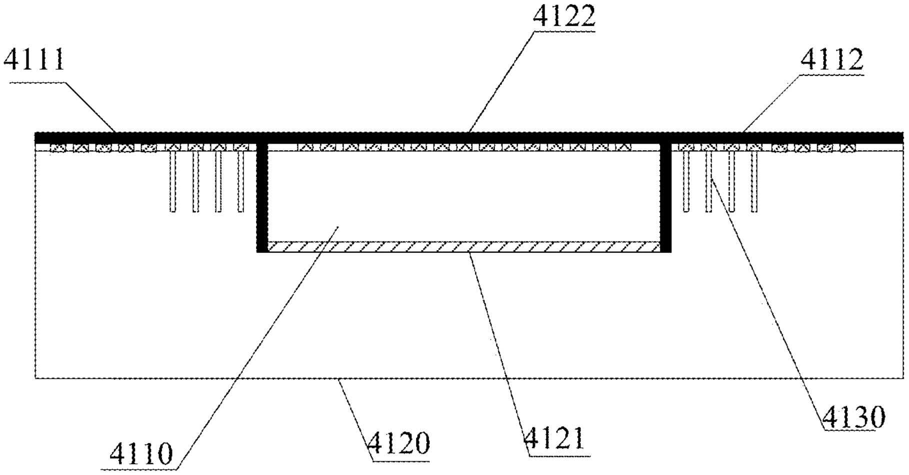
Figure 37:
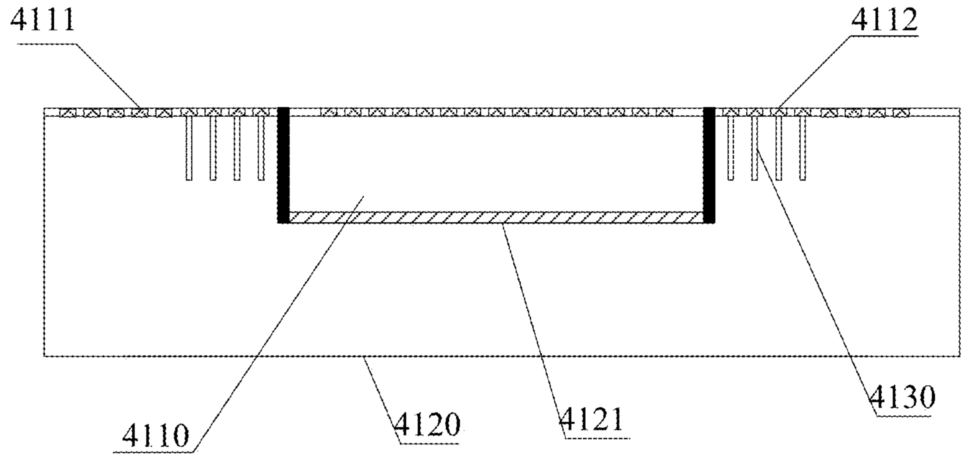
Figure 38:
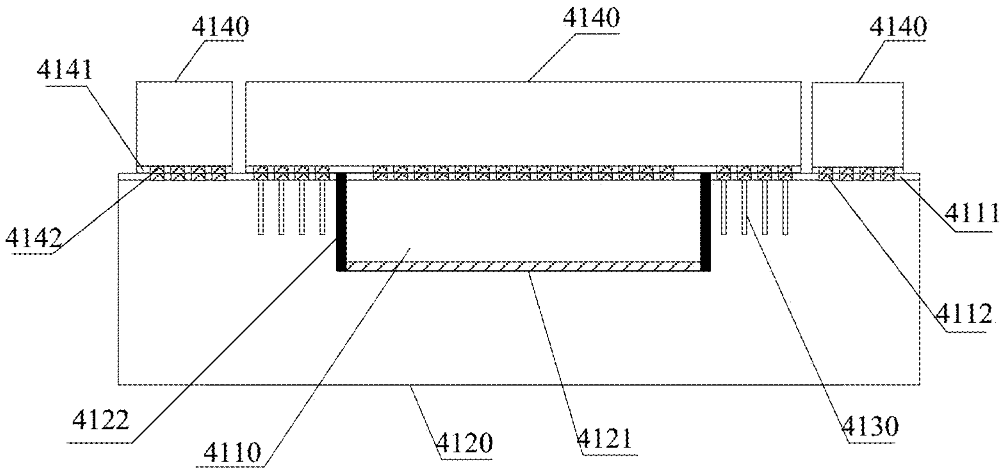

As shown in FIG. 35, FIG. 36, and FIG. 37, a surface of the first chip 4110 and a surface of the dummy chip 4120 facing the plurality of second chips 4140 may be provided with a first passivation layer 4111 and first metal pads 4112. Each first metal pad 4112 on the first chip 4110 may correspond to one of the plurality of conductive through holes 4130 of the first chip 110, and each first metal pad 4112 on the dummy chip 4120 may correspond to one of the plurality of conductive through holes 4130 of the dummy chip 4120. As shown in FIG. 38, surfaces of the plurality of second chips 4140 facing the first chip 4110 may be provided with a second passivation layer 4141 and second metal pads 4142.

A number of the plurality of second chips 4140 may be two, three, four, or more. Types of the plurality of second chips 4140 may be same or different. The present disclosure has no limit on the number and types of the plurality of second chips 140, which may be selected according to actual needs.

In one embodiment, the plurality of conductive through holes 4130 may be disposed at positions of the dummy chip 4120 corresponding to some of the plurality of second chips 4140 in a center area, and may be not disposed at positions of the dummy chip 4120 corresponding to the plurality of second chips 4140 in the dummy chip 4120 in an edge area. The plurality of second chips 4140 located in the edge region may be electrically connected to the plurality of second chips 4140 located in the central region through the first metal pads 4112 on the surface of the dummy chip 120, and then signals of the plurality of second chips 4140 and the first chip 4110 may be led out through the plurality of conductive through holes 4130 on the dummy chip 120. In some other embodiments, the plurality of conductive through holes 4130 may be disposed at positions of the dummy chip 4120 corresponding to all of the plurality of second chips 4140, and the plurality of second chips 4140 may be electrically connected through the first metal pads 4112 on the surface of the dummy chip 4120, and then signals of the plurality of second chips 4140 and the first chip 4110 may be led out through the plurality of conductive through holes 4130 on the dummy chip 4120. That is, the plurality of conductive through holes 4130 may be disposed at positions of the dummy chip 4120 corresponding to at least some of the plurality of second chips 4140.

In one embodiment, as shown in FIG. 38, the plurality of second chips 4140 may include three laterally connected second chips 4140, that is, a second chip 4140 located in the central region and the two second chips 4140 respectively located in the edge region. The plurality of second chips may be laterally connected to further reduce the package height. A size of the second chip 4140 located in the central area may be larger than the sizes of the first chip 4110 and the two second chips 4140 in the edge area. The plurality of conductive through holes 4130 may be disposed in an area of the dummy chip 4120 corresponding to the second chip 140 in the central area, and may be not disposed in an area of the dummy chip 4120 corresponding to the two second chips 4140 in the edge area.

In one embodiment, before hybrid-bonding the plurality of second chips with the first chip and the dummy chip, the method may further include: forming an adhesive on the surfaces of the dummy chip and the first chip, where a portion of the adhesive may be filled into a gap between the dummy chip and the first chip; and then removing the adhesive on the surfaces of the dummy chip and the first chip to expose the first passivation layer and the first metal pads of the dummy chip and the first chip.

Specifically, as shown in FIG. 36, the adhesive 4122 may be formed on the surfaces of the dummy chip 4120 and the first chip 4110, and a portion of the adhesive 4122 may be filled into the gap between the dummy chip 4120 and the first chip 4110, such that the first chip 4110 may be completely fixed in the groove of the dummy chip 4120.

Specifically, the surface of the adhesive 4122 may be ground and polished to remove the adhesive 4122 on the surfaces of the dummy chip 4120 and the first chip 4110, as shown in FIG. 37, to expose the first passivation layer 4111 and the first metal pads 4112 of the dummy chip 4120 and the first chip 4110. In some other embodiments, other methods may also be used to remove the adhesive 4122, which is not specifically limited in the present disclosure. The plurality of second chips may be hybrid-bonded with the dummy chip and the first chip respectively by following processes.

First, as shown in FIG. 38, the first passivation layer 4111 of the first chip 4110 and the dummy chip 4120 may be bonded with the second passivation layer 4141 of the plurality of second chips 4140. In one embodiment, the first passivation layer 4111 and the second passivation layer 4141 may be made of a material including a silicon dioxide layer, a silicon nitride layer, or other materials that play a passivation role, which is not limited in the present disclosure. Specifically, the first passivation layer 4111 and the second passivation layer 4141 may be aligned first. Then, the first passivation layer 4111 may be connected to the second passivation layer 4141 through high-temperature pressure bonding.

Subsequently, the first metal pads 4112 of the first chip 4110 and the dummy chip 4120 and the second metal pads 4142 of the plurality of second chips 4140 may be bonded. In one embodiment, the first metal pads 4112 and the second metal pads 4142 may be made of a material including metal copper (that is, copper pads), or other metal materials, which are not specifically limited in this embodiment. Specifically, the first metal pads 4112 may be aligned with the second metal pads 4142, and the connection may be realized through high-temperature compression and thermal expansion of copper.

The plurality of second chips may be respectively bonded with the first chip and the dummy chip at the wafer level, which may realize bonding with a pitch of less than 1 μm and realize high-density interconnection.

As shown in FIG. 38, the orthographic projection of the plurality of second chips 140 on the dummy chip 120 may be located within the dummy chip 120. That is, the total size of the plurality of second chips 140 may be smaller than the size of the dummy chip 120.

In S430, a first plastic encapsulation layer may be formed to wrap the plurality of second chips.

Figure 39:
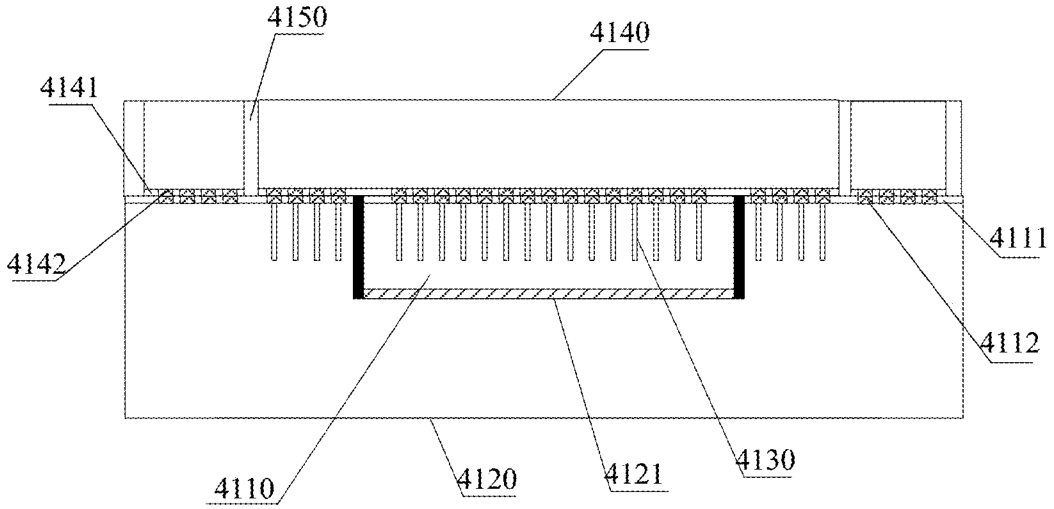

Specifically, as shown in FIG. 39, the sizes of the plurality of second chips 4140 may be smaller than the size of the dummy chip 4120, and the first plastic encapsulation layer 4150 may be formed on the plurality of second chips 4140 correspondingly. The first plastic encapsulation layer 4150 may protect the plurality of second chips 4140, and the size of the first plastic encapsulation layer 4150 wrapping the plurality of second chips 4140 may be consistent with the size of the dummy chip 4120. That is to say, the first plastic encapsulation layer 4150 may extend the plurality of second chips. The first plastic encapsulation layer 4150 may be formed by a method including film vacuum lamination or traditional plastic encapsulation process, which is not specifically limited in this embodiment.

In S440, a second plastic encapsulation layer may be formed to wrap the first chip, the dummy chip, and the first plastic encapsulation layer.

First, the surfaces of the bonded first chip and the dummy chip away from the plurality of second chips may be thinned to expose the plurality of conductive through holes of the first chip and the dummy chip.

Figure 40:
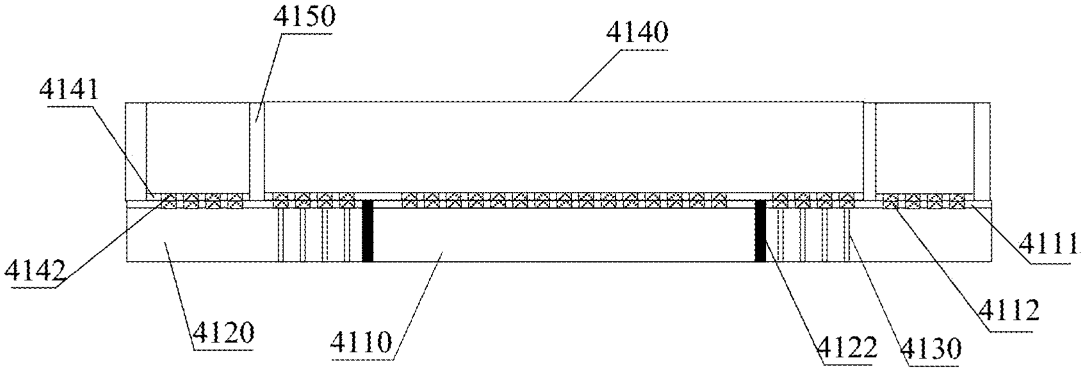

Specifically, as shown in FIG. 40, the backsides of the bonded first chip 4110 and the dummy chip 4120 may be thinned and then etched to expose the plurality of conductive through holes 4130 of the dummy chip 4120, that is, the through-silicon vias. A residual thickness of the first chip 4110 and the dummy chip 4120 after thinning may be less than 40 μm. By thinning the backsides of the first chip 4110 and the dummy chip 4120, the plurality of conductive through holes 4130 may be exposed for electrical connection, further reducing the package height. In one embodiment, the thickness of the first plastic encapsulation layer 4150 may meet the requirements and may be not thinned. In some other embodiments, the thickness of the first plastic encapsulation layer 4150 and the thickness of the plurality of second chips 4140 may be large, and it may be necessary to thin the first plastic encapsulation layer 4150.

Subsequently, the surfaces of the thinned first chip and the dummy chip facing away from the plurality of second chips may be fixed on a temporary carrier, and then the second plastic encapsulation layer may be formed.

Specifically, the above packaging process may be used to package a plurality of first chips 4110, a plurality of dummy chips 4120 and a plurality of second chips 4140 at the same time. After thinning, a plurality of chip assemblies may be cut to form a plurality of independent chip assemblies shown in FIG. 40 and then the following packaging process may be performed on each of the plurality of independent chip assemblies.

Figure 41:
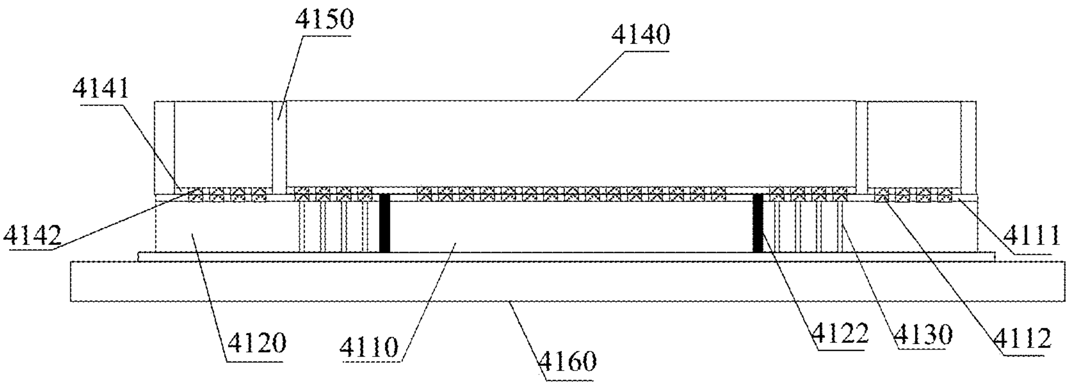
Figure 42:
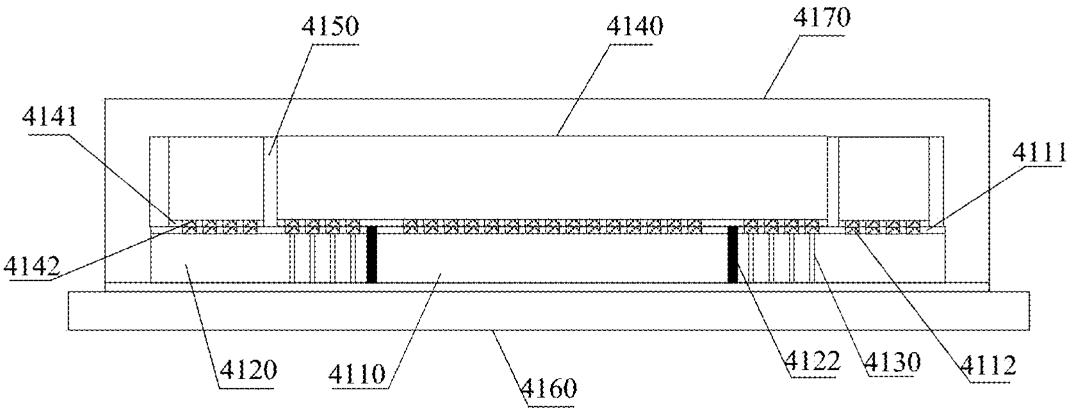

As shown in FIG. 41, the surfaces of the thinned first chip 4110 and dummy chip 4120 away from the plurality of second chips 4140 may be fixed on the temporary carrier 4160. That is, the backsides of the first chip 4110 and the dummy chip 4120 may be used as a contact surface. According to the final packaging size, they may be attached to the temporary carrier 4160 with temporary bonding glue one by one, and then packaged to form the second plastic encapsulation layer 4170 as shown in FIG. 42. The second plastic encapsulation layer 4170 may wrap the first chip 4110, the dummy chip 4120, and the plurality of second chips 4150. The second plastic encapsulation layer may be formed by a plastic encapsulation method including film vacuum lamination or traditional plastic sealing process, which is not specifically limited in the present disclosure.

In S450, a redistribution wiring layer may be formed on the surfaces of the dummy chip and the first chip away from the plurality of second chips, and the redistribution wiring layer may be electrically connected to the first chip through the plurality of conductive through holes.

In one embodiment, the redistribution wiring layer may be formed on the surfaces of the dummy chip and the first chip away from the plurality of second chips by: separating the first chip and the dummy chip from the temporary carrier; forming a dielectric layer on surfaces of the second plastic encapsulation layer, the dummy chip and the first chip away from the plurality of second chips; and patterning the dielectric layer and forming the redistribution wiring layer on the patterned dielectric layer.

Figure 43:
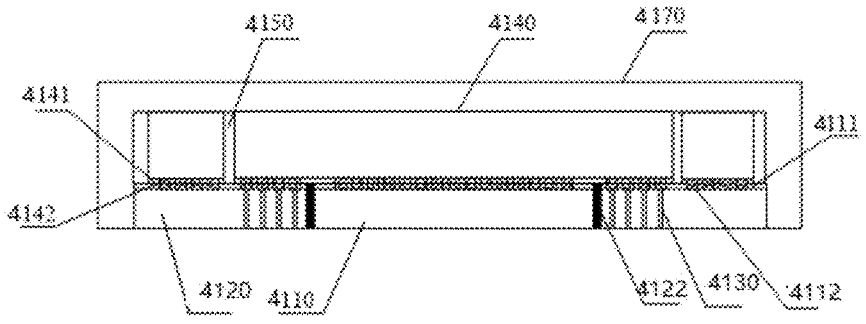

Specifically, as shown in FIG. 43, the first chip 4110 and the dummy chip 4120 may be separated from the temporary carrier 4160. That is, the temporary carrier 4160 may be removed. The first chip 4110 and the dummy chip 4120 may be separated from the temporary carrier 4160 by a separation method including thermal separation, laser separation, ultraviolet light separation, mechanical separation or other methods. These methods are currently commonly used temporary bonding separation methods. The separation method is not specifically limited in the present disclosure, and may be selected according to actual needs.

Figure 44:
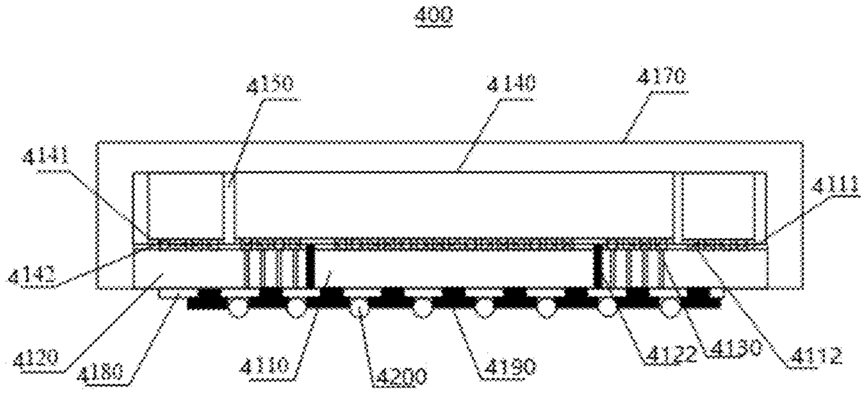

As shown in FIG. 44, the dielectric layer 4180 may be coated on the surfaces of the second plastic encapsulation layer 4170, the dummy chip 4120 and the first chip 4110 away from the plurality of second chips 4140. That is, the dielectric layer 4180 may be formed on the backside of the plastic encapsulation layer 4170, the thinned first chip 4110 and the dummy chip 4120. The dielectric layer 4180 may be made of a material including polyimide (PI), polybenzoxazole (PBO), etc., and may be formed by a coating method including wafer spin coating, which are not specifically limited in the present disclosure.

As shown in FIG. 44, the dielectric layer 4180 may be patterned by a photolithography process, and the redistribution wiring layer 4190 may be formed on the patterned dielectric layer 4180. The redistribution wiring layer 4190 may be electrically connected to the first chip 4110 through the plurality of conductive through holes 4130. The redistribution wiring layer 4190 may be formed by a method including electroplating, sputtering, thermal evaporation, plasma enhanced chemical vapor deposition, low pressure chemical vapor deposition, atmospheric pressure chemical vapor deposition, or electron cyclotron resonance chemical vapor deposition, etc., which is not specifically limited in the present disclosure. The redistribution wiring layer 4190 may be made of a material including metal titanium or metal copper, which is not limited in the present disclosure.

Subsequently, the redistribution wiring layer may be patterned, and solder balls may be formed on the patterned redistribution wiring layer.

Specifically, as shown in FIG. 44, the redistribution wiring layer 4190 may be patterned by a photolithography process, and ball planting may be performed on the patterned redistribution wiring layer 4190 to form a plurality of solder balls 4200. Electrically connection to the outside world may be realized through the plurality of solder balls 4200.

In the fan-out stacked chip packaging method provided by the present disclosure, the dummy chip and the first plastic encapsulation layer may be used to expand the first chip and the plurality of second chips through the wafer expanding technology, to realize bridge connection of the signals of the plurality of chips. The plurality of second chips may be hybrid-bonded to the dummy chip and the first chip respectively, through wafer expansion technology, and then the wafer-level hybrid bonding may be performed to achieve high-density interconnection while improving production efficiency. The dummy chip may be used to realize the lateral connection of the plurality of second chips, further reducing the packaging height. Also, conductive through hole technology and fan-out rewiring technology may be used to replace existing substrate interconnection, to reduce package size. Further, since the first chip and the plurality of second chips may be directly bonded through wafer bonding, the thickness after bonding may be the same as that of the chip body, which minimizes the package height and achieves ultra-thinning multilayer high-density stacked packaging.

Another embodiment of the present disclosure also provides another fan-out stacked chip packaging structure S400. As shown in FIG. 12, in one embodiment, the fan-out stacked chip packaging structure 400 may include a dummy chip 4120, a first chip 4110, a plurality of second chips 4140, a hybrid bonding structure (not shown in the figure), a first plastic encapsulation layer 4160, a plastic encapsulation layer 4170, and a redistribution wiring layer 4190.

The dummy chip 4120 may be provided with a groove, and the first chip 4110 may be disposed in the groove. The dummy chip 4120 may be provided with a plurality of conductive through holes 4130, and the plurality of conductive through holes 4130 may be through-silicon vias. The through-silicon vias may be used to realize the vertical electrical interconnection, which reduces the package height.

The plurality of second chips 4140 may be stacked on the first chip 4110 and the dummy chip 4120. The plurality of second chips 4140 may be connected to the dummy chip 4120 and the first chip 4110 by hybrid bonding respectively. An orthographic projection of the plurality of second chips on the dummy chip 4120 may be located within the dummy chip 4120. That is, the total size of the plurality of second chips 4140 may be smaller than the size of the dummy chip 4120. The dummy chip 4120 may be used to expand the chip function area of the first chip, to improve the production efficiency.

The first plastic encapsulation layer 4160 may wrap the plurality of second chips 4140, to protect the plurality of second chips 4140. Correspondingly, the size of the first plastic encapsulation layer 4160 wrapping the plurality of second chips 4140 may be consistent with the size of the dummy chip 4120, that is to say, the first plastic encapsulation layer 4160 may expand the plurality of second chips.

The second plastic encapsulation layer 4170 may wrap the first chip 4110, the dummy chip 4120 and the first plastic encapsulation layer 4160 to protect the first chip 4110, the dummy chip 4120 and the first plastic encapsulation layer 4160.

The redistribution wiring layer 4190 may be disposed on the surfaces of the dummy chip 4120 and the first chip 4110 away from the plurality of second chips 4140.

In one embodiment shown in FIG. 44, the hybrid bonding structure may include a first passivation layer 4111 and first metal pads 4112 disposed on the surfaces of the first chip 4110 and the dummy chip 4120 facing the plurality of second chips 4140, and a second passivation layer 4141 and second metal pads 4142 on surfaces of the plurality of second chips 4140 facing the first chip 4110. The first passivation layer 4111 and the second passivation layer 4141 may be bonded and connected, and the first metal pads 4112 and the second metal pads 4142 may be bonded. The interconnection density of hybrid bonding may be high, and bonding with a spacing of less than 1 μm may be realized, which may improve production efficiency while achieving high-density interconnection.

In one embodiment shown in FIG. 44, the packaging structure 400 may further include a dielectric layer 4180 and solder balls 4200. The dielectric layer 4180 may be disposed on the surfaces of the second plastic encapsulation layer 4170, the dummy chip 4120 and the first chip 4110 away from the plurality of second chips 4140. The redistribution wiring layer 4190 may be disposed on the dielectric layer 4180 and the solder balls 4200 may be disposed on the redistribution wiring layer 4190. The solder balls 4200 may be electrically connected to the outside.

A number of the plurality of second chips 4140 may be two, three, four, or more. Types of the plurality of second chips 4140 may be same or different. The present disclosure has no limit on the number and types of the plurality of second chips 4140, which may be selected according to actual needs.

In one embodiment, the plurality of conductive through holes 4130 may be disposed at positions of the dummy chip 4120 corresponding to some of the plurality of second chips 4140 in a center area, and may be not disposed at positions of the dummy chip 4120 corresponding to the plurality of second chips 4140 in the dummy chip 4120 in an edge area. The plurality of second chips 4140 located in the edge region may be electrically connected to the plurality of second chips 4140 located in the central region through the first metal pads 4112 on the surface of the dummy chip 4120, and then signals of the plurality of second chips 4140 and the first chip 4110 may be led out through the plurality of conductive through holes 4130 on the dummy chip 4120 and the first chip 4110. In some other embodiments, the plurality of conductive through holes 4130 may be disposed at positions of the dummy chip 4120 corresponding to all of the plurality of second chips 4140, and the plurality of second chips 4140 may be electrically connected through the first metal pads 4112 on the surface of the dummy chip 4120, and then signals of the plurality of second chips 4140 and the first chip 4110 may be led out through the plurality of conductive through holes 130 on the dummy chip 4120 and the first chip 4110.

In one embodiment, as shown in FIG. 44, the plurality of second chips 4140 may include three laterally connected second chips 4140, that is, a second chip 4140 located in the central region and the two second chips 4140 respectively located in the edge region. The plurality of second chips may be laterally connected to further reduce the package height. A size of the second chip 4140 located in the central area may be larger than the sizes of the first chip 4110 and the two second chips 4140 in the edge area. The plurality of conductive through holes 4130 may be disposed in an area of the dummy chip 4120 corresponding to the second chip 4140 in the central area, and may be not disposed in an area of the dummy chip 4120 corresponding to the two second chips 4140 in the edge area.

In the fan-out stacked chip packaging structure provided by the present disclosure, the dummy chip and the first plastic encapsulation layer may be used to expand the first chip and the plurality of second chips through the wafer expanding technology, to realize bridge connection of the signals of the plurality of chips. The plurality of second chips may be hybrid-bonded to the dummy chip and the first chip respectively, through wafer expansion technology, and then the wafer-level hybrid bonding may be performed to achieve high-density interconnection while improving production efficiency. The dummy chip may be used to realize the lateral connection of the plurality of second chips, further reducing the packaging height. Also, conductive through hole technology and fan-out rewiring technology may be used to replace existing substrate interconnection, to reduce package size. Further, since the first chip and the plurality of second chips may be directly bonded through wafer bonding, the thickness after bonding may be the same as that of the chip body, which minimizes the package height and achieves ultra-thinning multilayer high-density stacked packaging.

Another embodiment of the present disclosure also provides another fan-out stacked chip packaging method S500. As shown in FIG. 44, the packaging method S500 may include S510 to S560.

In S510, a first chip may be fixed in a groove on a dummy chip.

Figure 45:
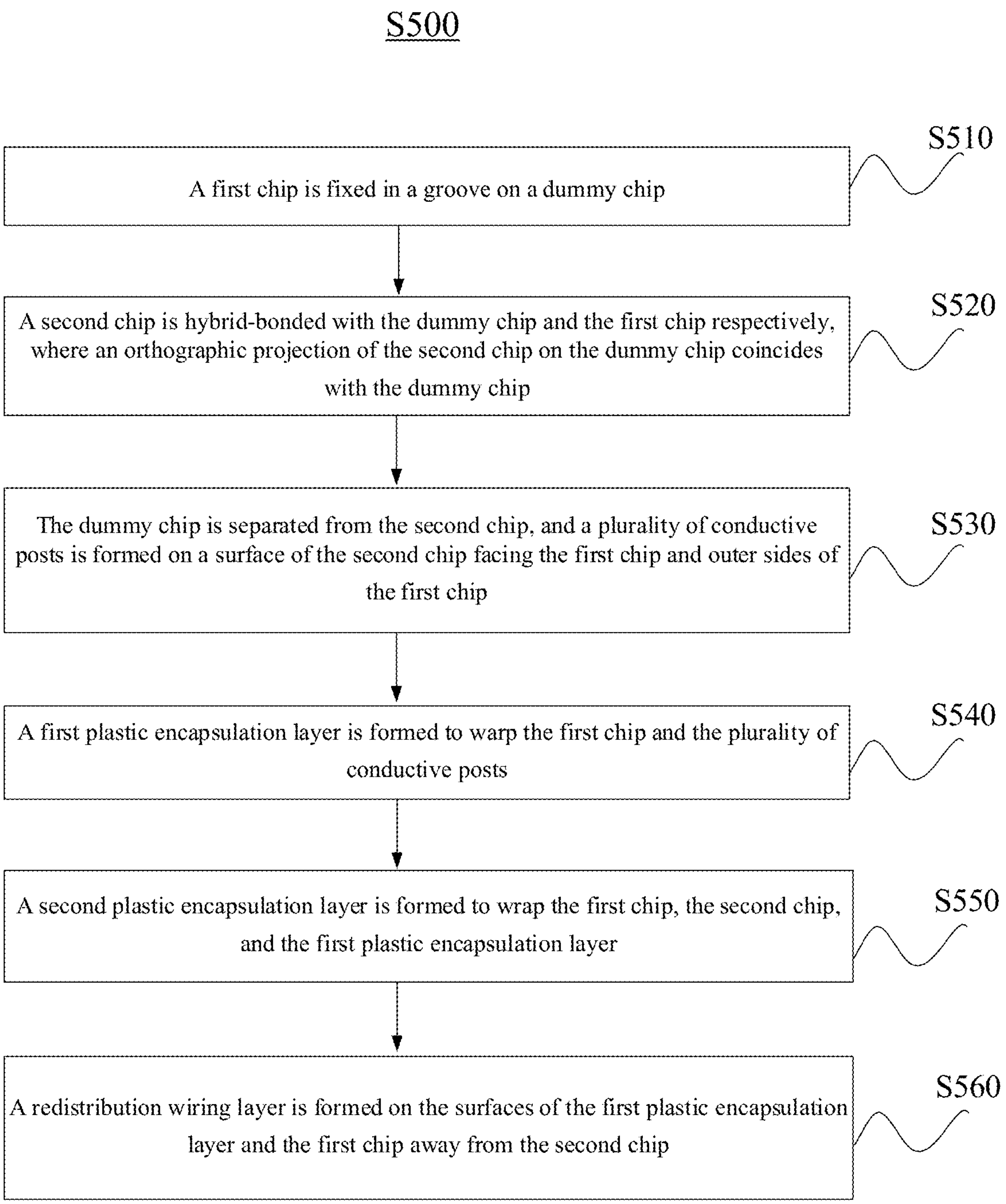
FIG. 45 illustrates an exemplary fan-out stacked chip packaging method according to various disclosed embodiments of the present disclosure.

Specifically, as shown in FIG. 45, a back side of the first chip 5110 may be fixed in the groove on the dummy chip 5120 by patch adhesive 5121, and a first surface of the first chip 5110 may protrude from a surface of the dummy chip 5120. That is, a front surface of the first chip 5110 may protrude from a surface of the dummy chip 5120

Specifically, as shown in FIG. 45, the first surface of the first chip 5110 may be provided with a first passivation layer 5111 and first metal pads 5112. That is, the front surface of the first chip 5110 may be provided with a first passivation layer 5111 and first metal pads 5112. In one embodiment, the first passivation layer 5111 may be a silicon dioxide layer, or be made of another material be able to play a passivation role, which is not limited by the present disclosure. In one embodiment, the first metal pads 5112 may be made a metal copper or another metal material, which is not limited in the present disclosure.

In S520, a second chip may be hybrid-bonded with the dummy chip and the first chip respectively. An orthographic projection of the second chip on the dummy chip may coincide with the dummy chip.

In one embodiment, before hybrid-bonding the second chip with the first chip and the dummy chip, the method may further include: forming an adhesive on the surfaces of the dummy chip and the first chip, where a portion of the adhesive may be filled into a gap between the dummy chip and the first chip; and then removing the adhesive on the surfaces of the dummy chip and the first chip to expose the first passivation layer and the first metal pads of the dummy chip and the first chip.

Figure 46:
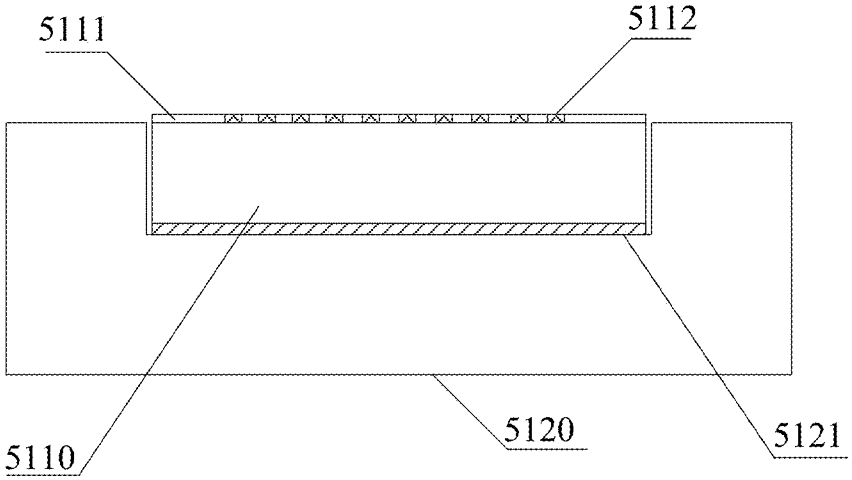
FIG. 46 to FIG. 60 illustrate structures corresponding to certain stages of a fan-out stacked chip packaging method according to various disclosed embodiments of the present disclosure.

Specifically, as shown in FIG. 46, the adhesive 5122 may be formed on the surfaces of the dummy chip 5120 and the first chip 5110, and a portion of the adhesive 5122 may be filled into the gap between the dummy chip 5120 and the first chip 5110, such that the first chip 5110 may be completely fixed in the groove of the dummy chip 5120. Since the first surface of the first chip 5110 protrudes from the surface of the dummy chip 5120, the adhesive glue 5122 on the dummy chip 5120 may be thicker than the adhesive 5122 on the first surface of the first chip 5110. When the first chip 5110 and the second chip 5140 are hybrid bonded, the second chip 5140 may be attached on the dummy chip 5120.

Figure 47:
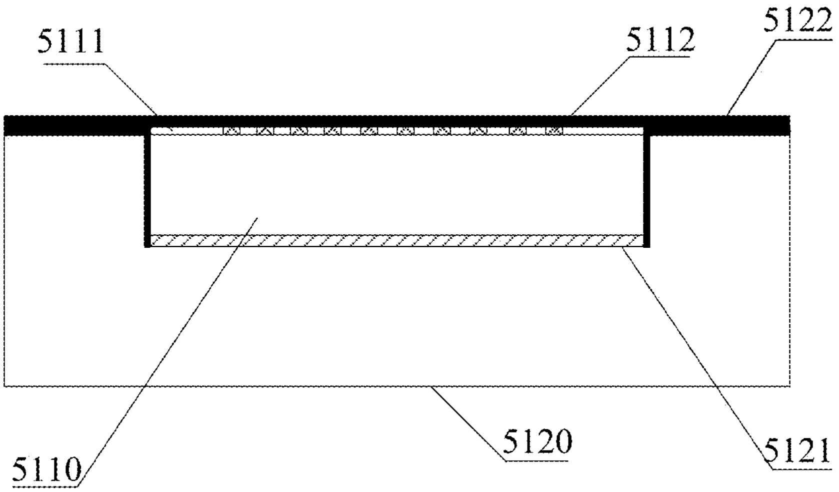

Specifically, the adhesive 5122 may be ground and polished on the first surface of the first chip 5110 to remove the adhesive 5122 on the first surface of the first chip 5110, as shown in FIG. 47. That is, the adhesive 5120 on the front surface of the first chip 5110 may be removed, and a portion of the adhesive 5120 on the surface of the dummy chip 5120 may be preserved, to expose the first passivation layer 5111 and the first metal pads 5112 of the first chip 5110. The portion of the remaining adhesive 5120 on the surface of the dummy chip 5120 may be used to fix the dummy chip 5120 on the second chip 5140.

Figure 48:
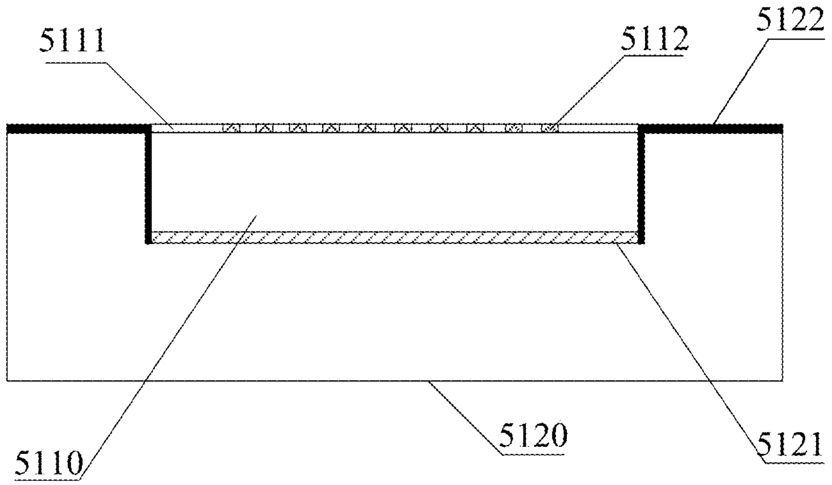

As shown in FIG. 48, a surface of the second chip 5140 facing the first chip 5110 may be provided with a second passivation layer 5141 and second metal pads 5142. In one embodiment, the second passivation layer 5141 may be a silicon dioxide layer or a silicon nitride layer, or be made of another material be able to play a passivation role, which is not limited by the present disclosure. In one embodiment, the second metal pads 5142 may be made a metal copper or another metal material, which is not limited in the present disclosure.

In one embodiment, the second chip may be hybrid-bonded with the dummy chip and the first chip respectively by following processes.

The first passivation layer of the first chip may be bonded with the second passivation layer of the second chip.

Specifically, as shown in FIG. 48, the first passivation layer 5111 of the first chip 5110 may be bonded with the second passivation layer 5141 of the second chip 5140. In one embodiment, the first passivation layer 5111 and the second passivation layer 5141 may be aligned first. Then, the first passivation layer 5111 may be connected to the second passivation layer 5141 through high-temperature pressure bonding.

Subsequently, the first metal pads of the first chip may be bonded with the second metal pads of the second chip.

Specifically, as shown in FIG. 48, the first metal pads 5112 of the first chip 5110 and the dummy chip 5120 and the second metal pads 5142 of the second chip 5140 may be bonded. In one embodiment, the first metal pads 5112 may be aligned with the second metal pads 5142, and the connection may be realized through high-temperature compression and thermal expansion of copper.

As shown in FIG. 48, the orthographic projection of the second chip 5140 on the dummy chip 5120 may coincide with the dummy chip 5120. That is, the size of the second chip 5140 may be consistent with the size of the dummy chip 5120. The dummy chip 5120 may be used to adjust the first chip 5110 and the second chip 5120 with two different sizes to have a same size. The wafer expanding technology may be used for wafer-level hybrid bonding, to achieve high-density interconnection and improve productivity.

In S530, the dummy chip may be separated from the second chip, and a plurality of conductive posts may be formed on a surface of the second chip facing the first chip and outer sides of the first chip.

Figure 49:
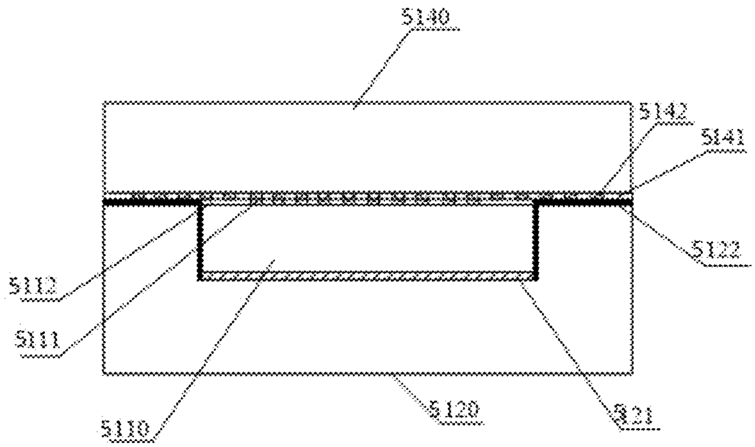

Specifically, as shown in FIG. 49, the backsides of the bonded first chip 5110 and the dummy chip 5120 may be thinned. A residual thickness of the first chip 110 and the dummy chip 120 after thinning may be less than 40 μm. By thinning the backsides of the first chip 110 and the dummy chip 120, the package height may be further reduced.

Figure 50:
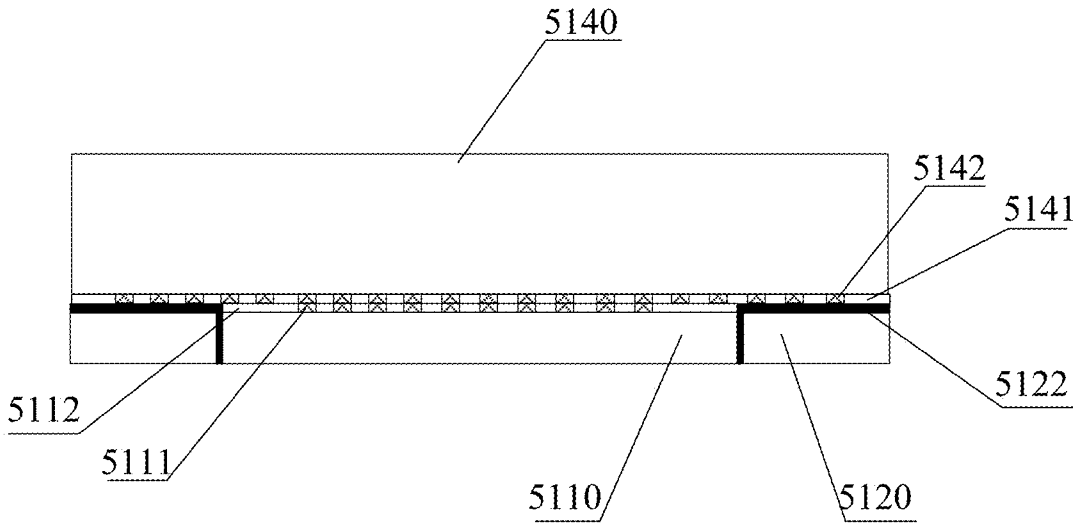
Figure 51:
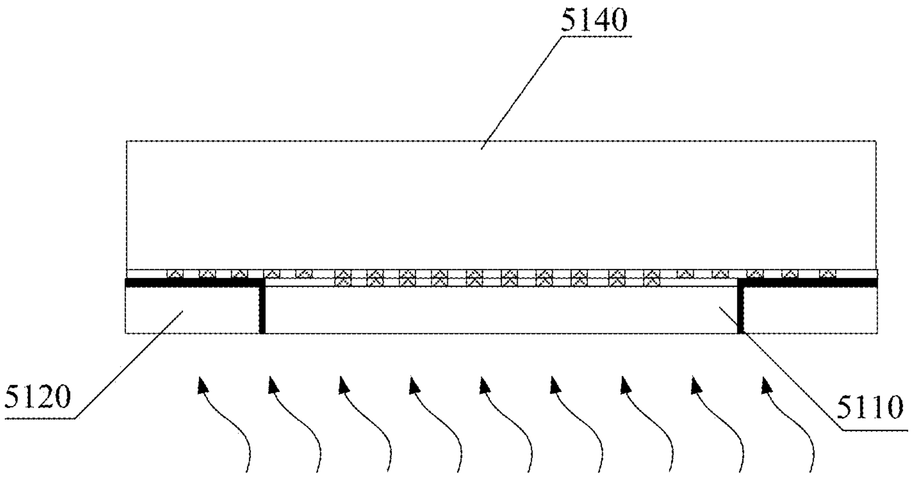

As shown in FIG. 50, the first chip 5110 and the dummy chip 5120 may be irradiated with laser or ultraviolet light, and the light wave may be determined according to the characteristics of the adhesive 5122. Under the action of light wave energy, the adhesive 5122 may lose its viscosity. Correspondingly, as shown in FIG. 51, the dummy chip 5120 may be detached from the second chip 5140, that is, the second chip 140 may be separated from the dummy 5120, leaving the hybrid bonded first chip 5110 and the second chip 5140. It should be noted that other methods may also be used to separate the second chip 5140 from the dummy 5120, which is not specifically limited in this embodiment.

Figure 52:
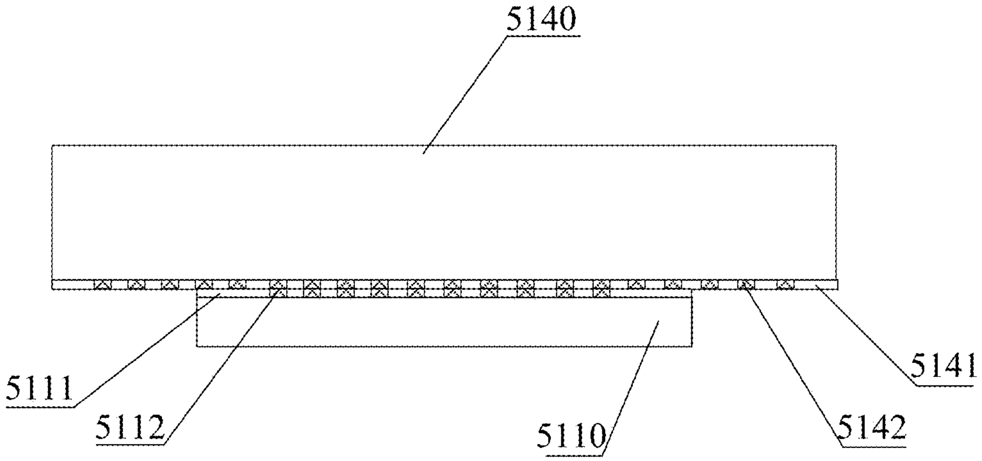

As shown in FIG. 52, after the second chip 5140 is separated from the dummy chip 5120, the plurality of conductive posts 5150 may be formed on the surface of the second chip 5140 facing the first chip 5110 and the outer surface of the first chip 5110 by electroplating or other processes. That is to say, the plurality of conductive posts 5150 may be disposed at the position of the dummy chip 120 before the second chip 5140 is separated from the dummy chip 5120. The plurality of conductive posts 5150 may be electroplated on the second metal pads 5142, corresponding to the second metal pads 5142. The plurality of conductive posts 150 may be electroplated according to actual needs. A portion of the signals of the second chip 5140 may be led out by using the plurality of conductive posts 5150. Compared with the substrate interconnection, the vertical electrical interconnection may be realized by using the plurality of conductive posts 150, which reduces the packaging height.

In one embodiment, the plurality of conductive posts 5150 may be metal copper bumps. In some other embodiments, the plurality of conductive posts 5150 may be made of other metal materials as required.

In S540, a first plastic encapsulation layer may be formed to warp the first chip and the plurality of conductive posts.

Figure 53:
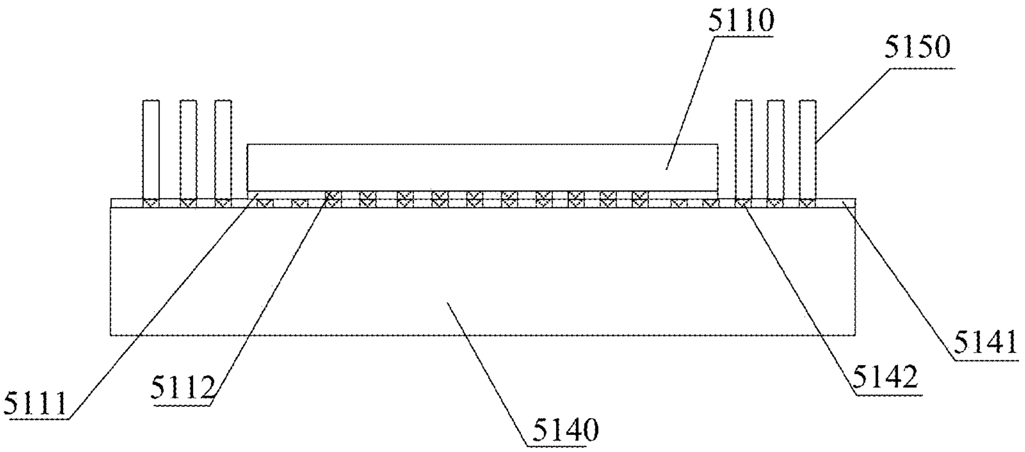

Specifically, as shown in FIG. 53, after forming the plurality of conductive posts 5150, the first plastic encapsulation layer 5160 may be formed on a side of the first chip 5110 away from the second chip 5140, to warp the first chip 5110 and the plurality of conductive posts 5150. The first plastic encapsulation layer 5160 may protect the first chip 5110 and the plurality of conductive posts 5150. The first plastic encapsulation layer 5160 may be formed by a plastic encapsulation method including film vacuum lamination or traditional plastic sealing process, which is not specifically limited in the present disclosure.

In S550, a second plastic encapsulation layer may be formed to wrap the first chip, the second chip, and the first plastic encapsulation layer.

A side of the first plastic encapsulation layer away from the second chip may be thinned, to expose the plurality of conductive posts, such that a second surface of the first plastic encapsulation layer is flush with the second surface of the first chip.

Figure 54:
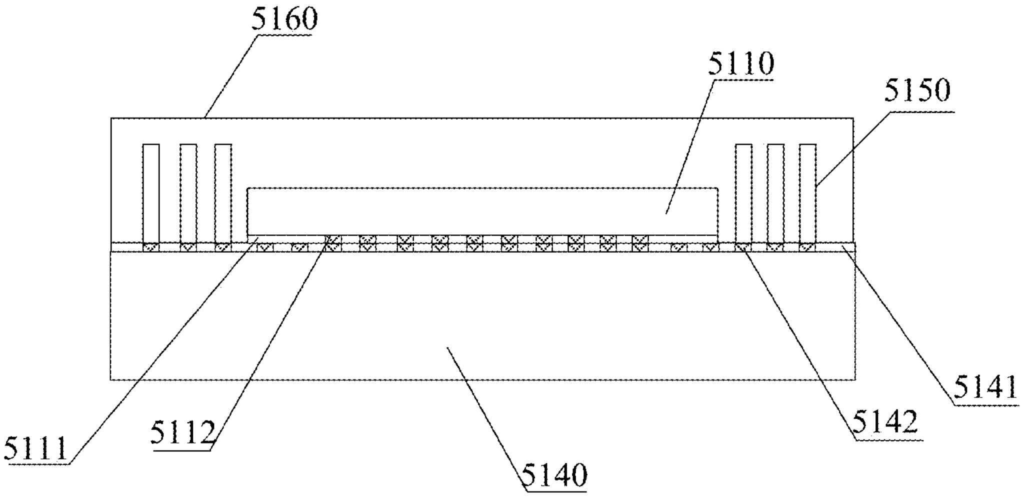

Specifically, as shown in FIG. 54, the side of the first plastic encapsulation layer 5160 away from the second chip 5140 may be thinned by polishing and chemical cleaning, to expose the plurality of conductive posts 5150, such that the second surface of the first plastic encapsulation layer 5160 is flush with the second surface of the first chip 5110. That is, a back surface of the first plastic encapsulation layer 5160 may be flush with a back surface of the thinned first chip 5110.

Subsequently, the second surfaces of the thinned first chip and the first plastic encapsulation layer may be fixed on a temporary carrier, and then the second plastic encapsulation layer may be formed.

Specifically, the above packaging process may be used to package a plurality of first chips 5110, a plurality of dummy chips 5120 and a plurality of second chips 5140 at the same time. After thinning, a plurality of chip assemblies may be cut to form a plurality of independent chip assemblies shown in FIG. 54 and then the following packaging process may be performed on each of the plurality of independent chip assemblies.

Figure 55:
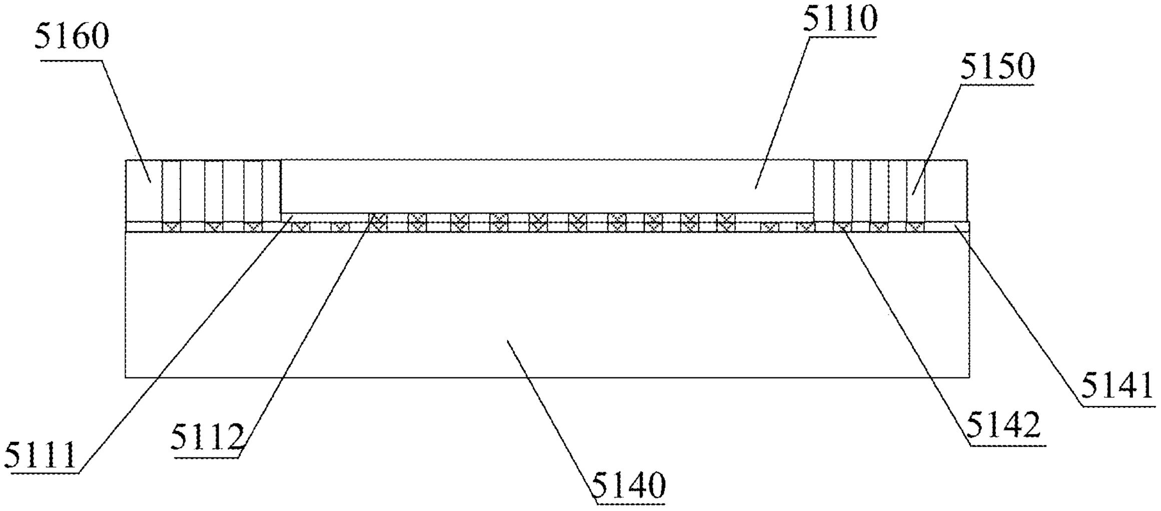
Figure 56:
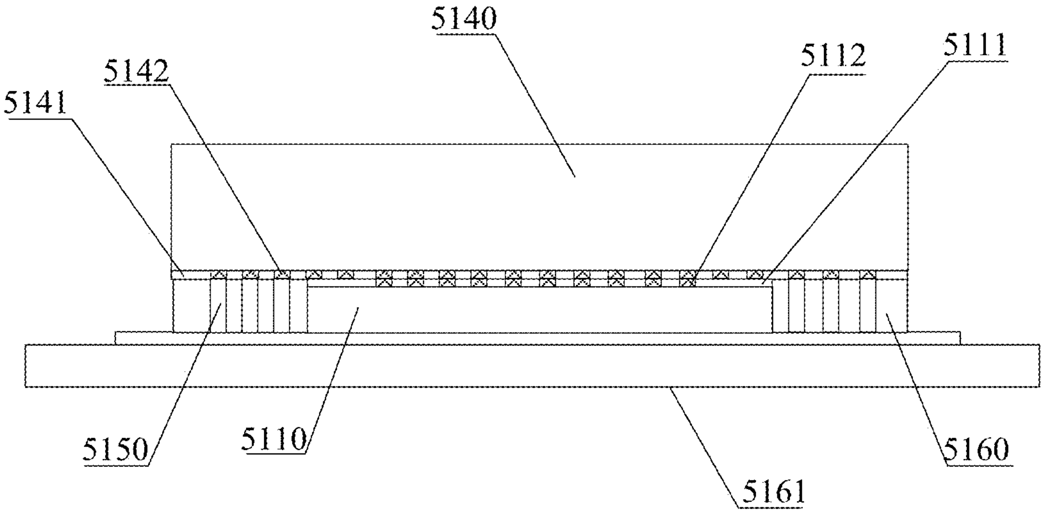

As shown in FIG. 55, the surfaces of the thinned first chip 110 and first plastic encapsulation layer 5160 away from the second chip 5140 may be fixed on the temporary carrier 5161. That is, the backsides of the thinned first chip 5110 and first plastic encapsulation layer 5160 may be used as a contact surface. According to the final packaging size, they may be attached to the temporary carrier 5161 with temporary bonding glue one by one, and then packaged to form the second plastic encapsulation layer 5170 as shown in FIG. 56. The second plastic encapsulation layer 5170 may wrap the first chip 5110, the second chip 5140, and the first plastic encapsulation layer 5170. The second plastic encapsulation layer may be formed by a plastic encapsulation method including film vacuum lamination or traditional plastic sealing process, which is not specifically limited in the present disclosure.

In S560, a redistribution wiring layer may be formed on the surfaces of the first plastic encapsulation layer and the first chip away from the second chip, and the redistribution wiring layer may be electrically connected to the second chip through the plurality of conductive posts.

In one embodiment, the redistribution wiring layer may be formed on the surfaces of the first plastic encapsulation layer and the first chip away from the second chip by: separating the first chip and the first plastic encapsulation layer from the temporary carrier; forming a dielectric layer on the surfaces of the first chip and the first plastic encapsulation layer away from the second chip; and patterning the dielectric layer and forming the redistribution wiring layer on the patterned dielectric layer.

Figure 57:
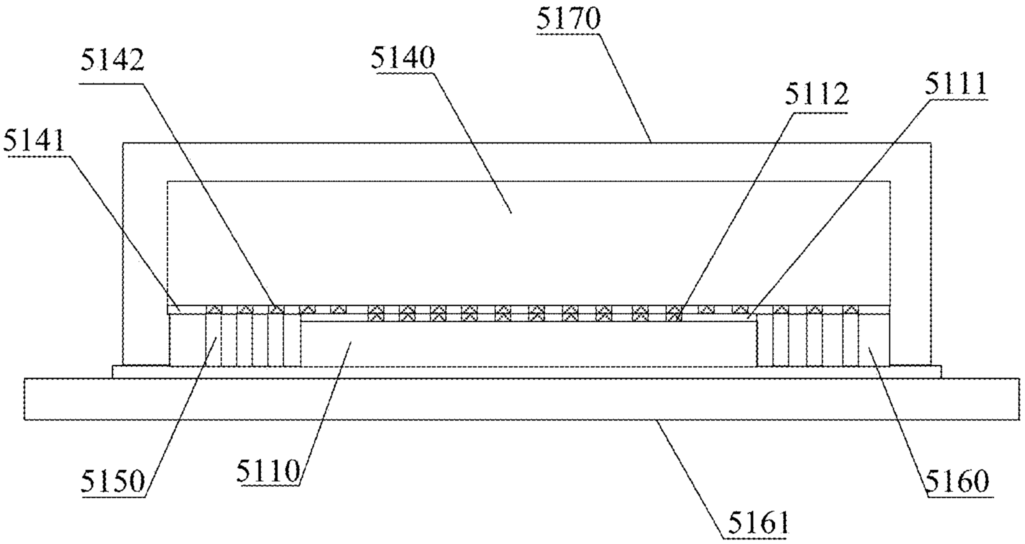

Specifically, as shown in FIG. 57, the first chip 5110 and the first plastic encapsulation layer 5160 may be separated from the temporary carrier 5161. That is, the temporary carrier 5161 may be removed. The first chip 5110 and the first plastic encapsulation layer 5160 may be separated from the temporary carrier 5161 by a separation method including thermal separation, laser separation, ultraviolet light separation, mechanical separation or other methods. These methods are currently commonly used temporary bonding separation methods. The separation method is not specifically limited in the present disclosure, and may be selected according to actual needs.

Figure 58:
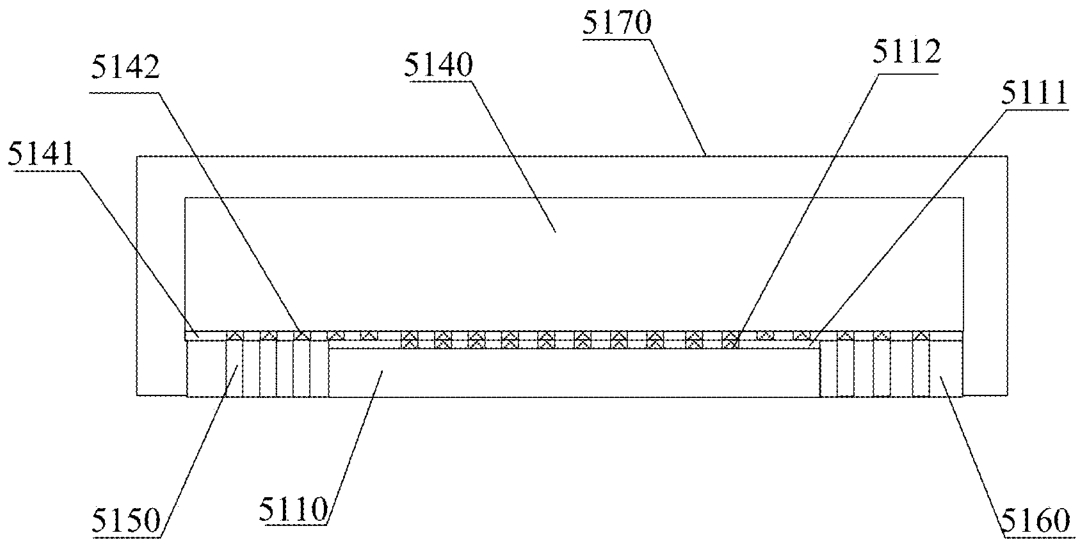

As shown in FIG. 58, the dielectric layer 5180 may be coated on the surfaces of the first chip 5110 and the first plastic encapsulation layer 5160 away from the second chip 5120. The dielectric layer 5180 may be made of a material including polyimide (PI), polybenzoxazole (PBO), etc., and may be formed by a coating method including wafer spin coating, which are not specifically limited in the present disclosure.

As shown in FIG. 58, the dielectric layer 5180 may be patterned by a photolithography process, and the redistribution wiring layer 5190 may be formed on the patterned dielectric layer 5180. The redistribution wiring layer 5190 may be electrically connected to the second 5120 through the plurality of conductive posts 5150. The redistribution wiring layer 5190 may be formed by a method including electroplating, sputtering, thermal evaporation, plasma enhanced chemical vapor deposition, low pressure chemical vapor deposition, atmospheric pressure chemical vapor deposition, or electron cyclotron resonance chemical vapor deposition, etc., which is not specifically limited in the present disclosure. The redistribution wiring layer 5190 may be made of a material including metal titanium or metal copper, which is not limited in the present disclosure.

Subsequently, the redistribution wiring layer may be patterned, and solder balls may be formed on the patterned redistribution wiring layer.

Figure 59:
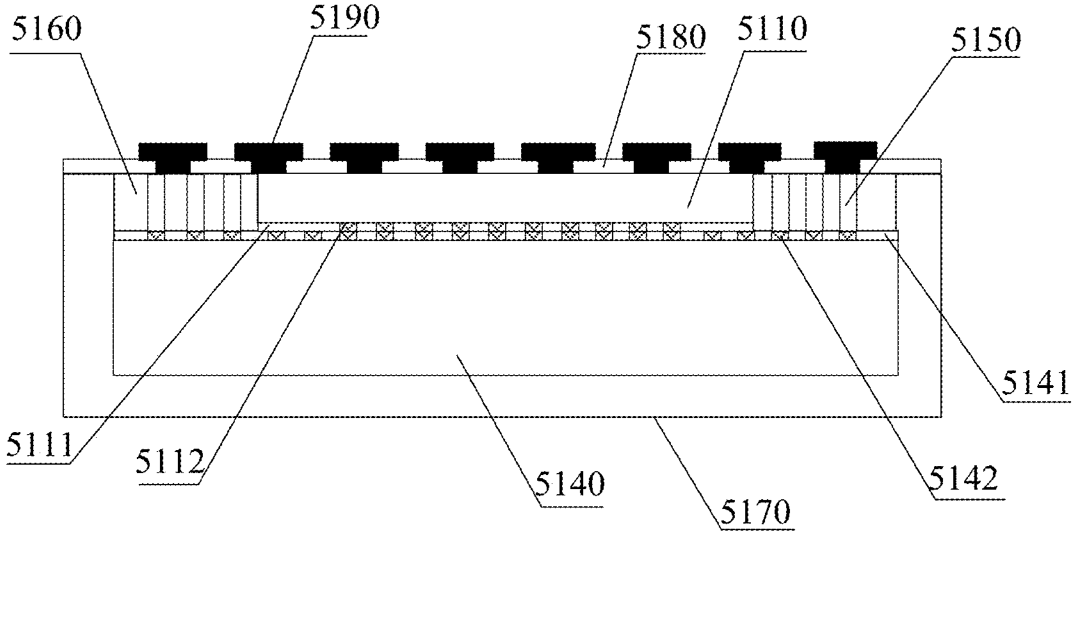

Specifically, as shown in FIG. 59, the redistribution wiring layer 5190 may be patterned by a photolithography process, and ball planting may be performed on the patterned redistribution wiring layer 5190 to form a plurality of solder balls 5200. Electrically connection to the outside world may be realized through the plurality of solder balls 5200.

In the fan-out stacked chip packaging method provided by the present disclosure, the first chip may be fixed in the groove of the dummy chip. The dummy chip may be used to adjust the first chip and the second chip of two different sizes to the same size. Then the first chip may be hybrid bonded with the second chip in the wafer level. The wafer-level hybrid bonding may be performed through wafer expansion technology to achieve high-density interconnection while improving production efficiency.

Also, the dummy chip may be separated from the second chip, and the plurality of conductive posts may be formed on the surface of the second chip facing the first chip and on the outer surface of the first chip. A portion of the signals of the second chip may be led out through the plurality of conductive posts. The redistribution layer may be formed on the surfaces of the first chip and the first plastic packaging layer away from the second chip. The traditional substrate interconnection may be replaced by conductive posts and fan-out redistribution layers, reducing the package size.

Further, since direct wafer bonding is adopted between the first chip and the second chip, the thickness after bonding may be the same as that of the chip body, which reduces the packaging height to the greatest extent and realizes ultra-thin multi-layer high-density stack packaging.

Figure 60:
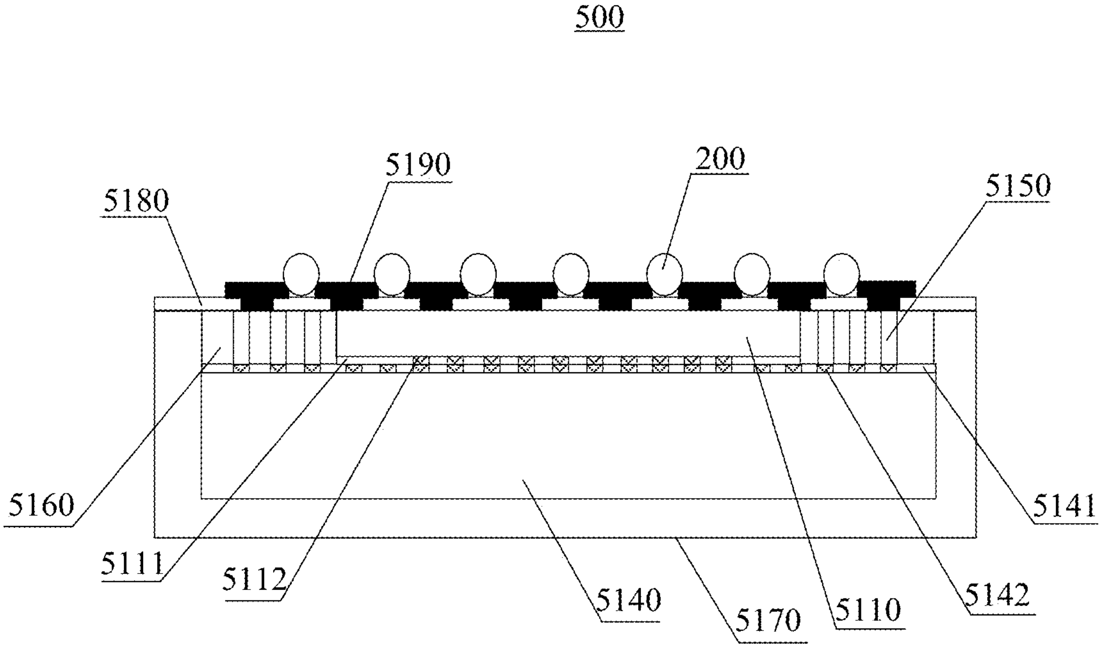

Another embodiment of the present disclosure also provides another fan-out stacked chip packaging structure 500. As shown in FIG. 60, in one embodiment, the fan-out stacked chip packaging structure 500 may include a first chip 110, a second chip 5140, a plurality of conductive posts 5150, a hybrid bonding structure (not shown in the figure), a first plastic encapsulation layer 5160, a plastic encapsulation layer 5170, and a redistribution wiring layer 5190.

The second chip 5140 may be stacked on the first chip 5110 through the hybrid bonding structure.

The plurality of conductive posts 5150 may be disposed on a side of the second chip 5140 facing the first chip 5110 and on the outer surface of the first chip 5110.

The first plastic encapsulation layer 5160 may wrap the first chip 5110 and the plurality of conductive posts 5150, to protect the first chip 5110 and the plurality of conductive posts 5150.

The second plastic encapsulation layer 5170 may wrap the first chip 5110, the second chip 5140 and the first plastic encapsulation layer 5160 to protect the first chip 5110, the second chip 5140 and the first plastic encapsulation layer 4160.

The redistribution wiring layer 5190 may be disposed on the surfaces of the first chip 110 and the first plastic encapsulation layer 5160 away from the second chip 5140, and may be electrically connected to the second chip 5140 through the plurality of conductive posts 5150.

In one embodiment shown in FIG. 60, the hybrid bonding structure may include a first passivation layer 5111 and first metal pads 5112 disposed on the surfaces of the first chip 5110 facing the second chip 5140, and a second passivation layer 5151 and second metal pads 5152 on surfaces of the second chip 5140 facing the first chip 5110. The first passivation layer 5111 and the second passivation layer 5151 may be bonded and connected, and the first metal pads 5112 and the second metal pads 5152 may be bonded.

In one embodiment shown in FIG. 60, the packaging structure 500 may further include a dielectric layer 5180 and solder balls 5200. The dielectric layer 5180 may be disposed on the surfaces of the second plastic encapsulation layer 5170 and the first chip 5110 away from the second chip 5140. The redistribution wiring layer 5190 may be disposed on the dielectric layer 5180 and the solder balls 5200 may be disposed on the redistribution wiring layer 5190. The solder balls 5200 may be electrically connected to the outside.

In one embodiment, as shown in FIG. 60, the plurality of conductive posts 150 may correspond to the second metal pads 5142. That is, the plurality of conductive posts 5150 may be electroplated on the second metal pads 5142. The electroplating of the plurality of conductive posts 5150 may be performed according to actual needs. A portion of the signals of the second chip 5140 may be led out through the plurality of conductive posts 5150. Compared with the substrate interconnection, the vertical electrical interconnection may be realized by using the plurality of conductive posts 150, which reduces the packaging height.

In one embodiment, both the first passivation layer 5111 and the second passivation layer 5141 may be silicon dioxide layers or silicon nitride layers. In some other embodiments, the first passivation layer 5111 and the second passivation layer 5141 may be made of other materials that can play a passivation role. The first metal pads 112 and the second metal pads 142 may be made of metal copper, or other metal materials, which are not specifically limited in this embodiment.

The dielectric layer 5180 may be made of a material including polyimide (PI), polybenzoxazole (PBO), etc., and the coating method may be usually wafer spin coating, which is not specifically limited in this embodiment. The redistribution layer 5190 may be made of metal titanium, metal copper, or other metal materials, which are not specifically limited in this embodiment.

In the fan-out stacked chip packaging structure provided by the present disclosure, the second chip may be connected to the first chip through the hybrid bonding structure, which realizes high-density interconnection while improving production efficiency and reducing the packaging height to the greatest extent. The plurality of conductive posts may be arranged on the side of the second chip facing the first chip and on the outer surface of the first chip. A portion of the signals of the second chip may be led out through the plurality of conductive posts. The redistribution wiring layer may be disposed on the surfaces of the first chip and the first plastic encapsulation layer away from the second chip. Compared with the substrate interconnection, the vertical electrical interconnection may be realized by using the plurality of conductive posts, which reduces the packaging height. High-density and ultra-thin packaging may be realized.

Figure 61:
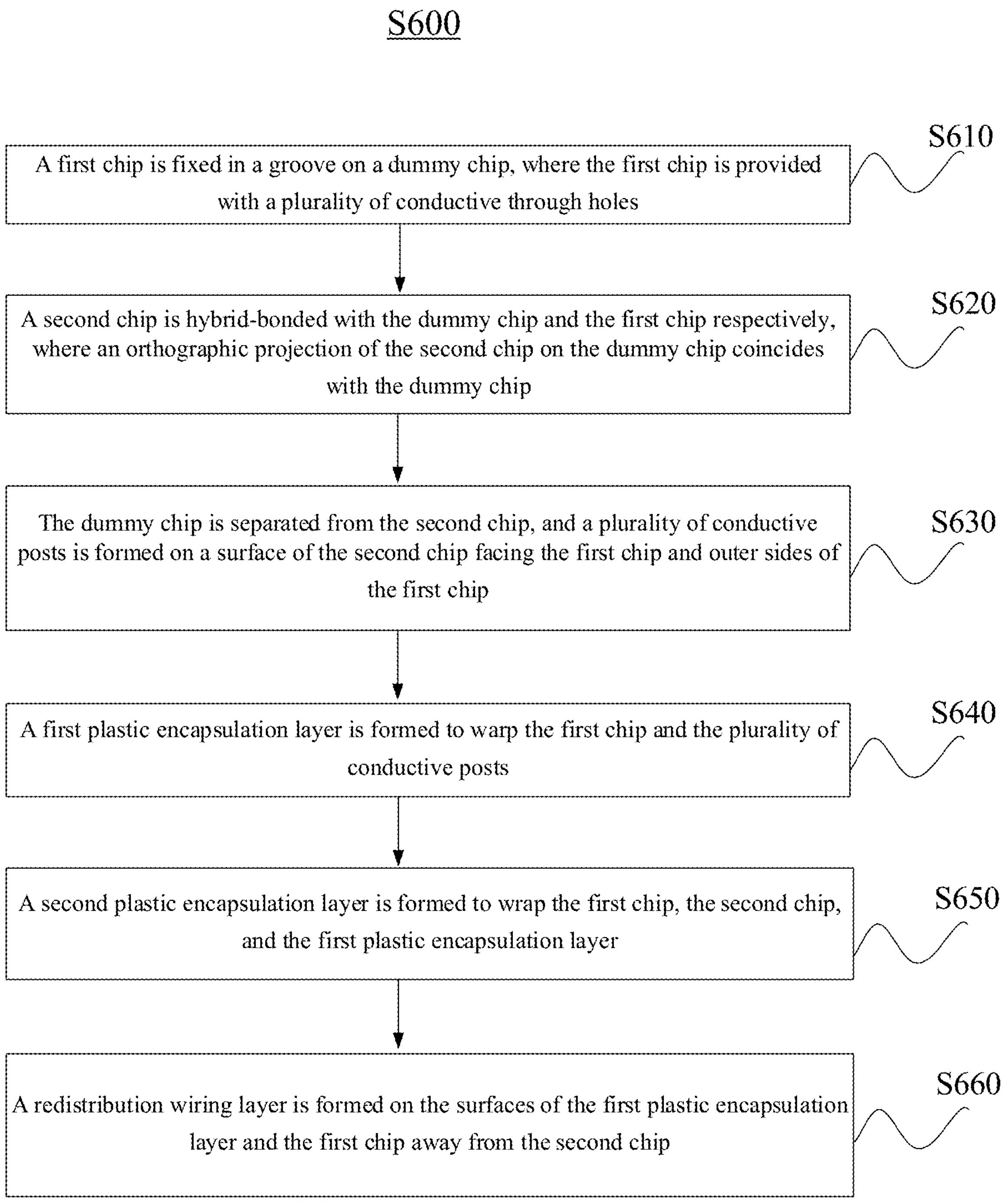
FIG. 61 illustrates an exemplary fan-out stacked chip packaging method according to various disclosed embodiments of the present disclosure.

Another embodiment of the present disclosure also provides another fan-out stacked chip packaging method S600. As shown in FIG. 61, the packaging method S600 may include S610 to S660.

In S610, a first chip may be fixed in a groove on a dummy chip. The first chip may be provided with a plurality of conductive through holes.

Figure 62:
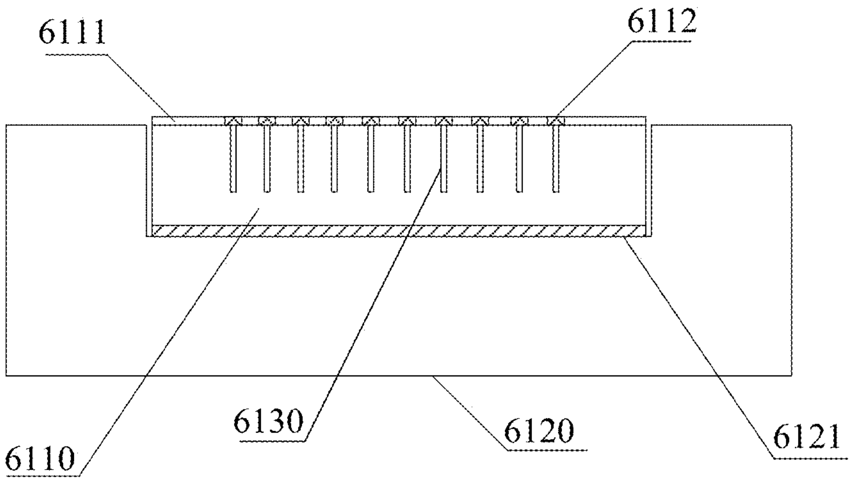
FIG. 62 to FIG. 75 illustrate structures corresponding to certain stages of a fan-out stacked chip packaging method according to various disclosed embodiments of the present disclosure.

Specifically, as shown in FIG. 62, a back side of the first chip 6110 may be fixed in the groove on the dummy chip 6120 by patch adhesive 6121, and a second surface of the first chip 6110 may protrude from a surface of the dummy chip 6120. The first chip 6110 may be provided with the plurality of conductive through holes 5130. The plurality of conductive through holes 5130 may be distributed in same intervals, and may be through-silicon vias. The through-silicon via technique may be used to realize vertically electrical connection of the through-silicon vias, to reduce the packaging height.

Specifically, as shown in FIG. 62, the second surface of the first chip 6110 may be provided with a first passivation layer 6111 and first metal pads 6112. In one embodiment, the first passivation layer 6111 may be a silicon dioxide layer, or be made of another material be able to play a passivation role, which is not limited by the present disclosure. In one embodiment, the first metal pads 6112 may be made of metal copper or another metal material, which is not limited in the present disclosure.

In S620, a second chip may be hybrid-bonded with the first chip respectively. An orthographic projection of the second chip on the dummy chip may coincide with the dummy chip.

In one embodiment, before hybrid-bonding the second chip with the first chip and the dummy chip, the method may further include: forming an adhesive on the surfaces of the dummy chip and the first chip, where a portion of the adhesive may be filled into a gap between the dummy chip and the first chip; and then removing the adhesive on the surfaces of the dummy chip and the first chip to expose the first passivation layer and the first metal pads of the dummy chip and the first chip.

Figure 63:
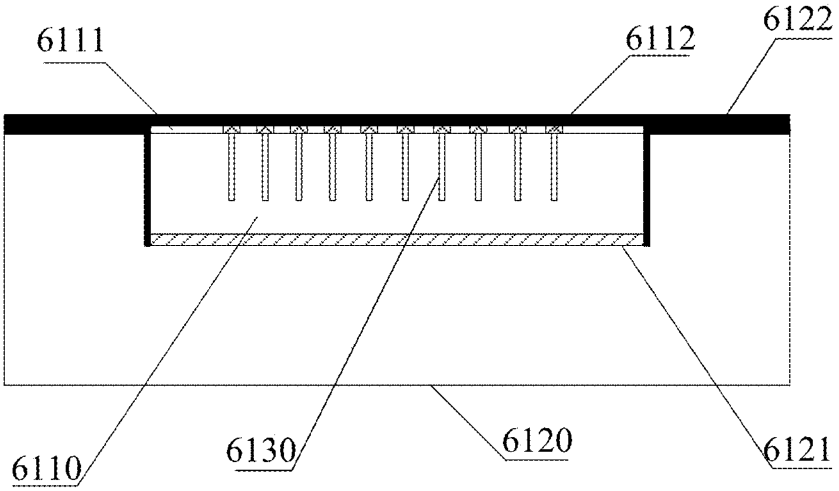

Specifically, as shown in FIG. 63, the adhesive 6122 may be formed on the surfaces of the dummy chip 6120 and the first chip 6110, and a portion of the adhesive 6122 may be filled into the gap between the dummy chip 6120 and the first chip 6110, such that the first chip 6110 may be completely fixed in the groove of the dummy chip 6120. Since the second surface of the first chip 6110 protrudes from the surface of the dummy chip 6120, the adhesive glue 6122 on the dummy chip 6120 may be thicker than the adhesive 6122 on the first surface of the first chip 6110. When the first chip 6110 and the second chip 6140 are hybrid bonded, the second chip 6140 may be attached on the dummy chip 6120.

Figure 64:
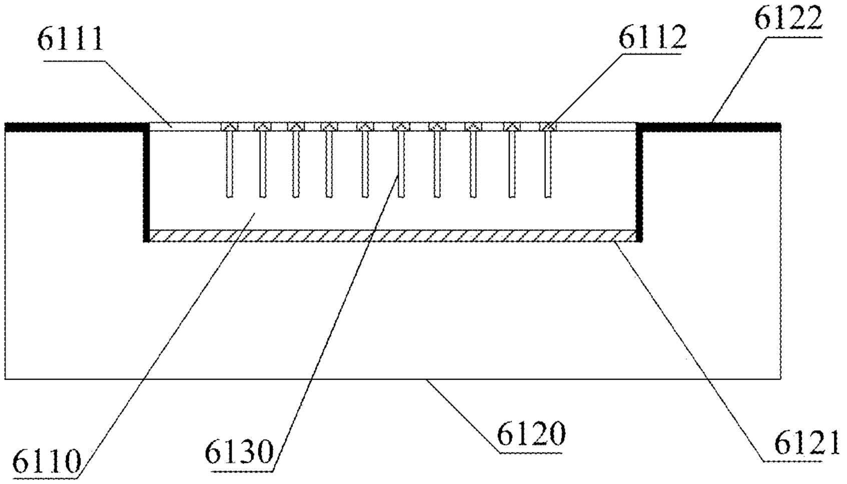

Specifically, surface polishing may be performed on the adhesive 6122 on the second surface of the first chip 6110 to remove the adhesive 6122 on the second surface of the first chip 6110, as shown in FIG. 64, and a portion of the adhesive 6120 on the surface of the dummy chip 6120 may be preserved, to expose the first passivation layer 6111 and the first metal pads 6112 of the first chip 6110. The portion of the remaining adhesive 6120 on the surface of the dummy chip 6120 may be used to fix the dummy chip 6120 on the second chip 6140.

Figure 65:
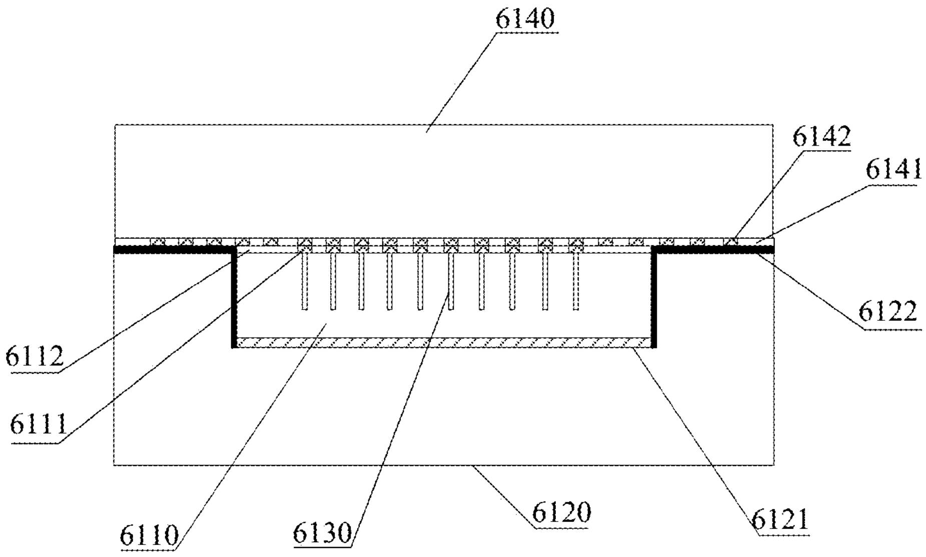

As shown in FIG. 65, a surface of the second chip 6140 facing the first chip 6110 may be provided with a second passivation layer 6141 and second metal pads 6142. In one embodiment, the second passivation layer 6141 may be a silicon dioxide layer or a silicon nitride layer, or be made of another material be able to play a passivation role, which is not limited by the present disclosure. In one embodiment, the second metal pads 6142 may be made a metal copper or another metal material, which is not limited in the present disclosure.

In one embodiment, the second chip may be hybrid-bonded with the dummy chip and the first chip respectively by following processes.

The first passivation layer of the first chip may be bonded with the second passivation layer of the second chip.

Specifically, as shown in FIG. 65, the first passivation layer 6111 of the first chip 6110 may be bonded with the second passivation layer 6141 of the second chip 6140. In one embodiment, the first passivation layer 6111 and the second passivation layer 6141 may be aligned first. Then, the first passivation layer 6111 may be connected to the second passivation layer 6141 through high-temperature pressure bonding.

Subsequently, the first metal pads of the first chip may be bonded with the second metal pads of the second chip.

Specifically, as shown in FIG. 65, the first metal pads 6112 of the first chip 6110 and the dummy chip 6120 and the second metal pads 6142 of the second chip 6140 may be bonded. In one embodiment, the first metal pads 6112 may be aligned with the second metal pads 6142, and the connection may be realized through high-temperature compression and thermal expansion of copper.

As shown in FIG. 65, the orthographic projection of the second chip 6140 on the dummy chip 6120 may coincide with the dummy chip 6120. That is, the size of the second chip 6140 may be consistent with the size of the dummy chip 6120. The dummy chip 6120 may be used to adjust the first chip 6110 and the second chip 6120 with two different sizes to have a same size. The wafer expanding technology may be used for wafer-level hybrid bonding, to achieve high-density interconnection and improve productivity.

In S630, the dummy chip may be separated from the second chip, and a plurality of conductive posts may be formed on a surface of the second chip facing the first chip and outer sides of the first chip.

In one embodiment, before separating the dummy chip from the second chip, the method may further include: thinning the bonded first chip and the dummy chip, to expose the plurality of conductive through holes of the first chip.

Figure 66:
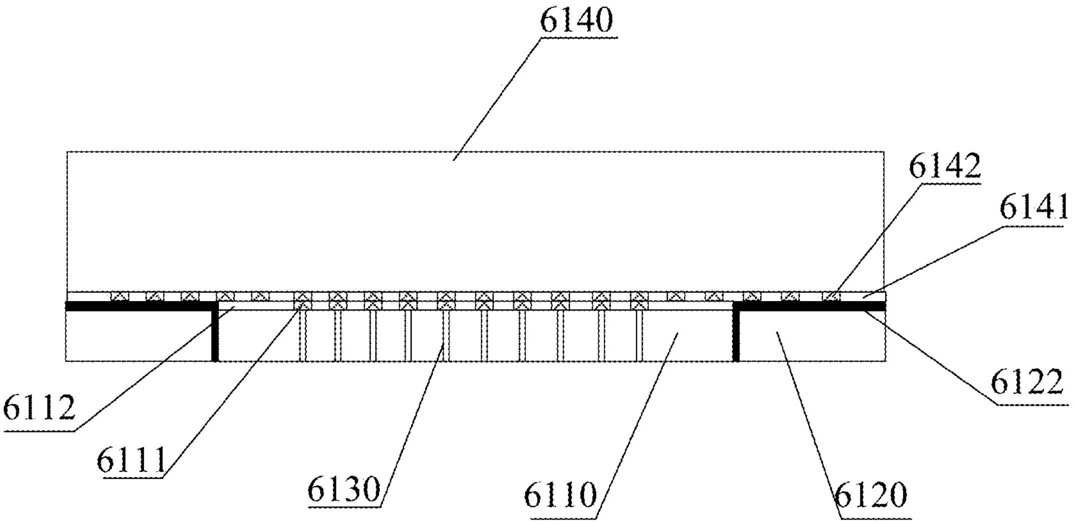

Specifically, as shown in FIG. 66, the surfaces of the bonded first chip 6110 and the dummy chip 6120 away from the second chip 5140 may be thinned. A residual thickness of the first chip 110 and the dummy chip 120 after thinning may be less than 40 μm. By thinning the surfaces of the first chip 110 and the dummy chip 120 away from the second chip 5140 to expose the plurality of conductive through holes 5130 for electrical connection, the conductive bumps may replace the existing substrate interconnection, further reducing the packaging height.

Figure 67:
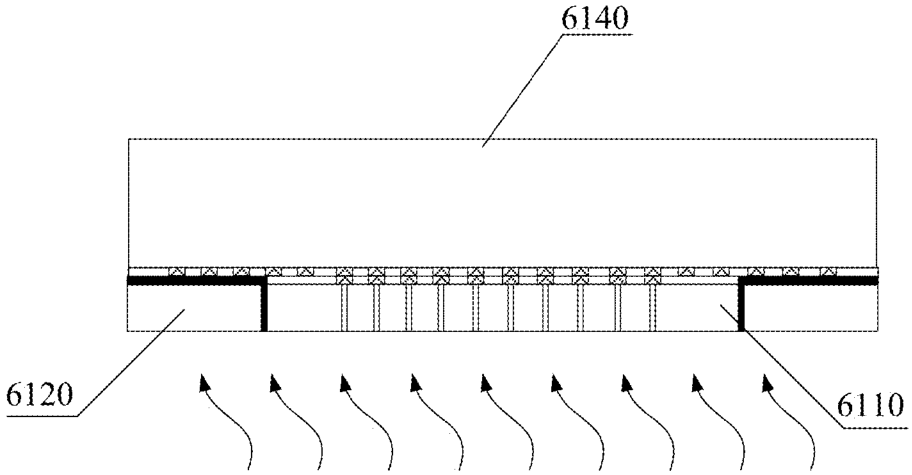
Figure 68:
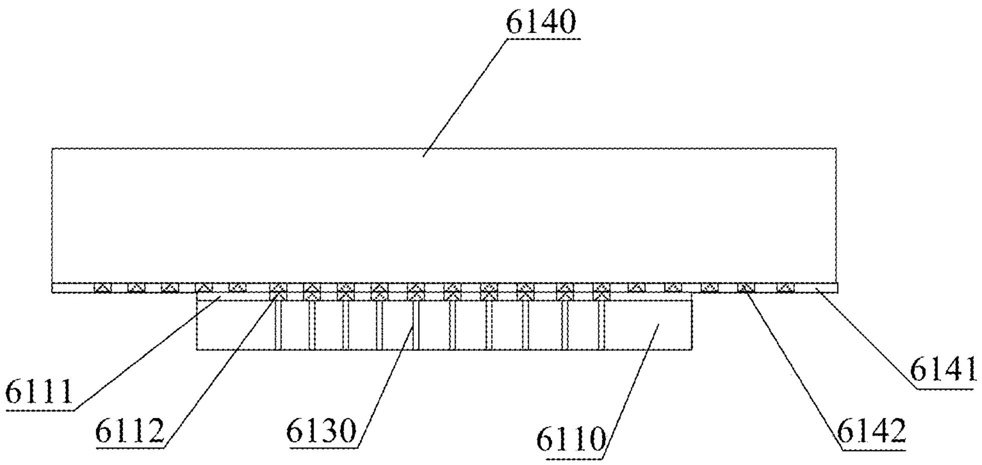

As shown in FIG. 67, the first chip 6110 and the dummy chip 6120 may be irradiated with laser or ultraviolet light, and the light wave may be determined according to the characteristics of the adhesive 6122. Under the action of light wave energy, the adhesive 6122 may lose its viscosity. Correspondingly, as shown in FIG. 68, the dummy chip 6120 may be detached from the second chip 6140, that is, the second chip 140 may be separated from the dummy 6120, leaving the hybrid bonded first chip 6110 and the second chip 6140. It should be noted that other methods may also be used to separate the second chip 6140 from the dummy 6120, which is not specifically limited in this embodiment.

Figure 69:
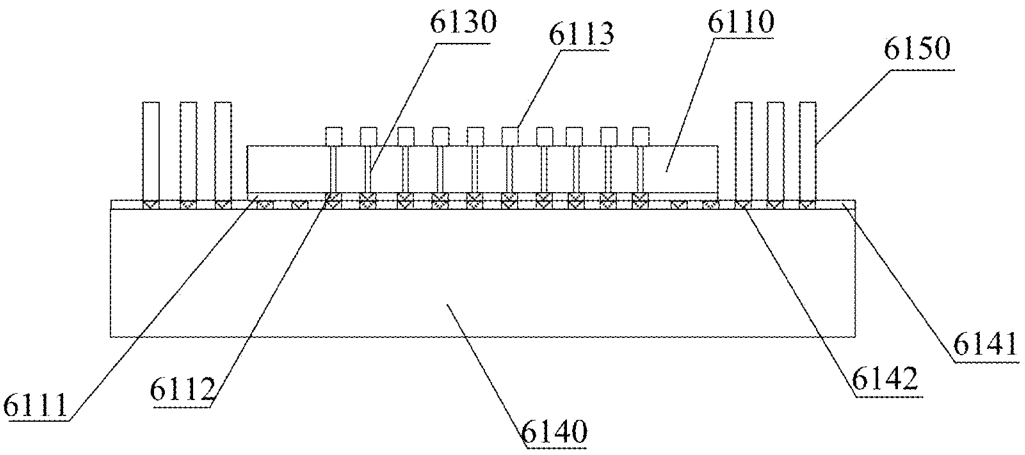

As shown in FIG. 69, after the second chip 6140 is separated from the dummy chip 6120, the plurality of conductive posts 6150 may be formed on the surface of the second chip 6140 facing the first chip 6110 and the outer surface of the first chip 6110 by electroplating or other processes. That is to say, the plurality of conductive posts 6150 may be disposed at the position of the dummy chip 120 before the second chip 6140 is separated from the dummy chip 6120. The plurality of conductive posts 6150 may be electroplated on the second metal pads 6142, corresponding to the second metal pads 6142. The plurality of conductive bumps 150 may be electroplated according to actual needs. A portion of the signals of the second chip 6140 may be led out by using the plurality of conductive posts 6150. Compared with the substrate interconnection, the vertical electrical interconnection may be realized by using the plurality of conductive bumps 150, which reduces the packaging height.

In one embodiment, the plurality of conductive posts 6150 may be metal copper bumps. In some other embodiments, the plurality of conductive posts 6150 may be made of other metal materials as required.

In S640, a plurality of conductive bumps may be formed on a surface of the first chip away from the second chip. The plurality of conductive bumps may correspond to the plurality of conductive through holes.

Specifically, as shown in FIG. 69, after electroplating the plurality of conductive posts 6150 on the second metal pads 6142, the plurality of conductive bumps 6113 may be formed by electroplating on the surface of the first chip 6110 away from the second chip 6140. The plurality of conductive bumps 6113 may correspond to the plurality of conductive through holes 6130. By forming the plurality of conductive bumps 6113 through electroplating, the signals of the first chip 6110 may be led out better. By using the plurality of conductive bumps to replace the existing substrate interconnection, the packaging size may be further reduced.

In S650, a plastic encapsulation layer may be formed to warp the first chip, the second chip, the plurality of conductive posts, and the plurality of conductive bumps.

Specifically, the above packaging process may be used to package a plurality of first chips 6110, a plurality of dummy chips 6120 and a plurality of second chips 6140 at the same time. After thinning, a plurality of chip assemblies may be cut to form a plurality of independent chip assemblies shown in FIG. 70 and then the following packaging process may be performed on each of the plurality of independent chip assemblies.

Figure 70:
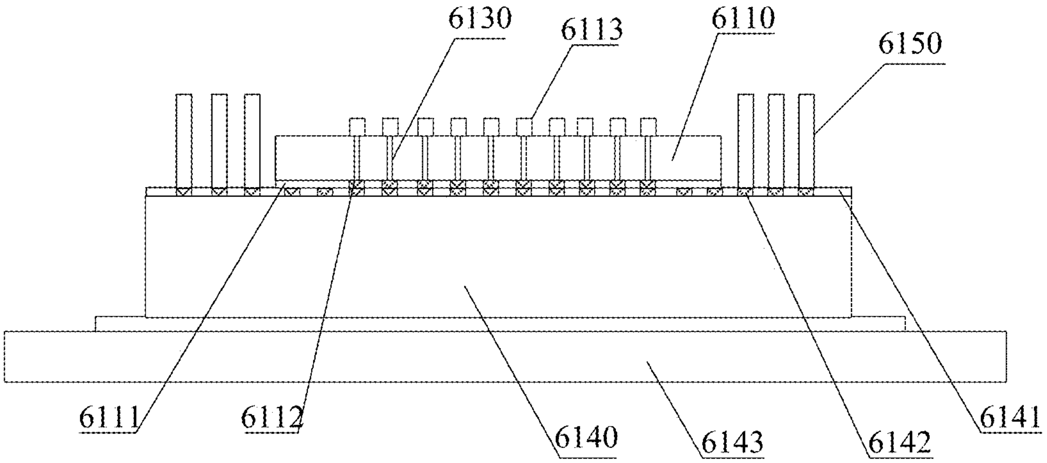
Figure 71:
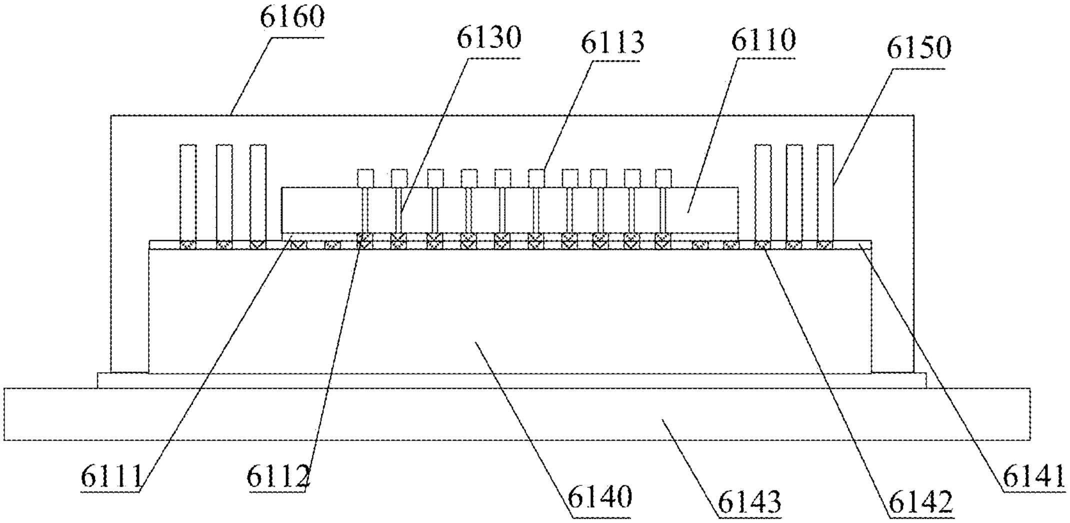

As shown in FIG. 70, after forming the plurality of conductive posts 6150 and the plurality of conductive bumps 6113, the surface of the second chip 6140 away from the first chip 6110 may be fixed on the temporary carrier 6161. That is, the backside of the second chip 6140 may be used as a contact surface. According to the final packaging size, they may be attached to the temporary carrier 6161 with temporary bonding glue one by one. Plastic encapsulant may be used to encapsulate the first chip 6110, the second chip 6140, the plurality of conductive posts 6150, and the plurality of conductive bumps 6113, to form the plastic encapsulation layer 6160 as shown in FIG. 71. The plastic encapsulation layer 6160 may protect the first chip 6110, the second chip 6140, the plurality of conductive posts 6150, and the plurality of conductive bumps 6113. The plastic encapsulation layer may be formed by a plastic encapsulation method including film vacuum lamination or traditional plastic sealing process, which is not specifically limited in the present disclosure.

In S660, a redistribution wiring layer may be formed on the surface of the plastic encapsulation layer away from the second chip, and the redistribution wiring layer may be electrically connected to the second chip through the plurality of conductive posts, and also may be connected to the first chip through the plurality of conductive bumps.

In one embodiment, before forming the redistribution wiring layer on the surface of the plastic encapsulation layer away from the second chip, the method may further include thinning the side of the plastic encapsulation layer away from the second chip, to expose the plurality of conductive bumps and the plurality of conductive posts.

Figure 72:
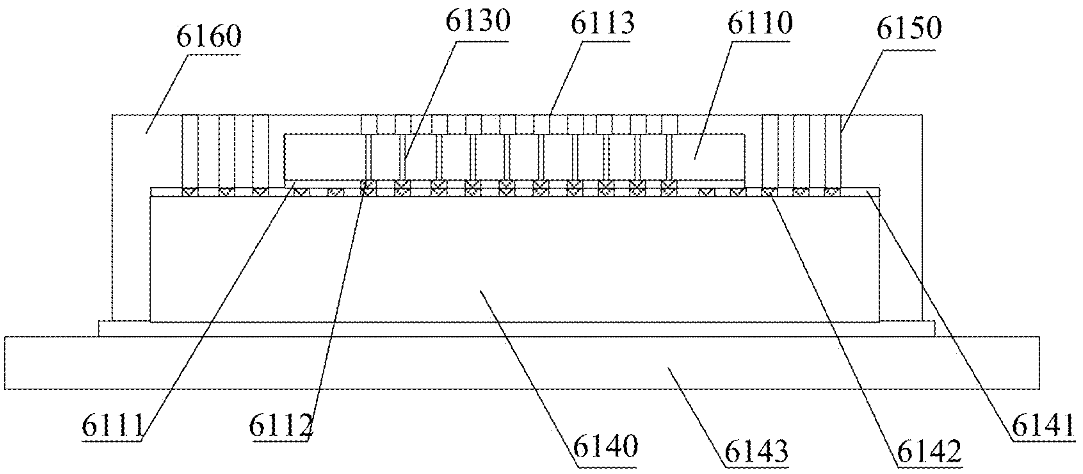

As shown in FIG. 72, the side of the plastic encapsulation layer 6160 away from the second chip 6140 may be thinned by polishing, such that surfaces of the plurality of conductive bumps 6113 and the plurality of conductive posts 6150 may be exposed on the surface of the plastic encapsulation layer 6160.

In one embodiment, the redistribution wiring layer may be formed on the surface of the plastic encapsulation layer away from the second chip by: forming a dielectric layer on the surface of the plastic encapsulation layer away from the second chip, on the surfaces of the plurality of conductive bumps, and on the surfaces of the plurality of conductive posts; and patterning the dielectric layer and forming the redistribution wiring layer on the patterned dielectric layer.

Figure 73:
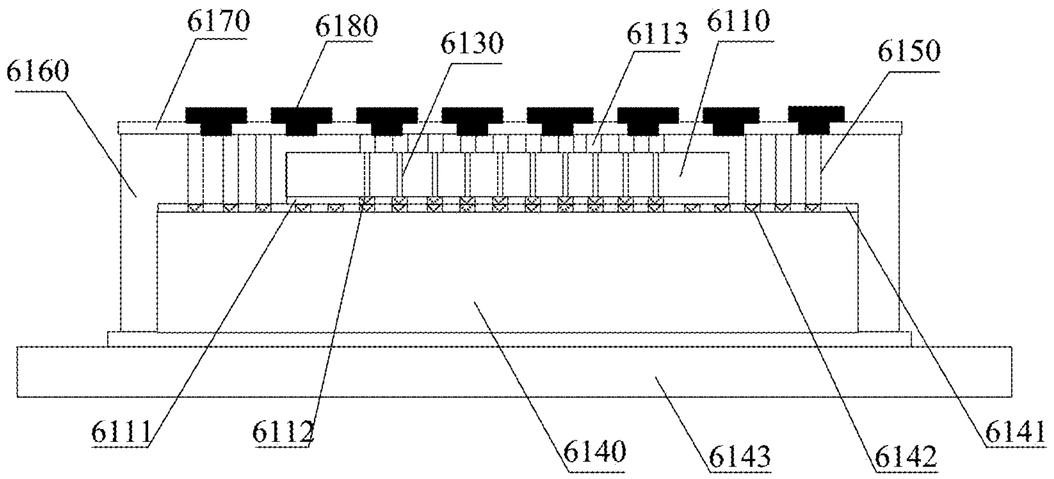

As shown in FIG. 73, the dielectric layer 6170 may be coated on the surface of the plastic encapsulation layer 6160 away from the second chip 6140, on the surfaces of the plurality of conductive bumps 6113, and on the surfaces of the plurality of conductive posts 6150. The dielectric layer 6170 may be made of a material including polyimide (PI), polybenzoxazole (PBO), etc., and may be formed by a coating method including wafer spin coating, which are not specifically limited in the present disclosure.

As shown in FIG. 73, the dielectric layer 6170 may be patterned by a photolithography process, and the redistribution wiring layer 6180 may be formed on the patterned dielectric layer 6170. The redistribution wiring layer 6180 may be electrically connected to the second 6140 through the plurality of conductive posts 6150, and may be electrically connected to the first chip through the plurality of conductive through holes 6130 and the plurality of conductive bumps 6113. The redistribution wiring layer 6180 may be formed by a method including electroplating, sputtering, thermal evaporation, plasma enhanced chemical vapor deposition, low pressure chemical vapor deposition, atmospheric pressure chemical vapor deposition, or electron cyclotron resonance chemical vapor deposition, etc., which is not specifically limited in the present disclosure. The redistribution wiring layer 6180 may be made of a material including metal titanium or metal copper, which is not limited in the present disclosure.

By using the fan-out redistribution wiring to replace the existing substrate interconnection, the packaging size may be further reduced.

In one embodiment, after forming the redistribution wiring layer on the surface of the plastic encapsulation layer away from the second chip, the method may further include separating the second chip and the plastic encapsulation layer from the temporary carrier.

Figure 74:
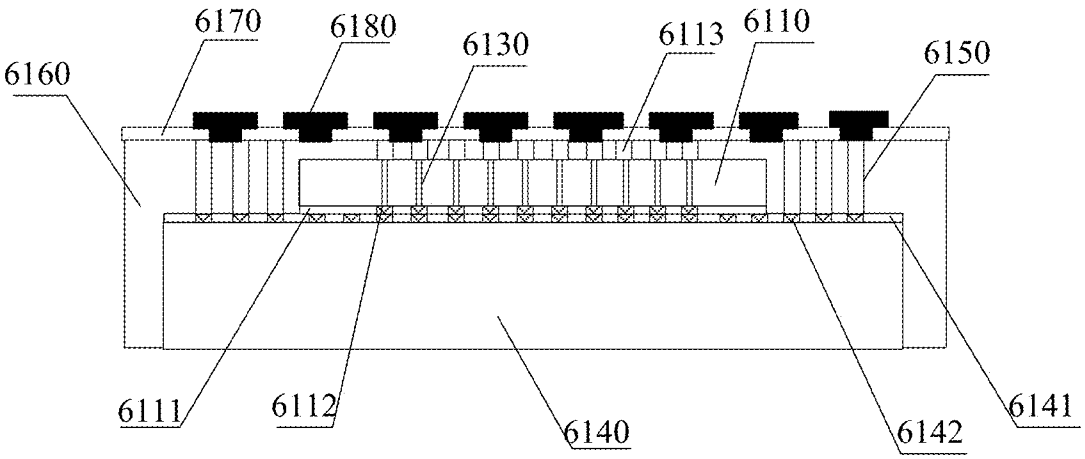

Specifically, as shown in FIG. 74, the second chip 6140 and the plastic encapsulation layer 6160 may be separated from the temporary carrier 6161. That is, the temporary carrier 6161 may be removed. The temporary carrier 6161 may be removed by a separation method including thermal separation, laser separation, ultraviolet light separation, mechanical separation or other methods. These methods are currently commonly used temporary bonding separation methods. The separation method is not specifically limited in the present disclosure, and may be selected according to actual needs.

Subsequently, the redistribution wiring layer may be patterned, and solder balls may be formed on the patterned redistribution wiring layer.

Figure 75:
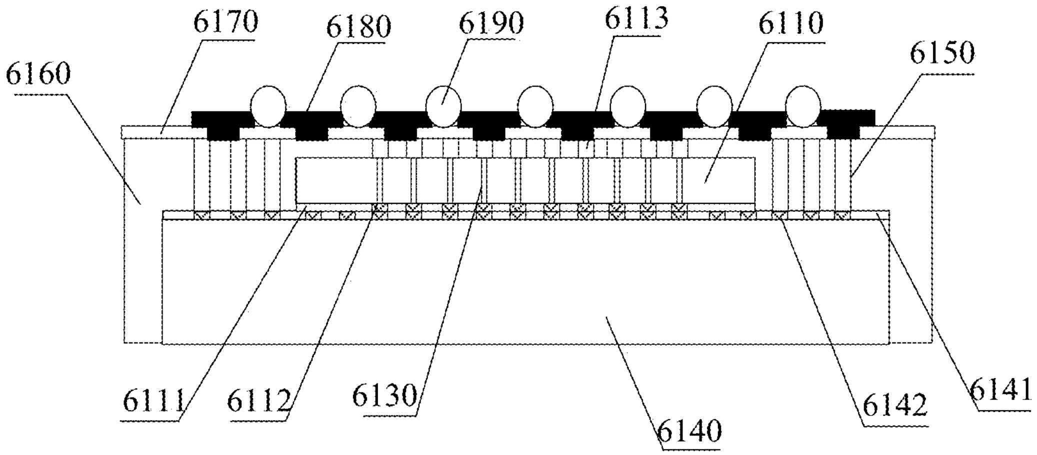

Specifically, as shown in FIG. 75, the redistribution wiring layer 6180 may be patterned by a photolithography process, and ball planting may be performed on the patterned redistribution wiring layer 6180 to form a plurality of solder balls 6190. Electrically connection to the outside world may be realized through the plurality of solder balls 6190.

In the fan-out stacked chip packaging method provided by the present disclosure, the first chip may be fixed in the groove of the dummy chip. The dummy chip may be used to adjust the first chip and the second chip of two different sizes to the same size. Then the first chip may be hybrid bonded with the second chip in the wafer level. The wafer-level hybrid bonding may be performed through wafer expansion technology to achieve high-density interconnection while improving production efficiency.

Also, the dummy chip may be separated from the second chip, and the plurality of conductive bumps may be formed on the surface of the second chip facing the first chip and on the outer surface of the first chip. A portion of the signals of the second chip may be led out through the plurality of conductive bumps. The plurality of conductive bumps may be formed on the surface of the first chip away from the second chip, and may correspond to the plurality of conductive through holes of the first chip. The redistribution layer may be formed on the surfaces of the first chip and the first plastic packaging layer away from the second chip. The traditional substrate interconnection may be replaced by conductive bumps and fan-out redistribution layers, reducing the package size.

Further, since direct wafer bonding is adopted between the first chip and the second chip, the thickness after bonding may be the same as that of the chip body, which reduces the packaging height to the greatest extent and realizes ultra-thin multi-layer high-density stack packaging.

Another embodiment of the present disclosure also provides another fan-out stacked chip packaging structure 600. As shown in FIG. 75, in one embodiment, the fan-out stacked chip packaging structure 600 may include a first chip 6110, a second chip 6140, a plurality of conductive posts 6150, a plurality of conductive bumps 6113, a hybrid bonding structure (not shown in the figure), a plastic encapsulation layer 6160, and a redistribution wiring layer 6180.

The first chip 6110 may be provided with the plurality of conductive through holes 6130. The plurality of conductive through holes 6130 may be distributed with same intervals, and may be through-silicon vias. The through-silicon via technique may be used to realize the interconnection of the through-silicon vias, to reduce the packaging height.

The second chip 6140 may be stacked on the first chip 6110 through the hybrid bonding structure. The first chip 6110 and the second chip may be bonded by a direct wafer-level bonding method, the thickness after bonding may be same as the thickness of the chip body, reducing the packaging height to the maximum extent.

The plurality of conductive posts 6150 may be disposed on a side of the second chip 6140 facing the first chip 6110 and on the outer surface of the first chip 6110. The plurality of conductive posts 6150 may be used to lead out the signal of the second chip 6140, and may replace the substrate interconnection, further reducing the packaging height.

The plurality of conductive bumps 6113 may be disposed on the surface of the first chip 6110 facing away from the second chip 6140, and may correspond to the plurality of conductive through holes 6130. The plurality of conductive bumps 113 may be used to lead out signals of the first chip 6110 better. Packaging size may be further reduced by replacing the substrate interconnection with conductive bumps.

The plastic encapsulation layer 6160 may wrap the first chip 6110, the second chip 6140, the plurality of conductive bumps 6113, and the plurality of conductive posts 6150, to protect the first chip 6110, the second chip 6140, the plurality of conductive bumps 6113, and the plurality of conductive posts 6150.

The redistribution wiring layer 6180 may be disposed on the surfaces of the first chip 6110 and the plastic encapsulation layer 6160 away from the second chip 6140. The redistribution wiring layer may be electrically connected to the second chip 6140 through the plurality of conductive posts 6150, and may be electrically connected to the first chip 6110 through the plurality of conductive through holes 6130 and the plurality of conductive bumps 6113.

In one embodiment shown in FIG. 60, the hybrid bonding structure may include a first passivation layer 6111 and first metal pads 6112 disposed on the surfaces of the first chip 6110 facing the second chip 6140, and a second passivation layer 6151 and second metal pads 6152 on surfaces of the second chip 6140 facing the first chip 6110. The first passivation layer 6111 and the second passivation layer 6151 may be bonded and connected, and the first metal pads 6112 and the second metal pads 6152 may be bonded.

In one embodiment shown in FIG. 75, the packaging structure 600 may further include a dielectric layer 6170 and solder balls 6190. The dielectric layer 6170 may be disposed on the surfaces of the plastic encapsulation layer 6160 and the first chip 6110 away from the second chip 6140. That is, the dielectric layer 6170 may be disposed on the surfaces of the plastic encapsulation layer 6160, the plurality of conductive bumps 6113, and the plurality of conductive posts 6150. The redistribution wiring layer 6180 may be disposed on the dielectric layer 6170 and the solder balls 6190 may be disposed on the redistribution wiring layer 6180. The solder balls 6190 may be electrically connected to the outside.

In one embodiment, both the first passivation layer 6111 and the second passivation layer 6141 may be silicon dioxide layers or silicon nitride layers. In some other embodiments, the first passivation layer 6111 and the second passivation layer 6141 may be made of other materials that can play a passivation role. The first metal pads 112 and the second metal pads 142 may be made of metal copper, or other metal materials, which are not specifically limited in this embodiment.

The dielectric layer 6170 may be made of a material including polyimide (PI), polybenzoxazole (PBO), etc., and the coating method may be usually wafer spin coating, which is not specifically limited in this embodiment. The redistribution wiring layer 6180 may be made of metal titanium, metal copper, or other metal materials, which are not specifically limited in this embodiment.

In the fan-out stacked chip packaging structure provided by the present disclosure, the second chip may be connected to the first chip through the hybrid bonding structure, which realizes high-density interconnection while improving production efficiency and reducing the packaging height to the greatest extent. The plurality of conductive bumps may be arranged on the side of the second chip facing the first chip and on the outer surface of the first chip. A portion of the signals of the second chip may be led out through the plurality of conductive bumps. The redistribution wiring layer may be disposed on the surfaces of the first chip and the first plastic encapsulation layer away from the second chip. Compared with the substrate interconnection, the plurality of conductive bumps, the plurality of conductive posts, the plurality of conductive through holes, and the redistribution wiring layer may be used, which reduces the packaging height. High-density and ultra-thin packaging may be realized.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fan-out packaging method, comprising:

fixing a first chip in a groove of a dummy chip;

bonding a plurality of second chips with the dummy chip and the first chip respectively;

forming a first plastic encapsulation layer to wrap the plurality of second chips;

forming a second plastic encapsulation layer to wrap the first chip, the dummy chip, and the first plastic encapsulation layer; and forming a redistribution wiring layer on surfaces of the dummy chip and the first chip away from the plurality of second chip.

2. The method according to claim 1, wherein:

the first chip and the dummy chip are provided with a plurality of conductive through holes; and the redistribution wiring layer is electrically connected to the first chip through the plurality of conductive through holes.

3. The method according to claim 1, wherein:

an orthographic projection of the plurality of second chips on the dummy chip is located within the dummy chip.

4. The method according to claim 1, wherein:

the second chip is bonded with the dummy chip and the first chip respectively by hybrid bonding;

a first passivation layer and first metal pads are provided on surfaces of the first chip and the dummy chip facing the second chip;

a second passivation layer and second metal pads are provided on surfaces of the plurality of second chips facing the first chip; and bonding the plurality of second chips with the dummy chip and the first chip respectively includes:

bonding the first passivation layer of the first chip and the dummy chip with the second passivation layer of the plurality of second chips; and bonding the first metal pads of the first chip and the dummy chip with the second metal pads of the plurality of second chips.

5. The method according to claim 3, before bonding the plurality of second chips with the dummy chip and the first chip respectively, further including:

forming an adhesive on the surfaces of the dummy chip and the first chip, wherein a portion of the adhesive is filled into a gap between the dummy chip and the first chip; and removing another portion of the adhesive on the surfaces of the dummy chip and the first chip to expose the first passivation layer and the first metal pads of the dummy chip and the first chip.

6. The method according to claim 1, wherein forming the second plastic encapsulation layer includes:

thinning surfaces of the bonded first chip and the dummy chip away from the plurality of second chips, to expose the plurality of conductive through holes of the first chip and the dummy chip; and fixing the surfaces of the thinned first chip and the dummy chip away from the plurality of second chips on a temporary carrier, and then forming the second plastic encapsulation layer.

7. The method according to claim 6, forming the redistribution wiring layer on the surfaces of the dummy chip and the first chip away from the plurality of second chips includes:

separating the first chip and the dummy chip from the temporary carrier;

forming a dielectric layer on surfaces of the second plastic encapsulation layer, the dummy chip and the first chip away from the plurality of second chips;

patterning the dielectric layer and forming the redistribution wiring layer on the patterned dielectric layer; and patterning the redistribution wiring layer and forming solder balls on the patterned redistribution wiring layer.

8. The method according to claim 1, wherein:

the plurality of second chips is bonded with the dummy chip and the first chip respectively by thermal press;

a first passivation layer and first metal pads are provided on surfaces of the first chip and the dummy chip facing the second chip;

a second passivation layer and conductive bumps are provided on surfaces of the plurality of second chips facing the first chip; and bonding the plurality of second chips with the dummy chip and the first chip respectively includes: bonding the first metal pads with the conductive bumps through thermal press.

9. The method according to claim 8, before bonding the second chip with the dummy chip and the first chip respectively further including:

forming a non-conductive adhesive layer to wrap the conductive bumps.

10. The method according to claim 1, wherein:

the dummy chip is provided with a plurality of conductive through holes.

11. The method according to claim 1, wherein:

an orthographic projection of the plurality of second chips on the dummy chip coincides within the dummy chip.

12. The method according to claim 11, before forming the first plastic encapsulation layer, further includes:

separating the dummy chip from the plurality of second chips; and forming a plurality of conductive posts on surfaces of the plurality of second chips facing the first chip, and on outer sides of the first chip.

13. The method according to claim 12, wherein:

when forming the first plastic encapsulation layer, the first plastic encapsulation layer wraps the first chip and the plurality of conductive posts.

14. The method according to claim 11, wherein forming the second plastic encapsulation layer includes:

thinning a surface of the first plastic encapsulation layer away from the plurality of second chips, to expose the plurality of conductive posts and make the first plastic encapsulation layer flush with the surface of the first chip; and fixing the surfaces of the thinned first chip and the first plastic encapsulation layer away from the plurality of second chips on a temporary carrier, and then forming the second plastic encapsulation layer.

15. The method according to claim 12, wherein:

the surface of the first chip protrudes from the surface of the dummy chip.

16. The method according to claim 1, wherein:

the first chip is provided with a plurality of conductive through holes.

17. The method according to claim 1, before forming the first plastic encapsulation layer, further includes:

separating the dummy chip from the plurality of second chips;

forming a plurality of conductive posts on surfaces of the plurality of second chips facing the first chip, and on outer sides of the first chip; and forming a plurality of conductive bumps on the surface of the first chip away from the plurality of second chips, wherein the plurality of conductive bumps corresponds to the plurality of conductive through holes.

18. A fan-out packaging structure, comprising a dummy chip, a first chip, a plurality of second chips, a bonding structure, a first plastic encapsulation layer, a second plastic encapsulation layer, and a redistribution wiring layer, wherein:

the dummy chip includes a groove;

the first chip is disposed in the groove;

the first chip and the dummy chip are both provided with a plurality of conductive through holes;

the plurality of second chips is stacked on the first chip and the dummy chip, and is bonded and connected to the dummy chip and the first chip respectively through the bonding structure;

the first plastic encapsulation layer wraps the plurality of second chips;

the second plastic encapsulation layer wraps the first chip, the dummy chip, and the first plastic encapsulation layer; and the redistribution wiring layer is disposed on surfaces of the dummy chip and the first chip away from the plurality of second chips, wherein the redistribution wiring layer is electrically connected to the first chip through the plurality of conductive through holes.

19. The structure according to claim 18, wherein:

the bonding structure is a hybrid bonding structure;

a first passivation layer and first metal pads are provided on surfaces of the first chip and the dummy chip facing the plurality of second chips;

a second passivation layer and second metal pads are provided on surfaces of the plurality of second chips facing the first chip;

the first passivation layer of the first chip and the dummy chip is bonded with the second passivation layer of the plurality of second chips; and the first metal pads of the first chip and the dummy chip are bonded with the second metal pads of the plurality of second chips.

20. The structure according to claim 18, wherein:

the bonding structure is a thermal-press bonding structure;

a first passivation layer and first metal pads are provided on surfaces of the first chip and the dummy chip facing the plurality of second chips;

a second passivation layer and conductive bumps are provided on a surface of the plurality of second chips facing the first chip; and the first metal pads are bonded with the conductive bumps through thermal press.

* * * * *